(12) United States Patent
Tanaka

(10) Patent No.: US 11,769,825 B2
(45) Date of Patent: Sep. 26, 2023

(54) NITRIDE SEMICONDUCTOR DEVICE AND NITRIDE SEMICONDUCTOR PACKAGE

(71) Applicant: ROHM CO., LTD., Kyoto (JP)

(72) Inventor: Taketoshi Tanaka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 3 days.

(21) Appl. No.: 17/643,761

(22) Filed: Dec. 10, 2021

(65) Prior Publication Data

US 2022/0102545 A1   Mar. 31, 2022

Related U.S. Application Data

(60) Continuation of application No. 16/405,417, filed on May 7, 2019, now Pat. No. 11,233,144, which is a
(Continued)

(30) Foreign Application Priority Data

Aug. 24, 2016   (JP) .................................. 2016-163743
Jan. 18, 2017   (JP) .................................. 2017-006779
(Continued)

(51) Int. Cl.
*H01L 29/20*   (2006.01)
*H01L 29/778*   (2006.01)
(Continued)

(52) U.S. Cl.
CPC ...... *H01L 29/7787* (2013.01); *H01L 23/3114* (2013.01); *H01L 23/49562* (2013.01);
(Continued)

(58) Field of Classification Search
CPC ............. H01L 29/7787; H01L 29/7786; H01L 29/66462; H01L 29/475; H01L 29/205;
(Continued)

(56) References Cited

U.S. PATENT DOCUMENTS 7,525,130 B2    4/2009  Mishra et al.
8,072,002 B2 *  12/2011  Niyama .............. H01L 29/7786
                                                     257/E29.246
(Continued)

FOREIGN PATENT DOCUMENTS

JP    2006339561    12/2006
JP    2009054623     3/2009
(Continued)

OTHER PUBLICATIONS

Antoszewski, J. et al., "Scattering mechanisms limiting two-dimensional electron gas mobility in Al 0.25 Ga 0.75 N/GaN modulation-doped field-effect transistors," Journal of Applied Physics, Apr. 15, 2000, vol. 87, No. 8, pp. 3900-3904.

(Continued)

*Primary Examiner* — S M Sohel Imtiaz
(74) *Attorney, Agent, or Firm* — XSENSUS LLP

(57) ABSTRACT

Provided is a nitride semiconductor device 3 including a GaN electron transit layer 13, an AlGaN electron supply layer 14 in contact with the electron transit layer 13, a gate layer 15, formed selectively on the electron supply layer 14 and constituted of a nitride semiconductor composition effectively not containing an acceptor type impurity, and a gate electrode 16, formed on the gate layer 15, and satisfying the following formula (1):

$$d_g \sqrt{\frac{2E_F q(N_{DA} + N_A - N_{DD} - N_D)}{\varepsilon_0 \varepsilon_C}} + \Phi_B - \frac{d_B P}{\varepsilon_0 \varepsilon_C} > 0. \quad (1)$$

19 Claims, 36 Drawing Sheets

Related U.S. Application Data division of application No. 15/683,130, filed on Aug. 22, 2017, now abandoned.

(30) Foreign Application Priority Data

Mar. 23, 2017 (JP) ................................. 2017-057830
Jul. 5, 2017 (JP) ................................. 2017-132170

(51) Int. Cl.
| | |
|---|---|
| *H01L 29/205* | (2006.01) |
| *H01L 29/47* | (2006.01) |
| *H01L 29/66* | (2006.01) |
| *H01L 23/495* | (2006.01) |
| *H01L 23/31* | (2006.01) |
| H01L 29/10 | (2006.01) |
| H01L 29/40 | (2006.01) |
| H01L 29/417 | (2006.01) |
| H01L 29/43 | (2006.01) |
| H01L 29/45 | (2006.01) |
| H01L 29/49 | (2006.01) |

(52) U.S. Cl.
CPC ........ *H01L 29/2003* (2013.01); *H01L 29/205* (2013.01); *H01L 29/475* (2013.01); *H01L 29/66462* (2013.01); *H01L 29/7786* (2013.01); H01L 29/1066 (2013.01); H01L 29/402 (2013.01); H01L 29/41766 (2013.01); H01L 29/432 (2013.01); H01L 29/452 (2013.01); H01L 29/4966 (2013.01); H01L 2224/32245 (2013.01); H01L 2224/48091 (2013.01); H01L 2224/48247 (2013.01); H01L 2224/48257 (2013.01); H01L 2224/49107 (2013.01); H01L 2224/73265 (2013.01); H01L 2924/181 (2013.01)

(58) Field of Classification Search
CPC ........... H01L 29/41766; H01L 23/3114; H01L 29/452; H01L 29/4966; H01L 29/2003; H01L 23/49562; H01L 29/432
See application file for complete search history.

(56) References Cited

U.S. PATENT DOCUMENTS

| | | | | |
|---|---|---|---|---|
| 8,405,126 B2* | 3/2013 | Shibata | ............... | H01L 29/7783 438/936 |
| 2002/0167018 A1* | 11/2002 | Nakamura | ............ | H01L 33/007 257/101 |
| 2007/0018204 A1* | 1/2007 | Kohama | ........... | H01L 23/49513 257/E27.012 |
| 2008/0073652 A1* | 3/2008 | Sugimoto | ............. | H01L 29/778 257/E29.253 |
| 2009/0078966 A1* | 3/2009 | Asai | ................. | H01L 29/66462 257/690 |
| 2009/0212324 A1* | 8/2009 | Tamai | ............... | H01L 29/66431 257/192 |
| 2009/0212325 A1* | 8/2009 | Sato | .................... | H01L 29/1066 257/E21.403 |
| 2009/0242943 A1* | 10/2009 | Kawasaki | ......... | H01L 29/66462 257/280 |
| 2011/0210377 A1* | 9/2011 | Haeberlen | ........... | H01L 27/0605 257/E21.403 |
| 2012/0104408 A1* | 5/2012 | Imada | ................. | H01L 27/0605 257/E21.403 |
| 2012/0119219 A1* | 5/2012 | Takado | ............. | H01L 23/49562 257/E29.089 |
| 2012/0193688 A1* | 8/2012 | Lidow | ............... | H01L 29/42316 257/E21.409 |
| 2012/0280244 A1 | 11/2012 | Hwang et al. | | |
| 2013/0026495 A1* | 1/2013 | Chu | .................... | H01L 29/2006 257/E21.441 |
| 2013/0075785 A1* | 3/2013 | Ishiguro | ............. | H01L 29/7787 257/E21.403 |
| 2013/0075788 A1 | 3/2013 | Tomabechi | | |
| 2013/0082336 A1 | 4/2013 | Imada | | |
| 2013/0082360 A1 | 4/2013 | Miyajima et al. | | |
| 2013/0112986 A1* | 5/2013 | Hsiung | ............. | H01L 29/66462 257/E21.403 |
| 2014/0209919 A1* | 7/2014 | Chiu | .................. | H01L 29/66462 438/285 |
| 2014/0346615 A1* | 11/2014 | Zhang | ................. | H01L 29/4232 257/411 |
| 2014/0361308 A1* | 12/2014 | Yui | .................... | H01L 21/02458 438/478 |
| 2014/0367742 A1* | 12/2014 | Twynam | ............. | H01L 29/7783 257/194 |
| 2016/0172474 A1* | 6/2016 | Miyake | ............. | H01L 29/66462 438/172 |
| 2016/0172476 A1* | 6/2016 | Kikkawa | ........... | H01L 29/66462 438/172 |
| 2018/0331190 A1* | 11/2018 | Ichijoh | .................... | H01L 29/06 |

FOREIGN PATENT DOCUMENTS

| | | |
|---|---|---|
| JP | 2010267658 | 11/2010 |
| JP | 4705412 | 6/2011 |
| JP | 2011187840 | 9/2011 |
| JP | 2012523701 | 10/2012 |
| JP | 2013074209 | 4/2013 |
| JP | 2013074279 | 4/2013 |
| JP | 2013074281 | 4/2013 |
| JP | 5466505 B2 | 4/2014 |
| JP | 2014110345 | 6/2014 |
| JP | 2014222724 | 11/2014 |
| JP | 2015536570 | 12/2015 |
| JP | 2016051817 | 4/2016 |
| JP | 2016162879 | 9/2016 |
| KR | 101514140 | 4/2015 |
| WO | 2013099602 | 7/2013 |

OTHER PUBLICATIONS

Nitride Semiconductor Review, AlGaN/GaN FETs looms over GaAs technology, Aug. 2003, the Advanced Semiconductor Magazine, vol. 16, No. 6, pp. 40-42. (Year: 2003).

Office Action issued for Japanese Patent Application No. 2017-132170, dated Mar. 11, 2021, 21 pages including English machine translation.

Office Action issued for Japanese Patent Application No. 2017-132170, dated Aug. 19, 2021, 8 pages including English translation.

Office Action issued for Japanese Patent Application No. 2018-048289, dated Dec. 23, 2021, 8 pages including English machine translation.

Notice of Reasons for Refusal issued for Japanese Patent Application No. 2018-048289, dated Jul. 7, 2022, 6 pages including English translation.

Notice of Reasons for Refusal issued for Japanese Patent Application No. 2018-048289, dated Jan. 12, 2023, 6 pages including English machine translation.

\* cited by examiner

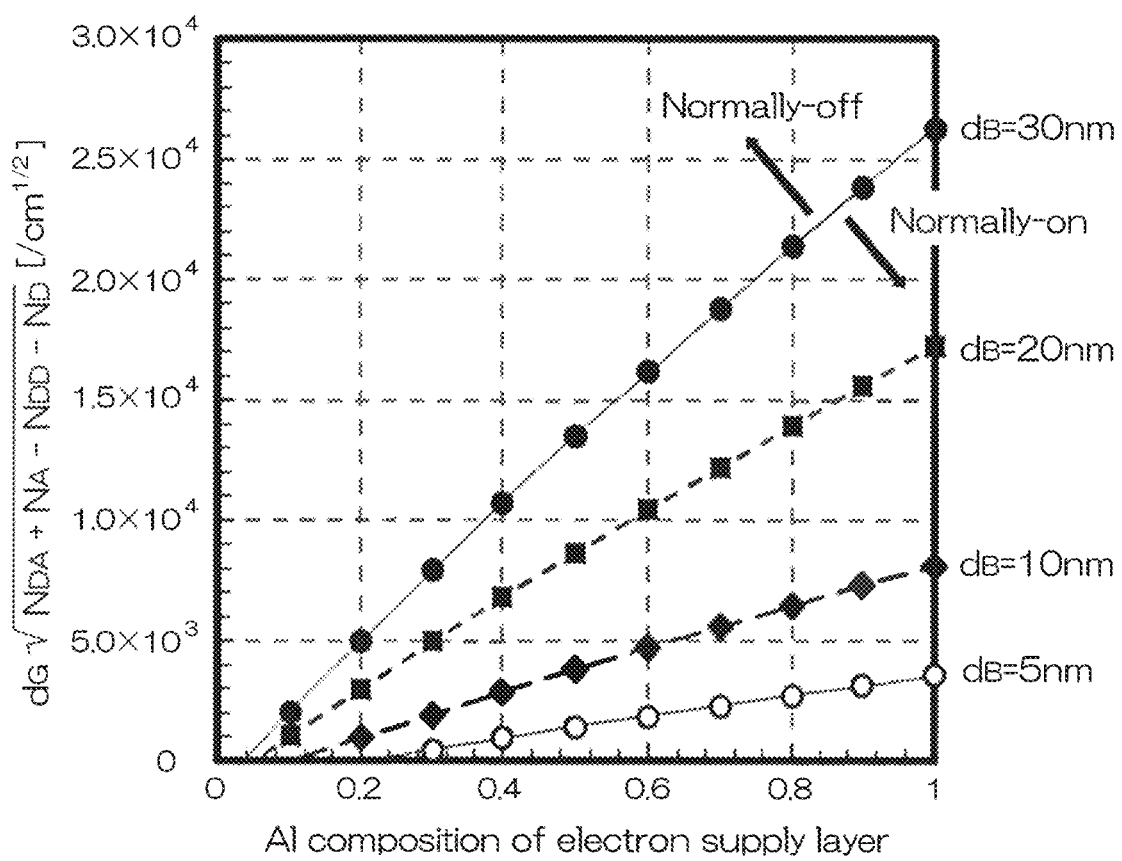

FIG. 10A  Unbiased state
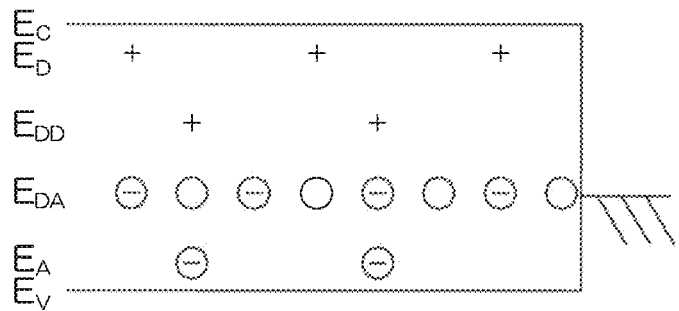
FIG. 10B  Bias applied
(state in which a current is not flowing)
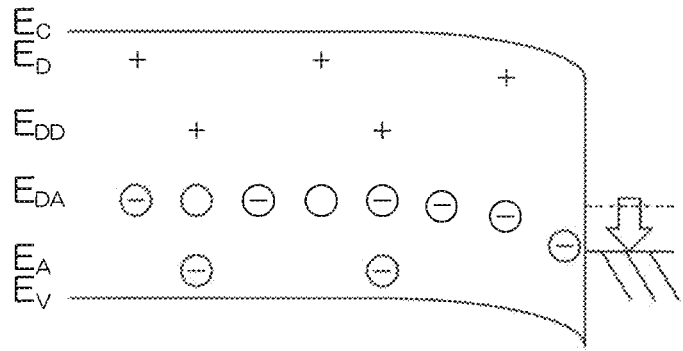
FIG. 10C  Bias applied
(state in which a current begins to flow)
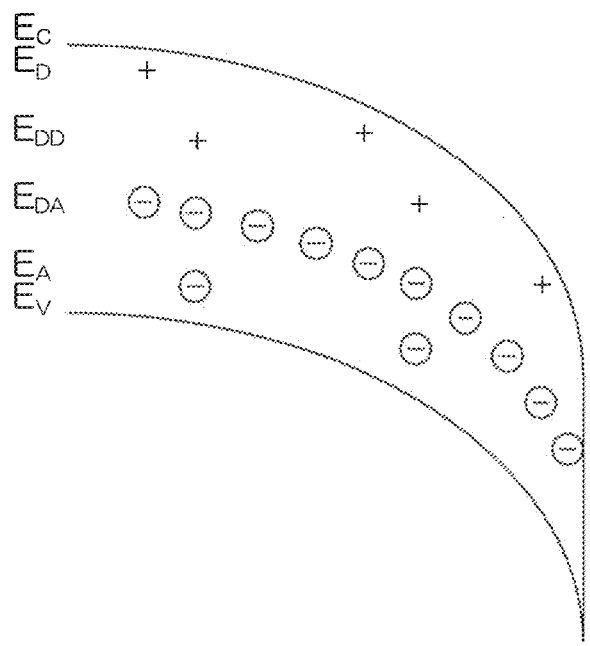

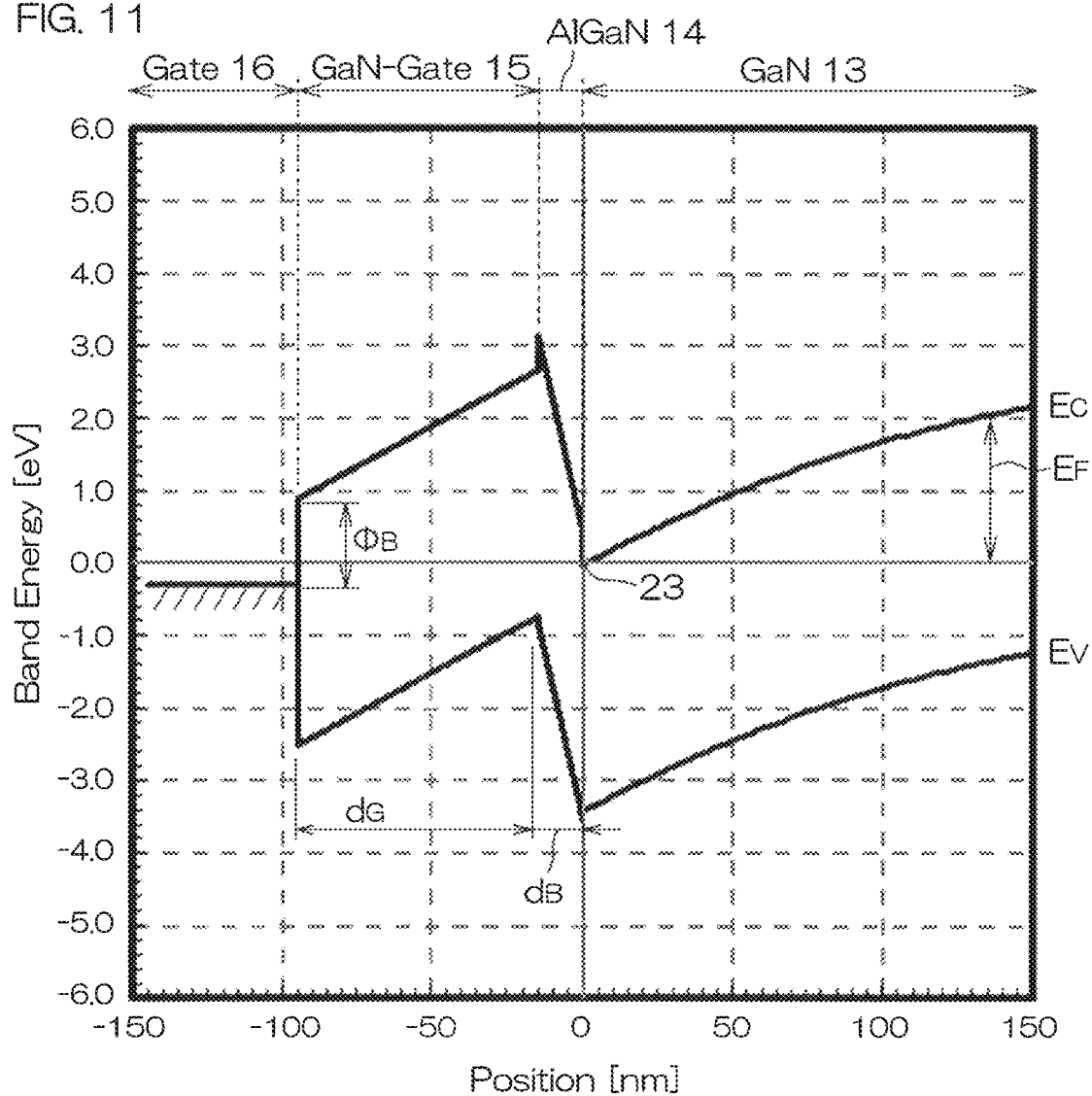

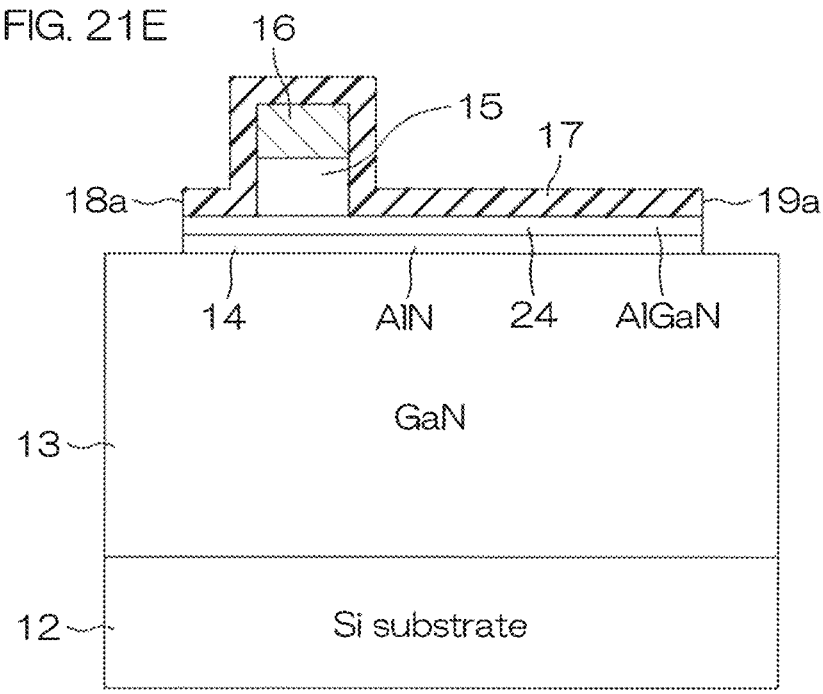
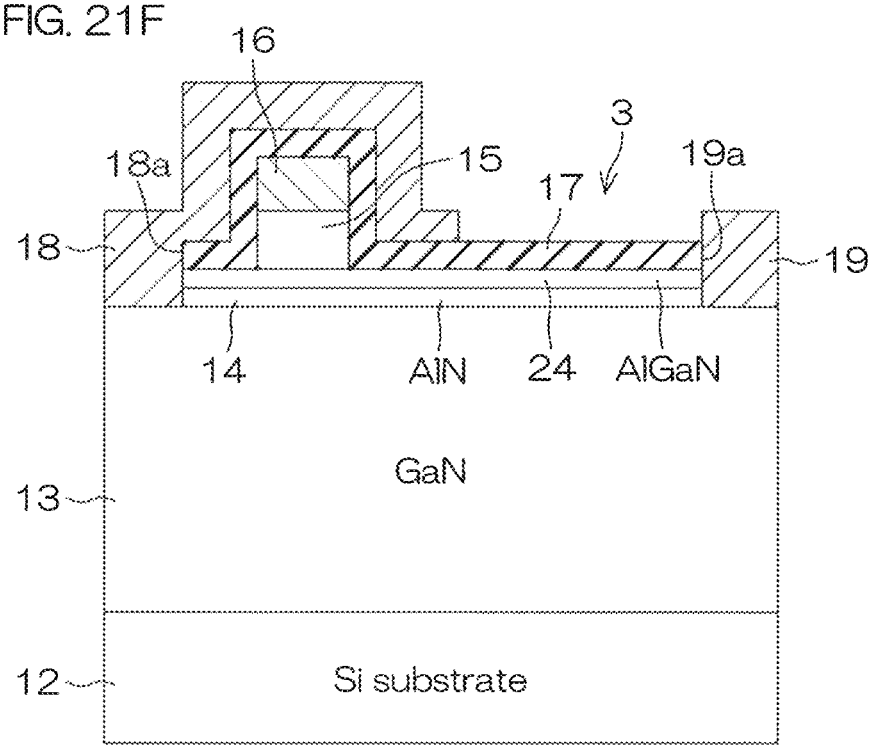

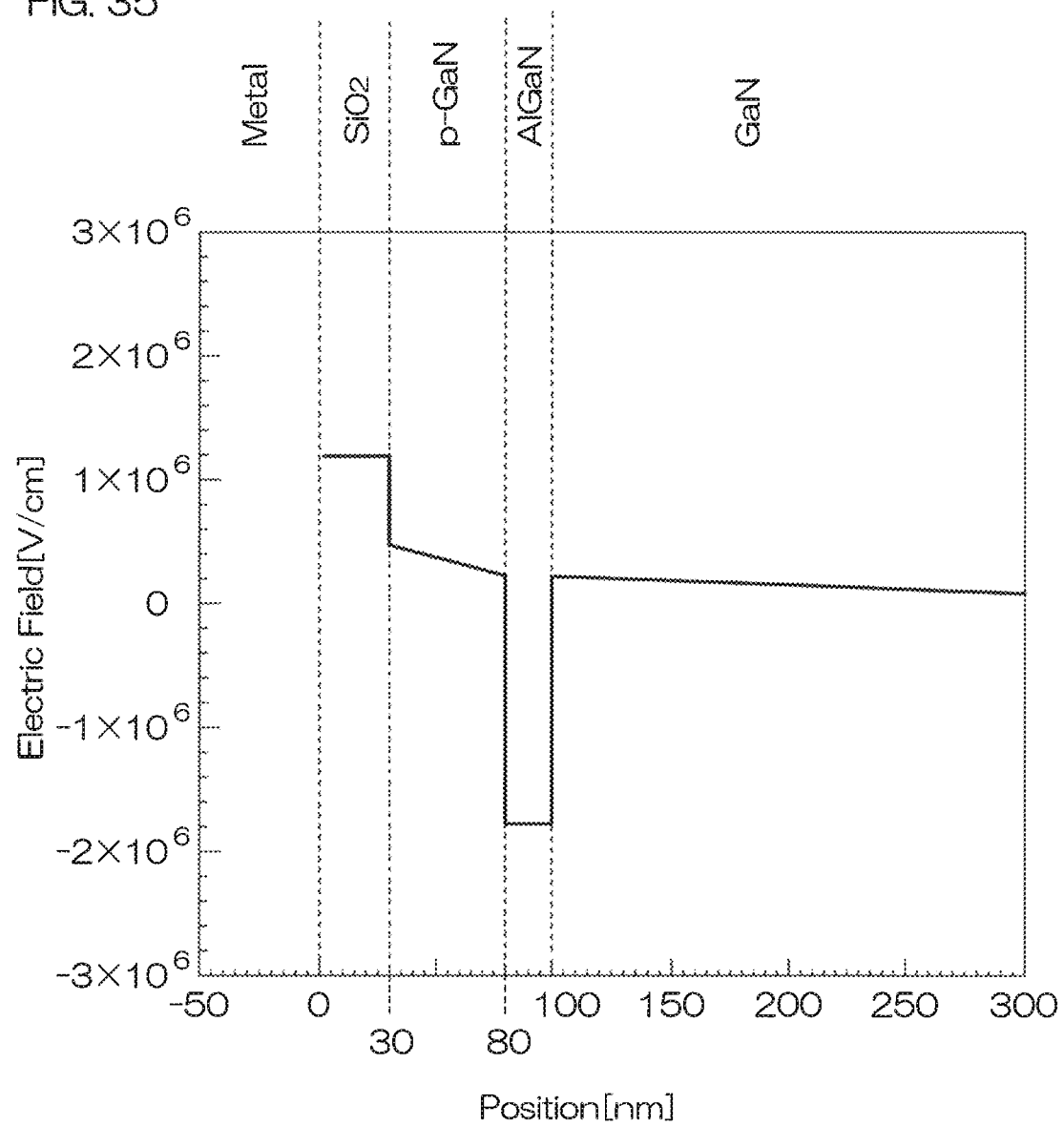

NITRIDE SEMICONDUCTOR DEVICE AND NITRIDE SEMICONDUCTOR PACKAGE

BACKGROUND OF THE INVENTION

1. Field of the Invention

The present invention relates to a nitride semiconductor device, having an HEMT (High Electron Mobility Transistor) structure, and a package thereof.

2. Description of the Related Art

For example, as a normally-off type transistor, Japanese Patent Publication No. 4705412 discloses a field effect transistor including a sapphire substrate, an AlN buffer layer on the sapphire substrate, an undoped GaN layer on the AlN buffer layer, an undoped AlGaN layer on the undoped GaN layer, a p type GaN layer provided on a portion of the undoped AlGaN layer, a high concentration p type GaN layer on the P type GaN layer, and a gate electrode on the high concentration p type GaN layer.

SUMMARY OF THE INVENTION

The inventor of preferred embodiments of the present invention described and claimed in the present application conducted an extensive study and research regarding a nitride semiconductor device and a nitride semiconductor package, such as the one described above, and in doing so, discovered and first recognized new unique challenges and previously unrecognized possibilities for improvements as described in greater detail below.

With the transistor of Japanese Patent Publication No. 4705412, when a positive voltage is applied to the gate electrode, a gate current begins to flow at a certain rising voltage and holes are implanted into channels from the p type AlGaN layer. Subsequently, electrons are induced in the channels to cancel out the implanted positive charges and an on state is thereby entered. Thus, although the transistor of Patent Document 1 is of the normally-off type, the layers below the gate electrode contain a p type impurity and therefore whereas holes are implanted from the p type GaN gate layer when the transistor is on, a time corresponding to the carrier life is required when turning off the transistor because the implanted holes must be annihilated by recombination with the electrons, thus making the turnoff time long and making the transistor unsuitable for high speed switching operations.

An object of the present invention is to provide a normally-off type nitride semiconductor device and a package thereof, with which high speed switching can be achieved.

Also, with the conventional structure, when the AlGaN layer (electron supply layer) is thickened to increase sheet carrier densities between source and gate and between gate and drain, a decrease in gate threshold voltage occurs and in some cases, the transistor becomes normally on. That is, the sheet carrier density outside a gate region directly below the gate electrode and the gate threshold voltage are in a tradeoff relationship.

An object of the present invention is to provide a nitride semiconductor device and a package thereof, with which both high sheet carrier density and high gate threshold voltage can be realized at the same time.

A nitride semiconductor device according to a preferred embodiment of the present invention includes an electron transit layer, an electron supply layer, in contact with the electron transit layer and constituted of a nitride semiconductor composition differing from that of the electron transit layer, a gate layer, formed selectively on the electron supply layer and constituted of a nitride semiconductor composition effectively not containing an acceptor type impurity, and a gate electrode, formed on the gate layer, and satisfies the following formula (1):

$$d_g \sqrt{\frac{2E_F q(N_{DA} + N_A - N_{DD} - N_D)}{\varepsilon_0 \varepsilon_C}} + \Phi_B - \frac{d_B P}{\varepsilon_0 \varepsilon_C} > 0 \quad (1)$$

The definitions of the respective symbols in the formula (1) are as follows.

$d_G$: thickness (cm) of the gate layer
$d_B$: thickness (cm) of the electron supply layer
$P$: polarization (C/cm$^2$) of the electron supply layer
$q$: elementary charge (C)
$\Phi_B$: work function (eV) of the gate electrode-electron affinity (3.6 eV) of GaN
$N_{DA}+N_A-N_{DD}-N_D$: effective acceptor concentration of the electron transit layer
$\varepsilon_C$: relative permittivity of the electron transit layer
$\varepsilon_B$: relative permittivity of the electron supply layer
$\varepsilon_0$: permittivity of vacuum
$E_F$: energy difference (eV) between a Fermi level and a lower end of a conduction band ($E_C$) of the electron transit layer With the present arrangement, the gate layer effectively does not contain an acceptor type impurity, and therefore even when the device is turned on, holes are not implanted into the electron supply layer from the gate layer. The turnoff time can thereby be shortened and high speed switching can thus be realized. Also, due to satisfying the formula (1) above, normally-off operation is enabled.

In the nitride semiconductor device according to the preferred embodiment of the present invention, the electron transit layer and the gate layer may contain GaN and the electron supply layer may contain AlGaN.

In the nitride semiconductor device according to the preferred embodiment of the present invention, the effective acceptor concentration $N_{DA}+N_A-N_{DD}-N_D$ of the electron transit layer may be not less than $5 \times 10^{16}$ cm$^{-3}$, the thickness $d_G$ of the gate layer may be not less than 80 nm, an Al composition of the electron supply layer may be not more than 25%, and the thickness $d_B$ of the electron supply layer may be not more than 20 nm.

In the nitride semiconductor device according to the preferred embodiment of the present invention, the electron transit layer may contain Mg in a region with 150 nm from an interface with the electron supply layer.

In the nitride semiconductor device according to the preferred embodiment of the present invention, the electron transit layer may contain Mg as a deep acceptor.

In the nitride semiconductor device according to the preferred embodiment of the present invention, the electron transit layer may contain C as a deep acceptor.

In the nitride semiconductor device according to the preferred embodiment of the present invention, that the gate layer effectively does not contain an acceptor type impurity may signify that a concentration of the acceptor type impurity in the gate layer is less than $1 \times 10^{17}$ cm$^{-3}$.

In the nitride semiconductor device according to the preferred embodiment of the present invention, the concentration of the acceptor type impurity in the gate layer may be less than $1 \times 10^{16}$ cm$^{-3}$.

A nitride semiconductor device according to the preferred embodiment of the present invention includes an electron transit layer, constituted of a nitride semiconductor, an electron supply layer, constituted of $Al_xGa_{1-x}N$ ($x \leq 1$) on the electron transit layer, a gate layer, constituted of a nitride semiconductor formed selectively on the electron supply layer, and a gate electrode formed on the gate layer, and the Al composition x of the electron supply layer is such that $x \geq 0.3$.

With the present arrangement, the Al composition x of the electron supply layer, constituted of $Al_xGa_{1-x}N$ ($x \leq 1$), is such that $x \geq 0.3$, and therefore both high sheet carrier density and high gate threshold voltage can be realized at the same time.

In the nitride semiconductor device according to the preferred embodiment of the present invention, a thickness of the electron supply layer may be not more than 10 nm.

In the nitride semiconductor device according to the preferred embodiment of the present invention, the Al composition x of the electron supply layer may be such that $x=1$.

The nitride semiconductor device according to the preferred embodiment of the present invention may further include an etching stop layer, constituted of $Al_{x'}Ga_{1-x'}N$ ($x' \leq 1$) on the electron supply layer, and a relationship $x < x'$ may hold between the electron supply layer and the etching stop layer.

In the nitride semiconductor device according to the preferred embodiment of the present invention, the electron supply layer may include an AlN electron supply layer and the Al composition x' of the etching stop layer may be such that $0.1 \leq x' \leq 0.2$.

In the nitride semiconductor device according to the preferred embodiment of the present invention, the electron supply layer may include an AlN electron supply layer with a thickness of not more than 2 nm, the etching stop layer may have a thickness of not more than 10 nm, and the Al composition x' of the etching stop layer may be such that $x'=0.1$.

The nitride semiconductor device according to the preferred embodiment of the present invention may include a source electrode and a drain electrode disposed to sandwich the gate electrode, and portions or entireties of the electron supply layer and the etching stop layer may be removed selectively in formation regions of the source electrode and the drain electrode.

In the nitride semiconductor device according to the preferred embodiment of the present invention, the electron supply layer may further contain In.

In the nitride semiconductor device according to the preferred embodiment of the present invention, the electron transit layer may contain Mg as an impurity.

In the nitride semiconductor device according to the preferred embodiment of the present invention, a concentration of Mg in the electron transit layer may be not less than $1 \times 10^6$ cm$^{-3}$ and not more than $1 \times 10^{17}$ cm$^{-3}$.

In the nitride semiconductor device according to the preferred embodiment of the present invention, the gate electrode may contain Ni, Pt, Mo, W, or TiN.

A nitride semiconductor package according to a preferred embodiment of the present invention includes the nitride semiconductor device, a terminal frame, on which the nitride semiconductor device is installed, and a resin package, sealing the nitride semiconductor device and the terminal frame.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 9 is a diagram of relationships of physical properties of the electron supply layer and $d_G\sqrt{N_{DA}+N_A-N_{DD}-N_D}$.

FIG. 10A to FIG. 10C are energy band diagrams showing movements of electrons with time until the electrons begin to flow.

FIG. 11 is an energy band diagram of a nitride semiconductor device.

FIG. 21E is a diagram of a process subsequent that of FIG. 21D.

FIG. 21F is a diagram of a process subsequent that of FIG. 21E.

FIG. 35 is an electric field intensity distribution diagram showing an electric field intensity distribution in the case where the gate insulating film is constituted of $SiO_2$.

DETAILED DESCRIPTION OF THE PREFERRED EMBODIMENTS

Preferred embodiments of a first invention and a second invention shall now be described in detail with reference to the attached drawings.

[1] The First Invention

[1-1] First Preferred Embodiment of the First Invention

A first preferred embodiment of the first invention shall now be described in detail with reference to FIG. 1 to FIG. 17.

Figure 1:
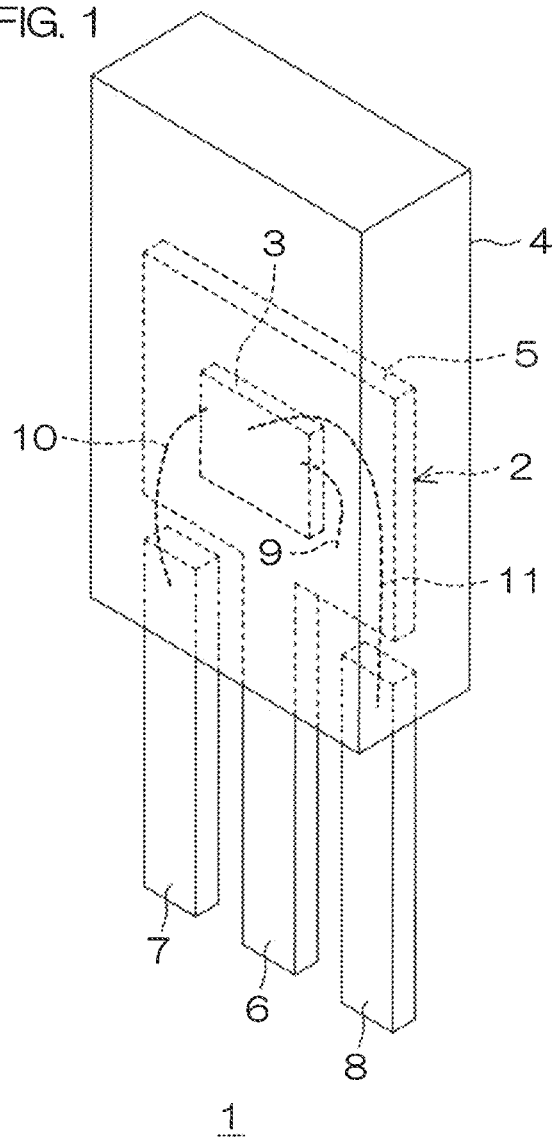
FIG. 1 is an external view of a semiconductor package that includes a nitride semiconductor device according to a preferred embodiment of the present invention.

FIG. 1 is an external view of a semiconductor package 1 that includes a nitride semiconductor device 3 according to the first preferred embodiment of the present invention.

The semiconductor package 1 includes a terminal frame 2, the nitride semiconductor device 3 (chip), and a resin package 4.

The terminal frame 2 has the form of a plate made of a metal. The terminal frame 2 includes a base portion 5 (island), supporting the nitride semiconductor device 3, a drain terminal 6, a source terminal 7, and a gate terminal 8. The drain terminal 6 is formed integral to the base portion 5. The drain terminal 6, the source terminal 7, and the gate terminal 8 are electrically connected respectively by bonding wires 9 to 11 to a drain, a source, and a gate of the nitride semiconductor device 3. The source terminal 7 and the gate terminal 8 are disposed so as to sandwich the drain terminal 6 at a center.

The resin package 4 is constituted, for example, of a known molding resin, such as an epoxy resin, etc., and seals the nitride semiconductor device 3. The resin package 4 covers the nitride semiconductor device 3 together with the base portion 5 of the terminal frame 2 and the bonding wires 9 to 11. Portions of the three terminals 6 to 8 are exposed from the resin package 4.

Figure 2:
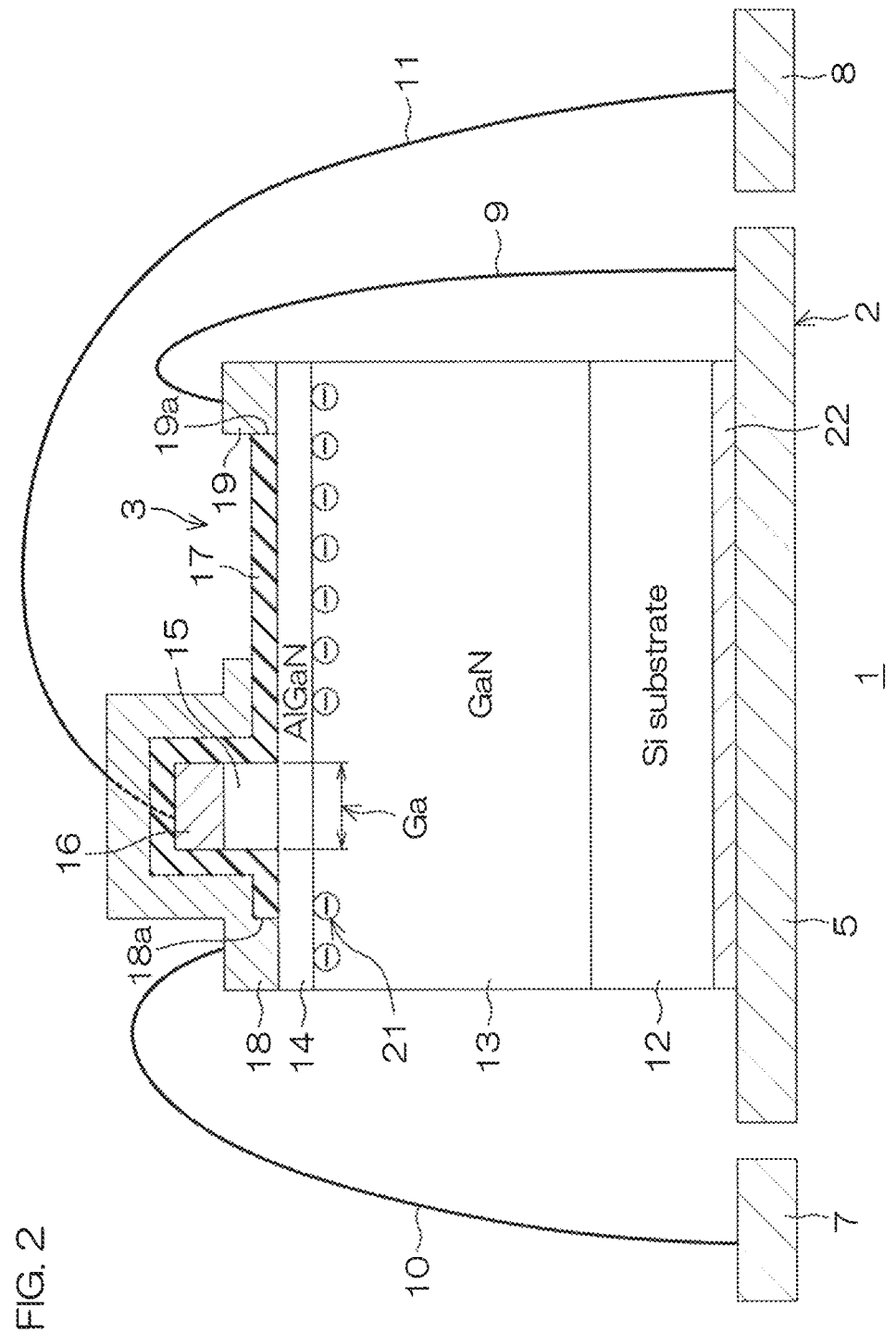
FIG. 2 is a schematic sectional view of the nitride semiconductor device of FIG. 1.

FIG. 2 is a schematic sectional view of the nitride semiconductor device 3 of FIG. 1. FIG. 2 does not show a section plane at a specific position of FIG. 1 but shows an assembly of elements, considered necessary for describing the present preferred embodiment, in a single section.

The nitride semiconductor device 3 includes a substrate 12, an electron transit layer 13 on the substrate 12, and an electron supply layer 14 on the electron transit layer 13. The electron transit layer 13 and the electron supply layer 14 are formed on the substrate 12, for example, by an epitaxial growth method. Also, a buffer layer, constituted of AlN or AlGaN, etc., may be interposed as necessary between the substrate 12 land the electron transit layer 13.

The nitride semiconductor device 3 further includes a gate layer 15, formed selectively on the electron supply layer 14, and a gate electrode 16, formed on the gate layer 15. The gate electrode 16 faces the electron supply layer 14 via the gate layer 15.

Also, a surface insulating film 17 is formed on the electron supply layer 14 so as to cover the gate electrode 16. Contact holes 18a and 19a, selectively exposing portions of the electron supply layer 14, are formed in the surface insulating film 17, and a source electrode 18 and a drain electrode 19 are put in ohmic contact with the electron supply layer 14 via the contact holes 18a and 19a. The source electrode 18 and the drain electrode 19 are disposed across an interval and the gate electrode 16 is disposed therebetween. Also, the source electrode 18 is formed in a pattern that covers the gate electrode 16 via the surface insulating film 17.

The substrate 12 may, for example, be a conductive silicon substrate. The conductive silicon substrate may have an impurity concentration, for example, of $1 \times 10^{17}$ $cm^{-3}$ to $1 \times 10^{20}$ $cm^{-3}$ (and more specifically, approximately $1 \times 10^{18}$ $cm^{-3}$).

The gate layer 15 may, for example, be an undoped GaN layer. Here, undoped GaN signifies GaN that effectively does not contain an acceptor type impurity and is specifically GaN with which an impurity is not intentionally introduced when forming the gate layer 15 and is more specifically GaN with a concentration of, for example, less than $1 \times 10^{17}$ cm$^{-3}$ and more preferably less than $1 \times 10^{16}$ cm$^{-3}$. This is because if the impurity concentration contained in the gate layer 15 is of approximately such level, the impurity will not function as an acceptor. The impurity concentrations may be determined by performing SIMS (secondary ion mass spectroscope) analysis on the gate layer 15.

Figure 3:
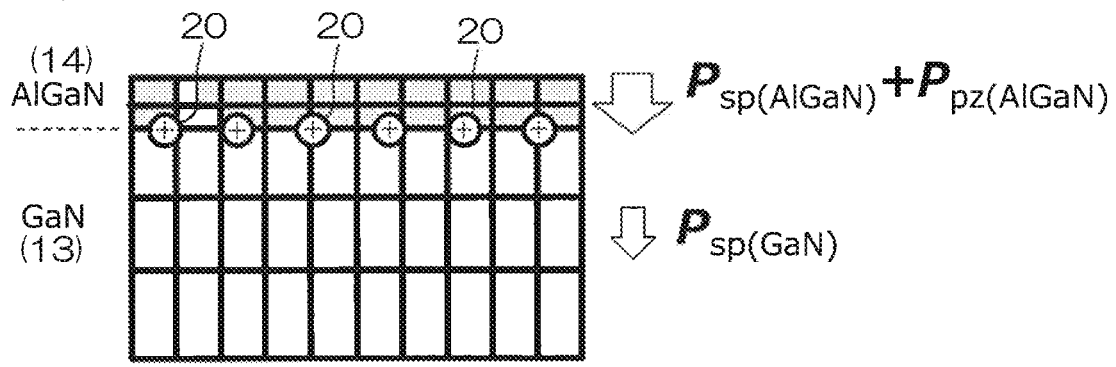
FIG. 3 is a diagram for describing polarization states of interiors of an electron transit layer and an electron supply layer.
Figure 4:
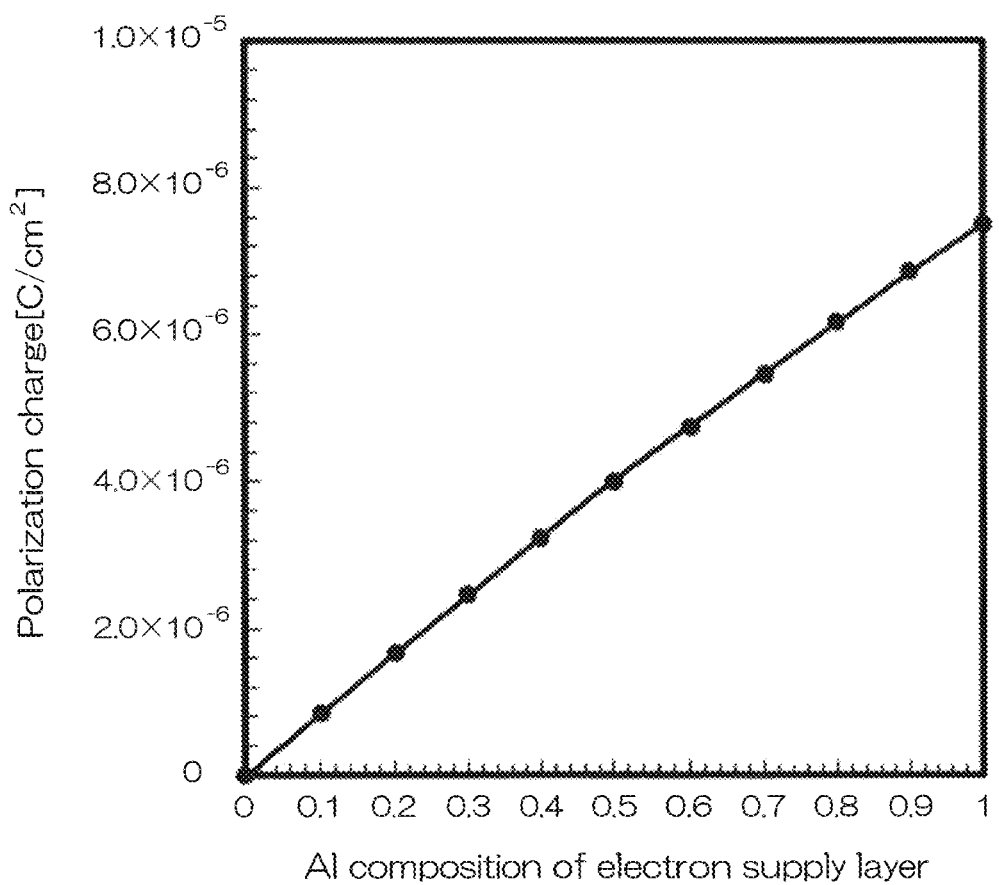
FIG. 4 is a graph of a relationship of Al composition and polarization charge of the electron supply layer (AlGaN).

The electron transit layer 13 is constituted of a GaN layer, and the electron supply layer 14 is constituted of an Al$_x$Ga$_{1-x}$N layer (0<x<1). The electron transit layer 13 and the electron supply layer 14 are thus constituted of nitride semiconductors that differ mutually in composition and form a heterojunction. Therefore, as shown in FIG. 3, in addition to spontaneous polarizations $P_{sp(GaN)}$ and $P_{sp(AlGaN)}$ occurring in the layers 13 and 14 due to configurations of respective atoms in interiors of crystal structures, a piezo polarization $P_{pz(AlGaN)}$, due to lattice mismatch of the two, occurs in the electron supply layer 14. Due to these polarizations, positive polarization charges 20, shown in FIG. 3, are generated in a portion of the electron supply layer 14 near an interface (GaN/AlGaN heterointerface) with the electron transit layer 13. The magnitude (P) of the polarization charges 20 is expressed by the following formula (2) using the abovementioned spontaneous polarizations and the piezo polarization and, as shown in FIG. 4, increases substantially linearly in proportion to an Al composition of the electronic supply layer 14 (AlGaN).

$$P = P_{sp(AlGaN)} + P_{pz(AlGaN)} - P_{sp(GaN)} \qquad (2)$$

At a position of the electron transit layer 13 close to the interface with the electron supply layer 14 (for example, a position of a distance of only several Å from the interface) a large internal electric field is generated due to the polarization charges 20 and a two-dimensional electron gas 21 spreads as shown in FIG. 2.

The source electrode 18 and the drain electrode 19 are ohmic electrodes, containing, for example, Ti and Al, and are electrically connected to the two-dimensional electron gas 21 via the electron supply layer 14.

The bonding wires 9 to 11, shown in FIG. 1, are connected respectively to the drain electrode 19, the source electrode 18, and the gate electrode 16. A rear surface electrode 22 is formed on a rear surface of the substrate 12 and the substrate 12 is connected to the base portion 5 via the rear surface electrode 22. Therefore, with the present preferred embodiment, the substrate 12 is electrically connected to the drain electrode 19 via the bonding wire 9 and thereby set at a drain potential.

Figure 5:
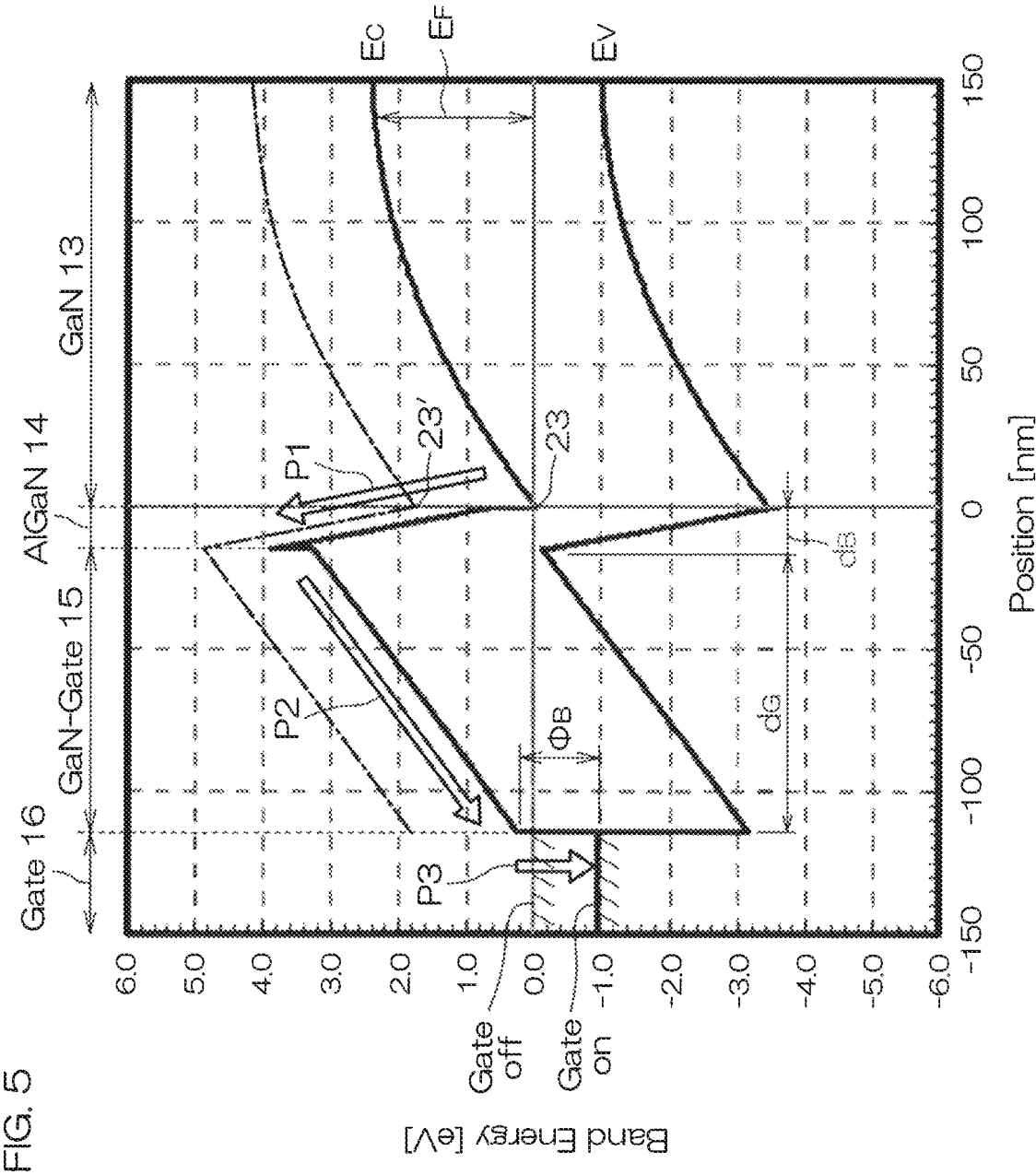
FIG. 5 is an energy band diagram of the nitride semiconductor device.
Figure 6:
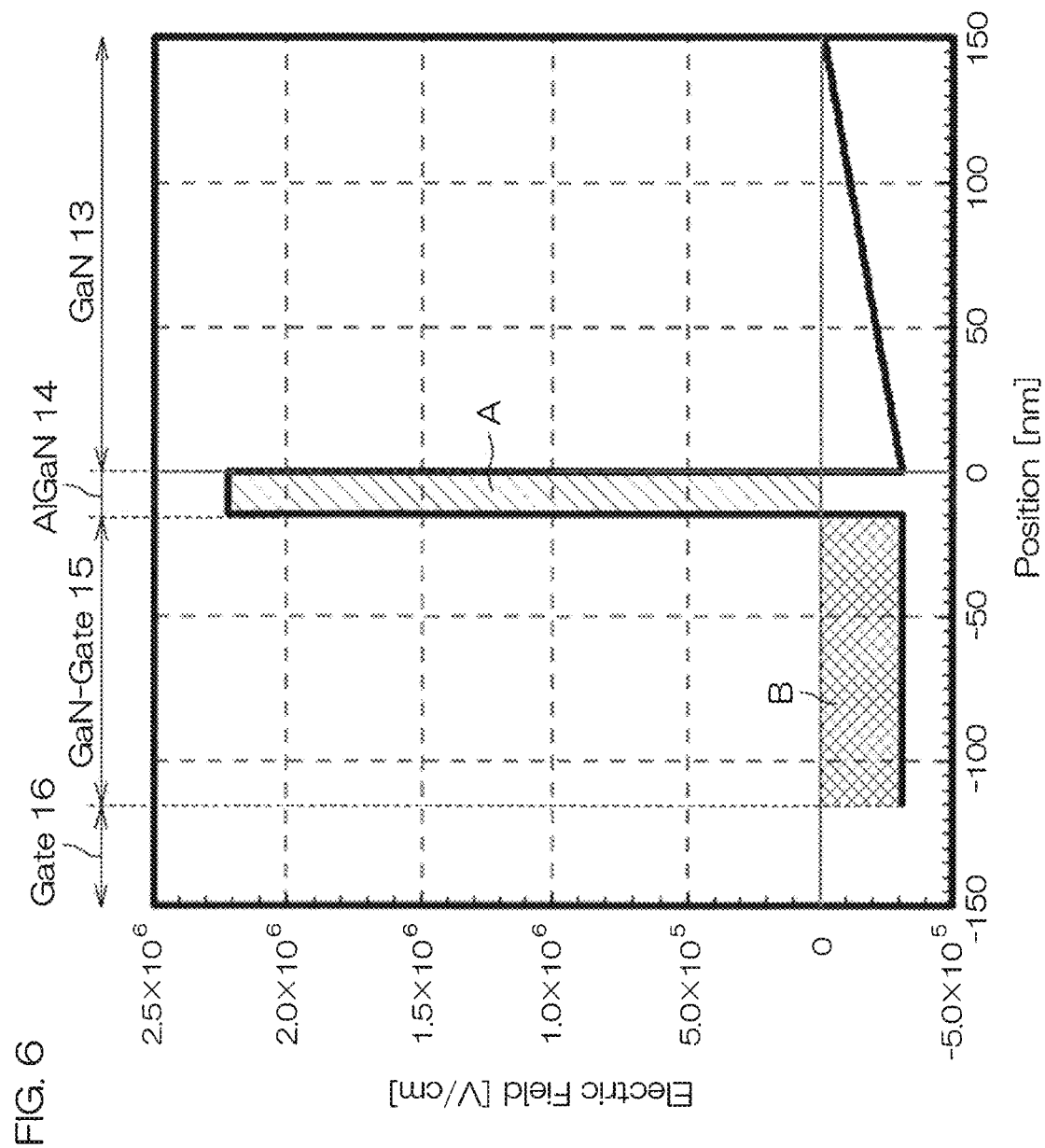
FIG. 6 is a diagram of electric field intensity distribution of the nitride semiconductor device.

FIG. 5 is an energy band diagram of the nitride semiconductor device 3. FIG. 6 is a diagram of electric field intensity distribution of the nitride semiconductor device 3.

As mentioned above, with the nitride semiconductor device 3, the positive polarization charges 20 (see FIG. 3) are generated in the portion of the electron supply layer 14 near the interface (GaN/AlGaN heterointerface) with the electron transit layer 13. In the entire system of the junction (AlGaN/GaN junction) of the electron supply layer 14 and the electron transit layer 13, positive spatial charges are canceled out by negative spatial charges so that the total of the spatial charges is zero and therefore in correspondence to the positive polarization charges 20 inside the electron supply layer 14, the two-dimensional electron gas 21, constituted of negative spatial charges, is generated in the electron transit layer 13 (GaN) that has a bandgap smaller than the electron supply layer 14 (AlGaN). The two-dimensional electron gas 21 serves as a passage (channel) for electrons between the source and the drain. Thus, when the two-dimensional electron gas 21 is present uniformly without interruption between the source and the drain, a so-called normally-on type arrangement is realized in which a current flows between the source and the drain due to a potential difference between the source and the drain even when a voltage is not applied to the gate electrode 16.

Thus, with the present preferred embodiment, the gate layer 15, constituted of GaN, which has a smaller bandgap than the electron supply layer 14 (AlGaN), and effectively not; containing an acceptor type impurity, is interposed between the electron supply layer 14 and the gate electrode 16 to realize a normally-off type device.

The mechanism by which a normally-off arrangement is realized in the present invention is as follows. That is, in principle, the positive polarization charges 20 are canceled out by a spontaneous polarization $P_{sp(GaN-Gate)}$ occurring inside the gate layer 15 and consequently, the two-dimensional electron gas 21 is eliminated selectively from a gate region Ga in which the gate electrode 16 is disposed. That is, it suffices to provide an arrangement where the spontaneous polarization ($-P_{sp(GaN-Gate)}$) of the gate layer 15 is added to the formula (2) above and the magnitude P of the polarization charges 20 is as indicated by the following formula (3).

$$P = P_{sp(AlGaN)} + P_{pz(AlGaN)} - P_{sp(GaN)} - P_{sp(GaN-Gate)} = 0 \qquad (3)$$

On the other hand, the magnitude of the polarization charges 20 is dependent on the Al composition of the electron supply layer 14 (AlGaN) as shown in FIG. 4. It is thus necessary to set conditions of the gate layer 15 and the electron transit layer 13 in accordance with physical properties of the electron supply layer 14 to reliably suppress the polarization charges 20 in the gate region Ga.

Specifically, the conditions are set so that in FIG. 5, (P2)+(P3)−(P1)>0 is satisfied for increments/decrements (P1), (P2), and (P3) of the potential of a conduction band $E_C$ between the gate electrode 16 and a potential well 23, formed at the junction interface (GaN/AlGaN interface) of the electron transit layer 13 and the electron supply layer 14. This is because it will thereby become necessary to apply a positive voltage to the gate electrode 16 to lower the potential of the conduction band $E_C$ of the potential well 23 to a position lower than a Fermi level (at the position of 0.0 eV in FIG. 5) and make the drain current flow.

FIG. 5 shows an energy band when a threshold voltage Vth of 1.0 V is applied to the gate electrode 16 and by setting the gate voltage=1.0 V (gate on), the potential of the conduction band $E_C$ of the potential well 23 becomes equivalent to the Fermi level so that electrons fall into the potential well 23 (the two-dimensional electron gas 21 begins to be generated in the gate region Ga) and the drain current begins to flow. That is, in a state where a voltage is not applied to the gate electrode 16 (gate off), the potential of the conduction band $E_C$ of the potential well 23' is at a position higher than the Fermi level as indicated by an alternate long and short dashed line in FIG. 5 and is in a state where the drain current does not flow. In FIG. 5, the ordinate indicates the potential with respect to electrons.

Also, when expressed as an electric field intensity distribution, the conditions of FIG. 5 will be as shown in FIG. 6. A black solid line indicates the electric field intensities at the respective layers when the threshold voltage Vth of 1.0 V is applied to the gate electrode 16. Here, an electric field intensity integration value A (hatched portion in FIG. 6) of the AlGaN electron supply layer 14 and an electric field intensity integration value B (cross-hatched portion in FIG. 6) of the GaN gate layer 15 satisfy B>A to realize a normally-off arrangement. The internal electric field of the electron supply layer 14 is thereby canceled out by the internal electric field of the gate layer 15 and therefore the generation of the two-dimensional electron gas 21 is suppressed.

Referring again to FIG. 5, (P2)+(P3)−(P1)>0 is expressed, using specific values, by the following formula (1):

$$d_g \sqrt{\frac{2E_F q(N_{DA} + N_A - N_{DD} - N_D)}{\varepsilon_0 \varepsilon_C}} + \Phi_B - \frac{d_B P}{\varepsilon_0 \varepsilon_C} > 0 \quad (1)$$

In the formula (1), the first term, the second term, and the third term from the left respectively correspond to the decrement (P2), the decrement (P3), and the increment (P1) of the potential of the conduction band $E_C$. Also, the definitions of the respective symbols in the formula (1) are as follows.

$d_G$: thickness (cm) of the gate layer 15
$d_B$: thickness (cm) of the electron supply layer 14
P: polarization (C/cm$^2$) of the electron supply layer 14
q: elementary charge (C)
$\Phi_B$: work function (eV) of the gate electrode 16-electron affinity (3.6 eV) of GaN
$N_{DA} + N_A - N_{DD} - N_D$: effective acceptor concentration of the electron transit layer 13
$\varepsilon_C$: relative permittivity of the electron transit layer 13
$\varepsilon_B$: relative permittivity of the electron supply layer 14
$\varepsilon_0$: permittivity of vacuum
$E_F$: energy difference (eV) between the Fermi level and a lower end of conduction band (E) of the electron transit layer 13

To satisfy the formula (1) above, it is preferable for $d_B P/\varepsilon_0 \varepsilon_r$, corresponding to the increment (P1) of the potential of the conduction band $E_C$, to be made as small as possible. Making $d_B$ and P, which are variables of $d_B P/\varepsilon_0 \varepsilon_B$, small is thus considered.

Figure 7:
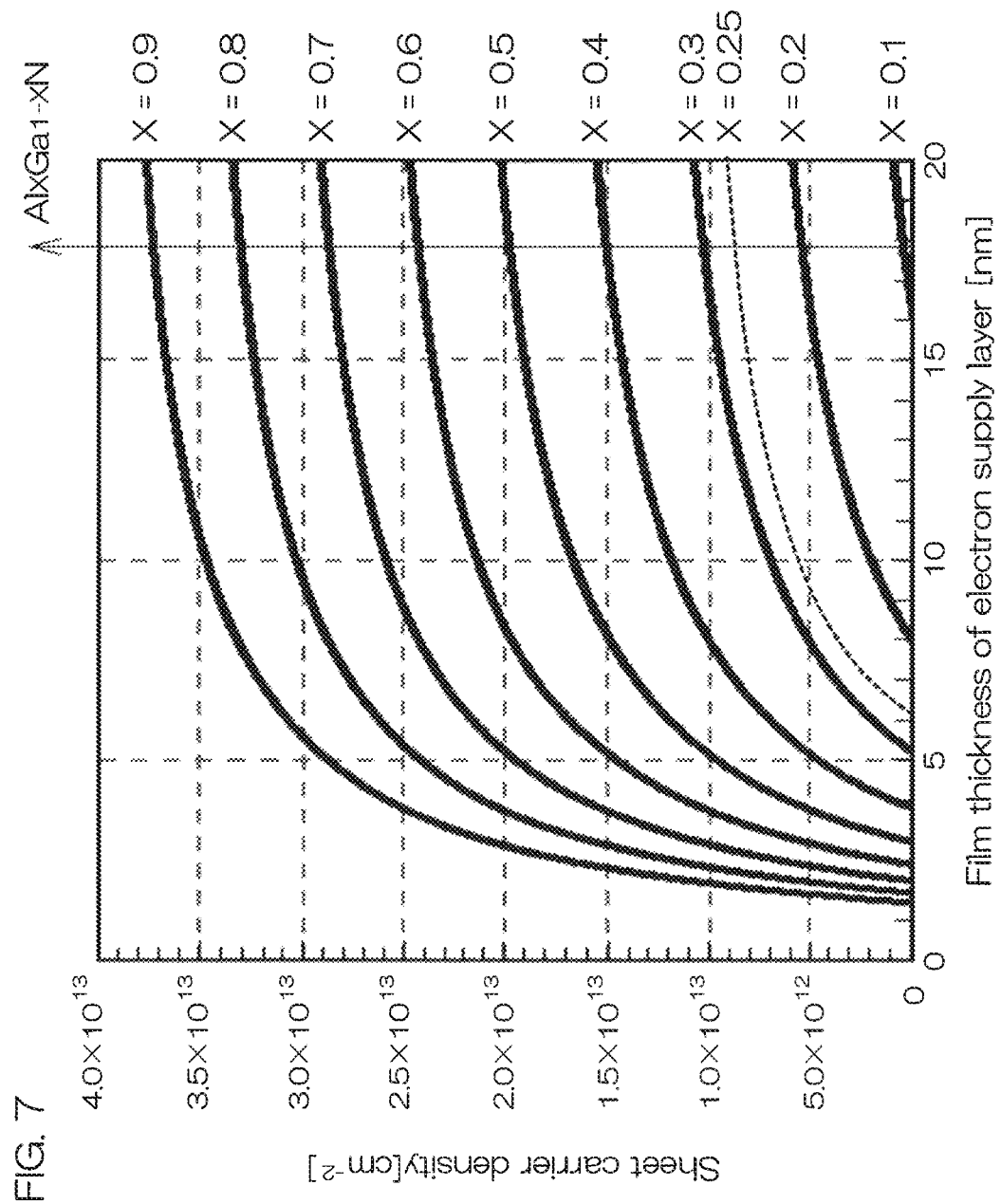
FIG. 7 is a diagram of a relationship of film thickness and sheet carrier density of the electron supply layer.
Figure 8:
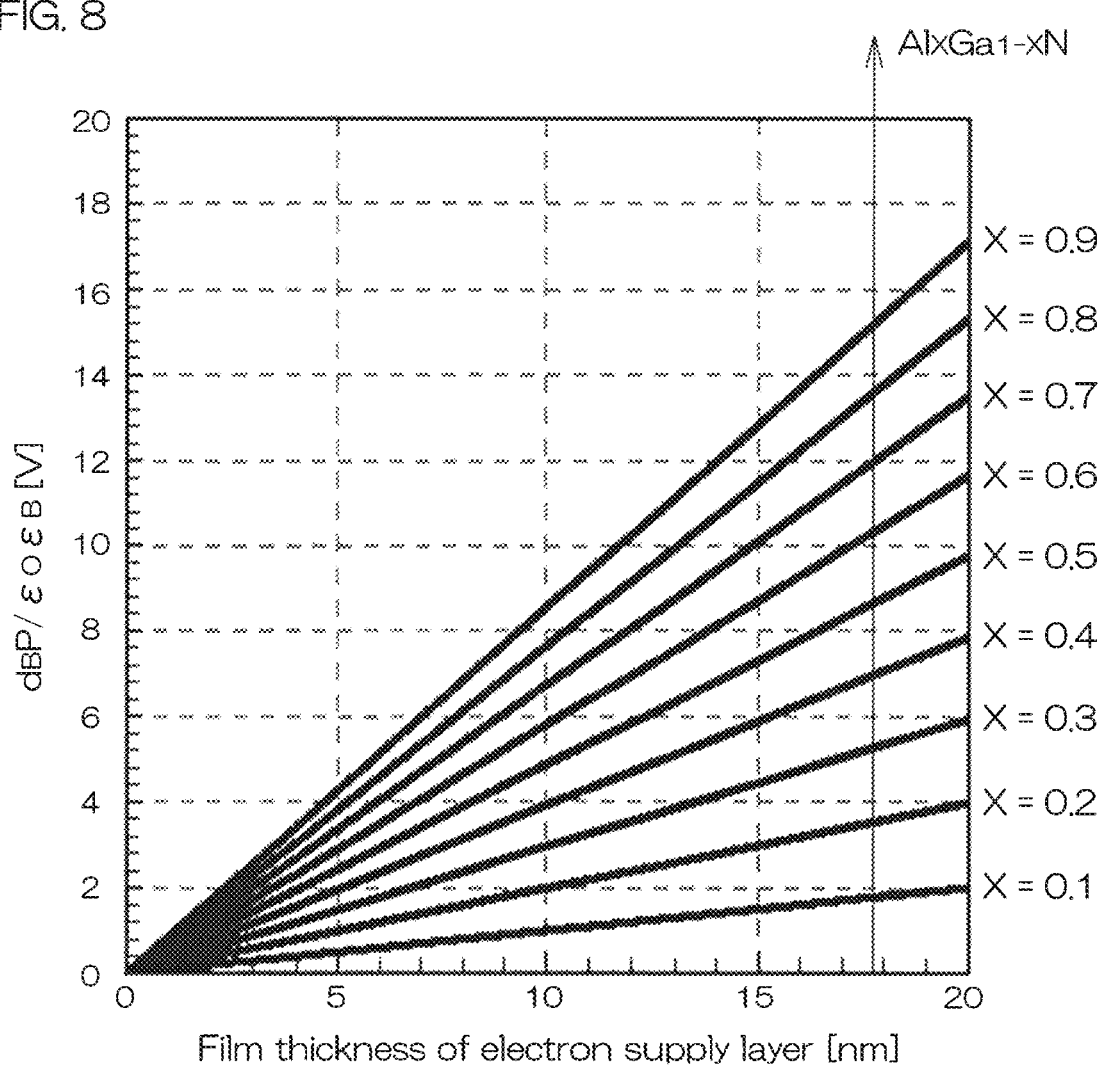
FIG. 8 is a diagram of a relationship of the film thickness and $Pd_B/\varepsilon_0\varepsilon_B$ of the electron supply layer.

First, in regard to the thickness $d_P$ of the electron supply layer 14, reference to FIG. 7 shows that regardless of the Al composition (x=0.1 to 0.9) of AlGaN, a sheet carrier density of the two-dimensional electron gas 21 saturates at approximately $d_B$=20 nm even when the thickness $d_B$ is increased. Therefore, as far as the sheet carrier density is concerned, it suffices for the thickness de to be 20 nm at the most. Oppositely, as shown in FIG. 8, $d_B P/\varepsilon_0 \varepsilon_B$, which is the increment (P1) of the potential of the conduction band $E_C$, increases proportionally with an increase in the thickness $d_B$ of the electron supply layer 14 and therefore in regard to $d_B P/\varepsilon_0 \varepsilon_B$, it is preferable for the thickness $d_B$ to be as small as possible. Therefore, although when the thickness $d_B$ exceeds 20 nm, a satisfactory sheet carrier density can be achieved, the increment (P1) of the potential of the conduction band $E_C$ becomes large, and it is thus preferable for the thickness $d_B$ of the electron supply layer 14 to be not more than 20 nm and not more than 30 nm at the most.

On the other hand, in regard to mobility of the two-dimensional electron gas 21 (2DEG mobility), there is no tradeoff even when it is high and therefore the higher it is, the more preferable, and an example of a condition with which the mobility of the two-dimensional electron gas 21 is maximized is a sheet carrier density in a vicinity of $8.0 \times 10^{12}$ (cm$^{-2}$), as indicated in the following Document 1.

Document 1: Journal of Applied Physics, Vol. 87, No. 8 'Scattering mechanisms limiting two-dimensional electron gas mobility in Al0.25Ga0.75N modulation-doped field-effect transistors'

Even judging from the standpoint of withstand voltage, it is preferable for the sheet carrier density to be in a vicinity of $8.0 \times 10^{12}$ (cm$^{-2}$) or less. Thus, in FIG. 7, when the thickness $d_B$=20 nm, the sheet carrier density is approximately $8.0 \times 10^{12}$ (cm$^{-2}$) if the Al composition is approximately 0.25, and it is therefore preferable for the Al composition to be not more than 0.25 (not more than 25%). In regard to this point, according to FIG. 7, even if the Al composition is large (for example, even if it is 0.9), the sheet carrier density can be made $8.0 \times 10^{12}$ (cm$^{-2}$) as long as the film thickness $d_B$ of the AlGaN electron supply layer 14 is small. In this case, the increase in $d_B P/\varepsilon_0 \varepsilon_B$ in FIG. 8 is also small because the film thickness is small, and both high sheet carrier density and high gate threshold voltage can be realized at the same time. On the other hand, if the Al composition of the AlGaN electron supply layer 14 is large and the AlGaN electron supply layer 14 is thin, AlGaN itself is readily oxidized, for example, when performing etching of the GaN gate layer 15 on the AlGaN electron supply layer 14 using a plasma of a mixed gas of Cl$_2$ and O$_2$.

To summarize the above, the ranges of physical properties of the electron supply layer. 1.4, constituted of AlGaN, are a thickness $d_B$ of not more than 30 nm (more preferably not more than 20 nm and not less than 3 nm) and an Al composition of not more than 25%. If the thickness de of the electron supply layer 14 is not less than 3 nm, the occurrence of direct tunneling due to the electron supply layer 14 being too thin can be prevented and a gate leak current can be reduced. The electron supply layer 14 may be an undoped AlGaN layer. Here, undoped AlGaN signifies AlGaN that effectively does not contain an acceptor type impurity and is specifically AlGaN with which an impurity is not intentionally introduced when forming the electron supply layer 14.

With the physical property conditions of the electron supply layer 14 being set as described above, preferable conditions regarding the GaN electron transit layer 13 and the GaN gate layer 15 shall now be examined based on the physical property conditions described above.

First, FIG. 9 is a diagram of relationships of physical properties of the electron supply layer 14 and $d_G \sqrt{N_{DA}+N_A-N_{DD}-N_D}$, which is a portion of the decrement (P2) of the potential of the conduction band $E_C$, and shows preferable ranges of $d_G \sqrt{N_{DA}+N_A-N_{DD}-N_D}$ for a plurality of combinations of the thickness $d_B$ and the Al composition.

Referring to FIG. 9, with respect to each of the four graphs (straight lines), the upper side is a range in which a normally-off arrangement can be realized and the lower side is a range in which a normally-on arrangement is realized. Therefore, for each thickness $d_B$ and Al composition of the electron supply layer 14, the value of $d_G \sqrt{N_{DA}+N_A-N_{DD}-N_D}$ is set as suited so as to be included in the range higher than the corresponding graph in FIG. 9.

Here, a method for determining $(N_{DA}+N_A-N_{DD}-N_D)$ shall be described.

First, in regard to the energy band structure of the electron transit layer 13, a shallow donor level $E_D$, a deep donor level $E_{DD}$, a shallow acceptor level $E_A$, and a deep acceptor level $E_{DA}$ are formed.

The shallow donor level $E_D$ is, for example, an energy level at a position separated by not more than 0.025 eV from the lower end (bottom) energy level $E_C$ of the conduction band of the electron transit layer 13 and may be referred to simply as the "donor level $E_D$" as long as distinction can be made with respect to the deep donor level $E_{DD}$. Ordinarily, donor electrons doped at this position are excited to the conduction band and are free electrons even at room temperature (thermal energy kT=approximately 0.025 eV). As an impurity forming the shallow donor level $E_D$, for example, at least one type selected from the group consisting of Si and O can be cited. These may be incorporated into the film during epitaxial growth of the electron transit layer 13 or may be doped intentionally. For example, oxygen (O) may be incorporated from a raw material gas or a carrier gas.

On the other hand, the deep donor level $E_{DD}$ is, for example, an energy level at a position separated by not less than 0.025 eV from the lower end (bottom) energy level $E_C$ of the conduction band of the electron transit layer 13. That is, the deep donor level $E_{DD}$ is formed by doping of a donor, with which an ionization energy necessary for excitation is greater than the thermal energy at room temperature. Therefore, ordinarily, the donor electrons doped at this position are not excited to the conduction band and are in a state of being captured by the donor at room temperature. The deep donor level $E_{DD}$ may, for example, be that due to a crystal defect occurring spontaneously in GaN during epitaxial growth of the electron transit layer 13.

The shallow acceptor level $E_A$ is, for example, an energy level at a position separated by not more than 0.025 eV from an upper end (top) energy level $E_V$ of valence electrons of the electron transit layer 13 and may be referred to simply as the "acceptor level $E_A$" as long as distinction can be made with respect to the deep acceptor level $E_{DA}$. Ordinarily, acceptor holes doped at this position are excited to a valence band and are free holes even at room temperature (thermal energy kT=approximately 0.025 eV).

On the other hand, the deep acceptor level $E_{DA}$ is, for example, an energy level at a position separated by not less than 0.025 eV from the upper end (top) energy level $E_V$ of the valence electrons of the electron transit layer 13. That is, the deep acceptor level $E_{DA}$ is formed by doping of an acceptor, with which an ionization energy necessary for excitation is greater than the thermal energy at room temperature. Therefore ordinarily, the acceptor holes doped at this position are not excited to the valence band and are in a state of being captured by the acceptor at room temperature.

As an impurity doped into the electron transit layer 13, constituted of GaN, to form the deep acceptor level $E_{DA}$, for example, at least one type selected from the group consisting of C, Be, Cd, Ca, Cu, Ag, Au, Sr, Ba, Li, Na, K, Sc, Zr, Fe, Co, Ni, Mg, Ar, and He can be cited.

Among these, although C and Mg can be cited mainly, carbon (C) functions as a deep acceptor when incorporated in a nitrogen site inside GaN and functions as a shallow donor when incorporated in a Ga site, and therefore, to increase $(N_{DA}+N_A-N_{DD}-N_D)$ reliably, it is preferable to use Mg, and Ma is preferably contained in a region in the electron transit layer 13 that is within 150 nm from the interface with the electron supply layer 14. For example, in FIG. 5 and FIG. 11 (to be described below), a region of the GaN electron transit layer 13 in which the energy band is curved is approximately 150 nm from the AlGaN electron supply layer 14/GaN electron transit layer 13 interface. That is, this is because the region within 150 nm from the interface contributes to the threshold voltage and the concentrations and types of impurities in this region are important.

However, C may also be used as the deep acceptor. When C is used for the deep acceptor level, it is known to form, for example, a level of 0.9 eV from the upper end (top) energy level $E_V$ of the valence band of the electron transit layer 13. On the other hand, when Mg is used, it is known to form a level of 0.1 to 0.2 eV from $E_V$. Although this is a position separated by not less than 0.025 eV from the upper end (top) energy level $E_V$ of the valence band of the electron transit layer 13 as mentioned above and Mg can thus be said to be a deep acceptor, when the Fermi level is fixed at this level of Mg, a probability of presence of a hole at $E_V$ at room temperature will be 0.003 to 0.02. In other words, this means that at room temperature, a hole is generated at $E_V$ at a proportion of one in 100 to 1000. If a hole that can move freely is thereby made present inside the electron transit layer 13, a problem occurs in that a p-n junction is formed and thus a parasitic capacitance is formed in the electron transit layer 13. Further, leak current is increased by the formed hole acting as a carrier. By the above, an impurity, with which the deep acceptor level will be at a position separated from $E_V$ by more than 0.2 eV and, for example, not less than 0.3 eV, is preferable, and C satisfies this condition.

When C is used as the deep acceptor, $E_F$ in (1) above is such that $E_F$=2.5 eV because the bandgap of GaN is 3.6 eV, and when Mg is used, $E_F$=3.2 eV.

Concentrations of the impurities (dopants) forming the shallow donor level $E_D$, the deep donor level $E_{DD}$, the shallow acceptor level $E_A$, and the deep acceptor level $E_{DA}$ described above shall be referred to respectively as a shallow donor concentration $N_D$, a deep donor concentration $N_{DD}$, a shallow acceptor concentration $N_A$, and a deep acceptor concentration $N_{DA}$. For example, if as the impurity forming the deep acceptor level $E_{DA}$, only C (carbon) is doped in the electron transit layer 13 at a concentration of $0.5\times10^{16}$ cm$^{-3}$, this carbon concentration is defined as the deep acceptor concentration $N_{DA}$. The concentrations $N_D$, $N_{DD}$, $N_A$, and $N_{DA}$ may be measured, for example, by SIMS (Secondary Ion Mass Spectrometry).

A more specific measurement method can be described with reference to FIG. 10A to FIG. 10C. First, as shown in FIG. 10A, when a voltage is not applied across both electrodes (unbiased state), the acceptors and the deep acceptors capture electrons emitted by the donors and the deep donors. In this state, positive charges, due to the donors and the deep donors that emitted the electrons, and negative charges, due to the acceptors and the deep acceptors that captured the electrons, are equal in number and therefore the GaN layer is electrically neutral as a whole.

Next, as a voltage is applied as shown in FIG. 10B, the positively biased side becomes negatively charged due to the deep acceptors capturing electrons from the valence band $(E_V)$. An electric flux generated by the voltage application is canceled out by the negatively charged region and therefore electron implantation into the conduction band $E_C$ of the electron transit layer does not occur and the current that flows is extremely minute.

Then, when a voltage Vth of not less than a certain level is applied as shown in FIG. 10C, electron capture by the deep acceptors occurs in all regions. Electron capture does not occur even when a higher voltage is applied and because the electric flux cannot be canceled out completely, electrons become implanted into the conduction band $E_C$ from the source electrode and a current begins to flow. A formula that includes the voltage Vth in this state is derived from the Poisson formula as $N_{DA}+N_A-N_D-N_{DD}=2$ Vth$\varepsilon_0\varepsilon_C$/qW$^2$ (where W is the thickness of the GaN electron transit layer) and consequently, Vth=q$(N_{DA}+N_A-N_D-N_{DD})\cdot W^2/2\varepsilon_0\varepsilon_C$ is obtained. That is, $(N_{DA}+N_A-N_D-N_{DD})$ can be determined based on this formula.

The preferable ranges of $d_G\sqrt{N_{DA}+N_A-N_{DD}-N_D}$ for the respective thicknesses $d_B$ and Al compositions of the electron supply layer 14 are as shown in FIG. 9, and preferable ranges of $d_G$ and $(N_{DA}+N_A-N_{DD}-N_D)$ that constitute $d_G\sqrt{N_{DA}+N_A-N_{DD}-N_D}$ are, for example, as indicated below. The preferable ranges indicated below differ according to the respective thicknesses $d_B$ and Al compositions of the electron supply layer 14 and may therefore be set as suited in accordance with the respective thicknesses da and Al compositions of the electron supply layer 14.

First, the thickness $d_G$ of the gate layer 15 is preferably, for example, 50 nm to 100 nm. On the other hand, $(N_{DA}+N_A-N_{DD}-N_D)$ is not less than $5\times10^{16}$ cm$^{-3}$. This preferable range of $(N_{DA}+N_A-N_{DD}-N_D)$ can be explained with reference to FIG. 11.

FIG. 11 is an energy band diagram of a turn-on state when the electron supply layer 14 has an Al composition of 20% and a thickness da of 15 nm, the thickness $d_G$ of the gate layer 15 is 80 nm, $\Phi_B$=1.2 eV, and $(N_{DA}+N_A-N_{DD}-N_D)$ is $5\times10^{16}$ cm$^{-3}$. The threshold voltage in this state is 0.3 eV and a normally-off operation is narrowly realized. From this, it can be understood that for a normally-off operation, $(N_{DA}+N_A-N_{DD}-N_D)$ of at least $5\times10^{17}$ cm$^{-3}$ is necessary.

Also, a preferable range of $\Phi_B$ (work function (eV) of the gate electrode 16-electron affinity (3.6 eV) of GaN) in the formula (1) above is 0.7 eV to 1.4 eV. This range may be realized using, for example, Ni ($\Phi_M$=4.8 eV), Pt ($\Phi_M$=5.0 eV), Mo ($\Phi_N$=4.3 eV), W ($\Phi_M$=4.6 eV), or TiN ($\Phi_M$=4.6 eV) as the gate electrode 16. On the other hand, although Al ($\Phi_M$=4.0 eV) may also be used as the gate electrode 16, Al is low in work function compared to Mo, etc., mentioned above and reacts readily with a semiconductor or an insulating film and it is therefore preferable to use Mo or TiN which are rather high in work function.

Figure 12:
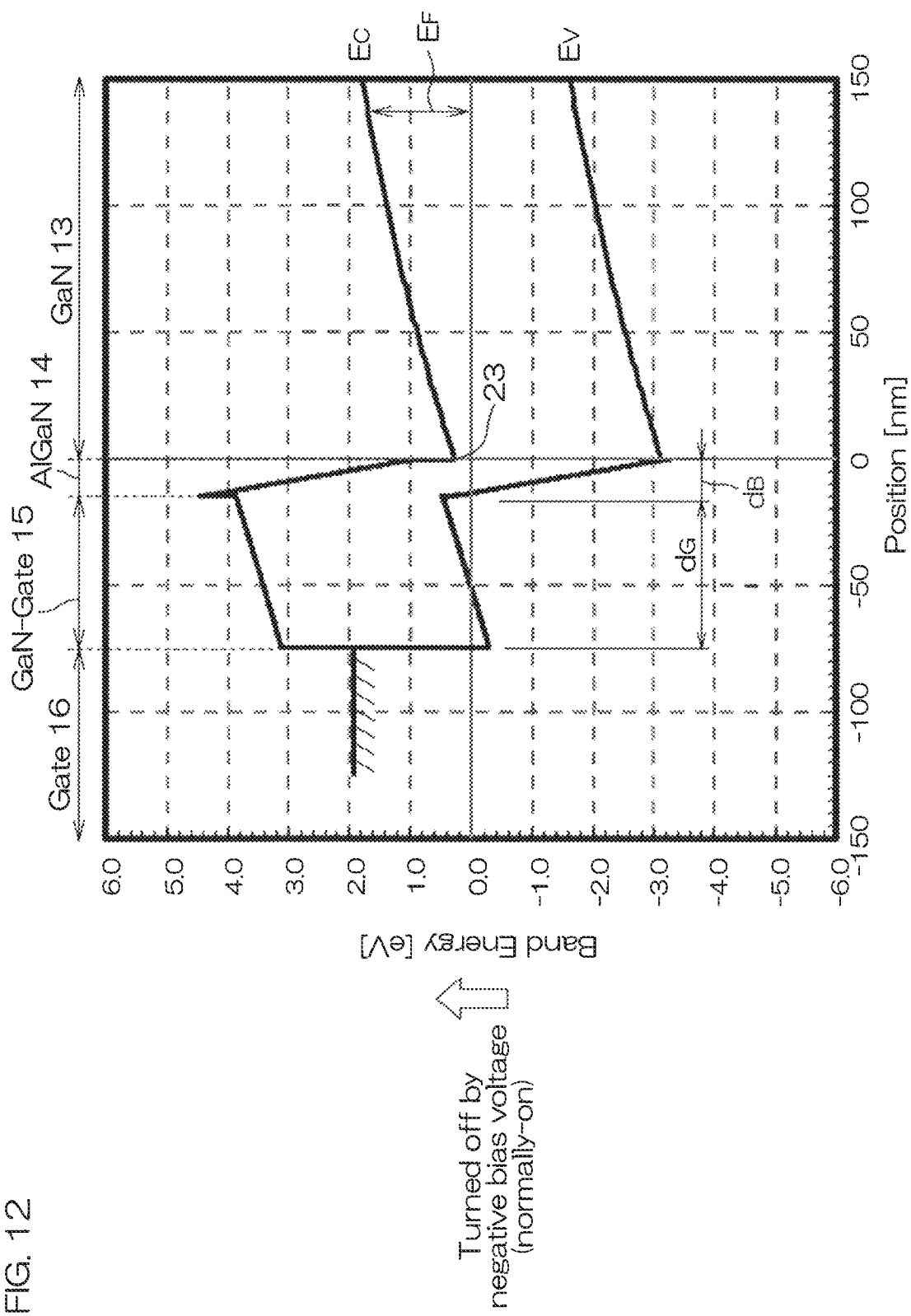
FIG. 12 is an energy band diagram (simulation results) of a nitride semiconductor device according to a reference embodiment of the present invention.
Figure 13:
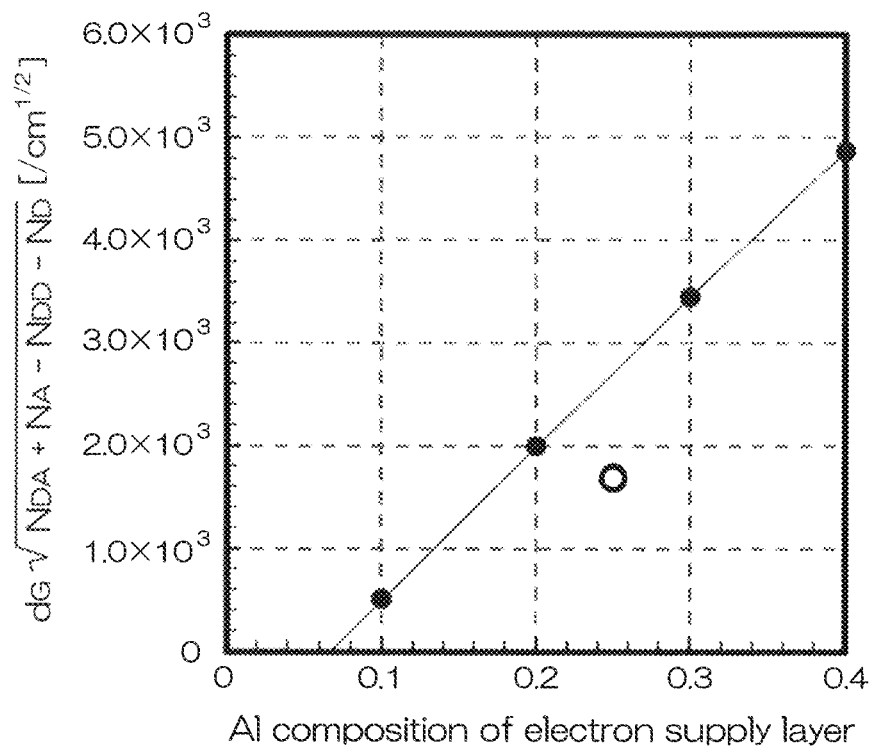
FIG. 13 is a diagram (simulation results) of a relationship of Al composition of an electron supply layer and $d_G\sqrt{N_{DA}+N_A-N_{DD}-N_D}$ of the nitride semiconductor device according to the reference embodiment of the present invention.
Figure 14:
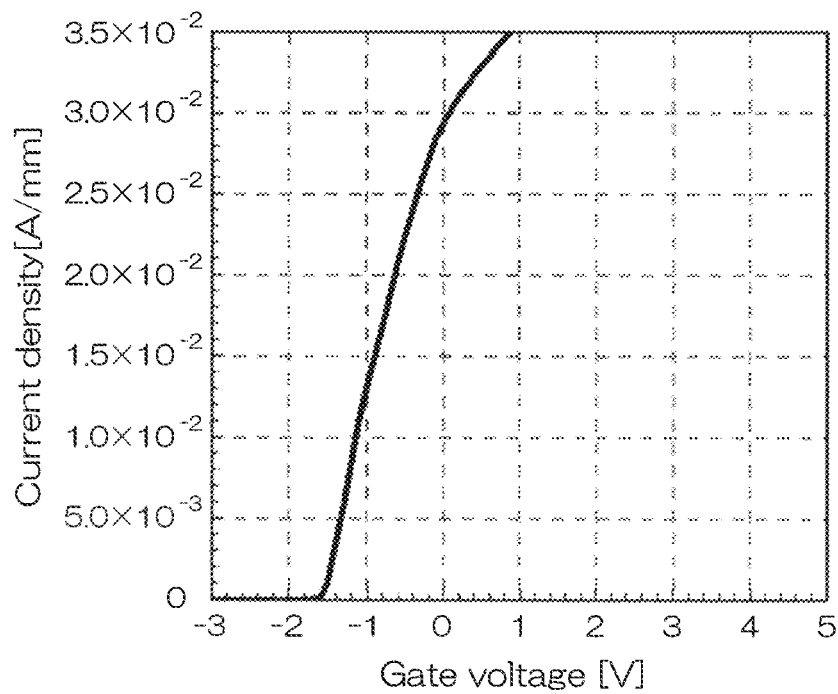
FIG. 14 is a diagram (simulation results) of a relationship of gate voltage and current density of the nitride semiconductor device according to the reference embodiment of the present invention.

Next, effects of the present invention were examined by simulation. The results are shown in FIG. 12 to FIG. 17.
<Simulation Conditions>
(1) Reference Embodiment (FIG. 12 to FIG. 14)
GaN (electron transit layer 13): $N_{DA}+N_A-N_{DD}-N_D=2.0\times10^{16}$ cm$^{-3}$
AlGaN (electron supply layer 14): Al composition 25%, film thickness 15 nm
GaN (gate layer 15): non-doped, film thickness 60 nm
gate electrode: work function $\Phi_M$=4.6 eV
(2) Preferred Embodiment (FIG. 15 to FIG. 17)
GaN (electron transit layer 13): $N_{DA}+N_A-N_{DD}-N_D=1.0\times10^{17}$ cm$^{-3}$
AlGaN (electron supply layer 14): Al composition 25%, film thickness 15 nm
GaN (gate layer 15): non-doped, film thickness 100 nm
gate electrode: work function $\Phi_M$=4.6 eV As shown in FIG. 12, with the reference embodiment, application of a negative voltage to the gate electrode 16 raises the potential of the conduction band $E_C$ of the potential well 23 to a position higher than the Fermi level and the off state of the device is maintained thereby. The arrangement is thus of the normally-on type, with which a current flows between the source and the drain in a state where a voltage is not applied to the gate electrode 16. When, for the present reference embodiment, the value of $d_G\sqrt{N_{DA}+N_A-N_{DD}-N_D}$ is plotted on a graph as in FIG. 9 above, it will be at the position indicated by "○" in FIG. 13. Also, from the result shown in FIG. 14, it was confirmed that a current of approximately $3.0\times10^{-2}$ (A/mm) flows when the gate voltage Vg=0 V.

Figure 15:
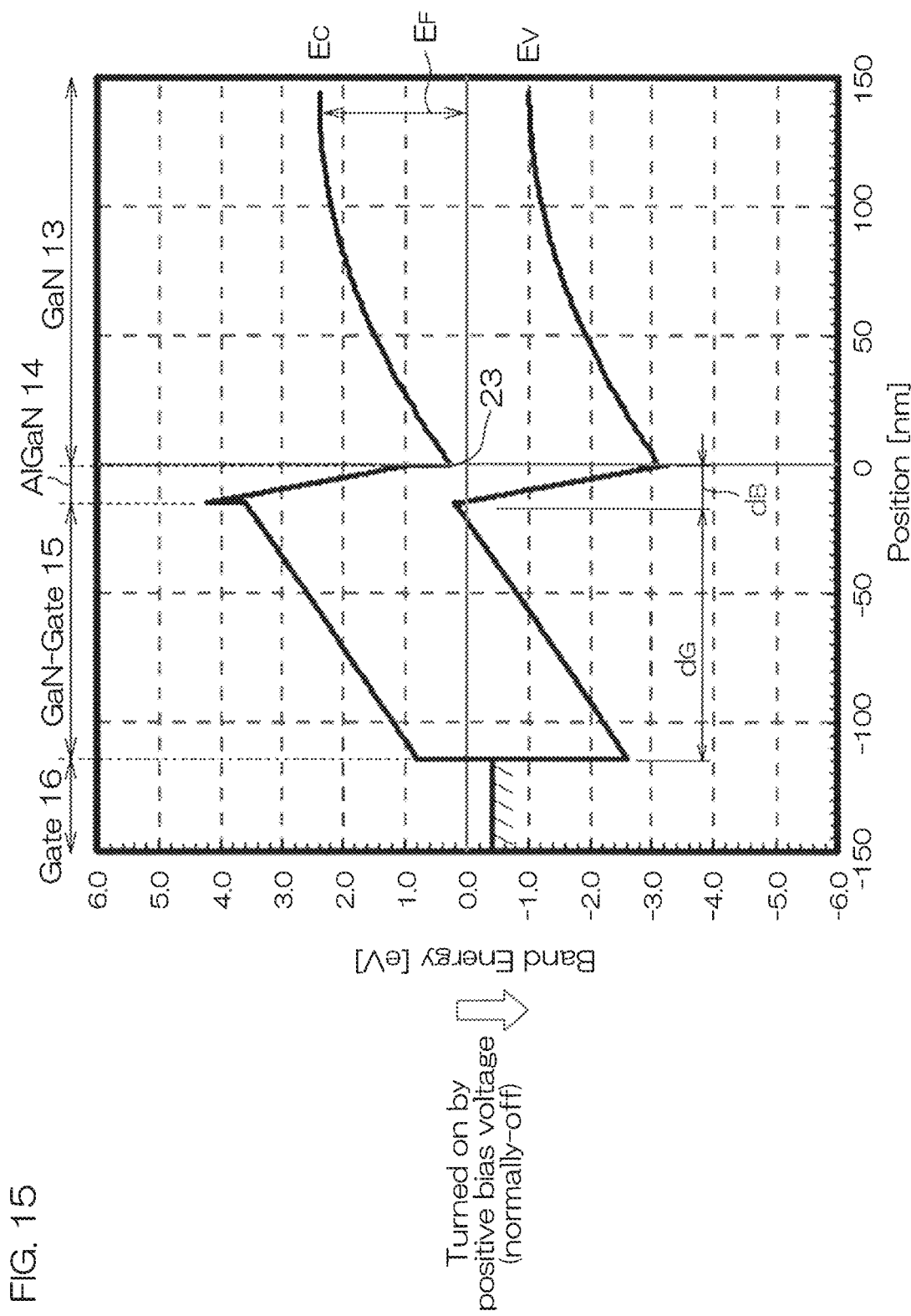
FIG. 15 is an energy band diagram (simulation results) of a nitride semiconductor device according to a preferred embodiment of the present invention.
Figure 16:
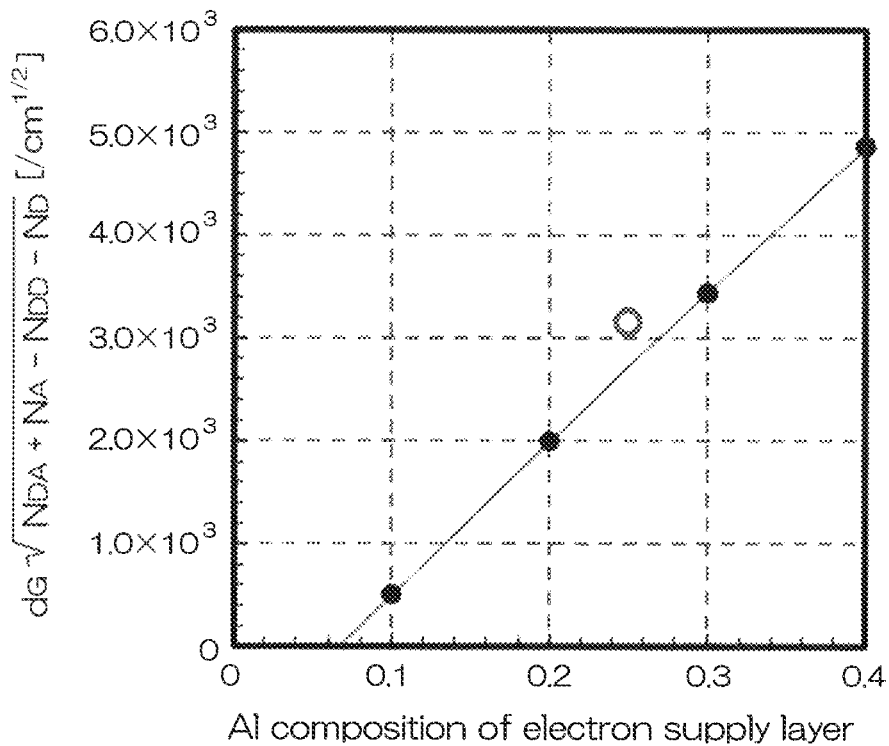
FIG. 16 is a diagram (simulation results) of a relationship of Al composition of an electron supply layer and $d_G\sqrt{N_{DA}+N_A-N_{DD}-N_D}$ of the nitride semiconductor device according to the preferred embodiment of the present invention.
Figure 17:
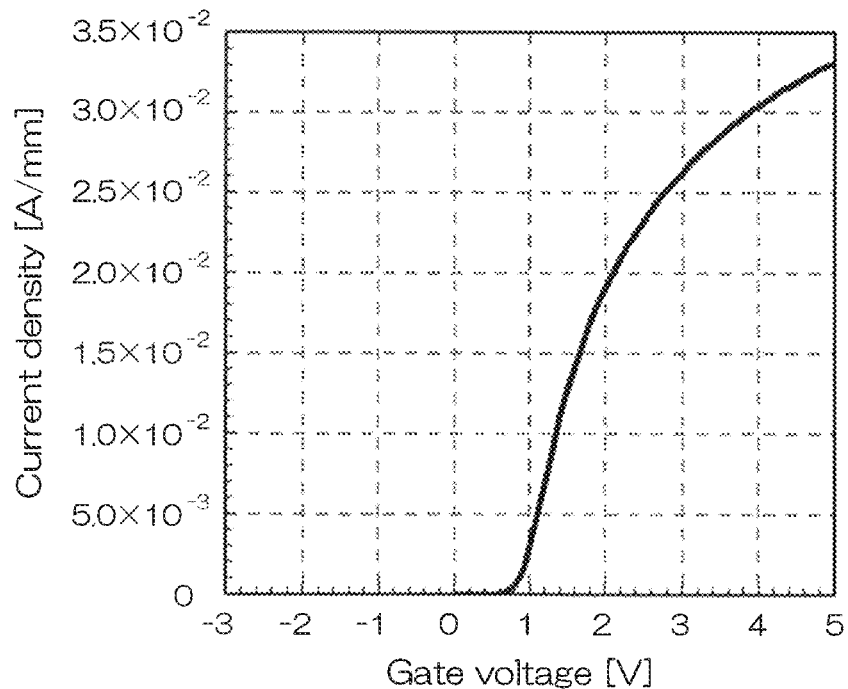
FIG. 17 is a diagram (simulation results) of a relationship of gate voltage and current density of the nitride semiconductor device according to the preferred embodiment of the present invention.

On the other hand, as shown in FIG. 15, with the present preferred embodiment, application of a positive voltage to the gate electrode 16 lowers the potential of the conduction band $E_C$ of the potential well 23 to a position lower than the Fermi level and the device thereby transitions to the on state. The arrangement is thus of the normally-off type, with which a current does not flow between the source and the drain in a state where a voltage is not applied to the gate electrode 16. When, for the present preferred embodiment, the value of $d_G\sqrt{N_{DA}+N_A-N_{DD}-N_D}$ is plotted on a graph as in FIG. 9 above, it will be at the position indicated by "o" in FIG. 16. Also, from the result shown in FIG. 17, it was confirmed that a current does not flow when the gate voltage Vg=0 V.

Although the first preferred embodiment of the first invention has been described above, the first invention may be implemented in other modes.

For example, although with the first preferred embodiment described above, an example where the electron transit layer 13 is constituted of GaN and the electron supply layer 14 is constituted of AlGaN was described, it suffices that the electron transit layer 13 and the electron supply layer 14 differ in Al compostions and other combinations are also possible. The electron supply layer/electron transit layer combination may be any of AlGaN layer/GaN layer, AlGaN layer/AlGaN layer (with the layers differing in Al composition), AlInN layer/AlGaN layer, AlInN layer/GaN layer, AlN layer/GaN layer, and AlN layer/AlGaN layer. To generalize further, the electron supply layer contains Al and N in its composition. The electron transit layer contains Ga and N in its composition and differs in Al composition from the electron supply layer. By the electron supply layer and the electron transit layer differing in Al composition, a lattice mismatch arises between the two and carriers due to polarization are thereby made to contribute to the forming of a two-dimensional electron gas.

Also, although with the first preferred embodiment described above, silicon was taken up as an example of the material of the substrate 12, besides this, any substrate material, such as a sapphire substrate, a GaN substrate, etc., may be applied.

[1-2] Second Preferred Embodiment and Third Preferred Embodiment of the First Invention A second preferred embodiment and a third preferred embodiment of the first invention shall now be described in detail with reference to FIG. 1 to FIG. 8, FIG. 10, and FIG. 18 to FIG. 24.

An external view of a semiconductor package 1 that includes a nitride semiconductor device 3 according to the second preferred embodiment is the same as the external view of the semiconductor package 1 that includes the nitride semiconductor device 3 according to the first preferred embodiment of the first invention described using FIG. 1.

Referring to FIG. 1, the semiconductor package 1, which includes the nitride semiconductor device 3 according to the second preferred embodiment, includes a terminal frame 2, the nitride semiconductor device 3 (chip), and a resin package 4.

The terminal frame 2 has the form of a plate made of a metal. The terminal frame 2 includes a base portion 5 (island), supporting the nitride semiconductor device 3, a drain terminal 6, a source terminal 7, and a gate terminal 8. The drain terminal 6 is formed integral to the base portion 5. The drain terminal 6, the source terminal. 7, and the gate terminal 8 are electrically connected respectively by bonding wires 9 to 11 to a drain, a source, and a gate of the nitride semiconductor device 3. The source terminal 7 and the gate terminal 8 are disposed so as to sandwich the drain terminal 6 at a center.

The resin package 4 is constituted, for example, of a known molding resin, such as an epoxy resin, etc., and seals the nitride semiconductor device 3. The resin package 4 covers the nitride semiconductor device 3 together with the base portion 5 of the terminal frame 2 and the bonding wires 9 to 11. Portions of the three terminals 6 to 8 are exposed from the resin package 4.

A schematic sectional view of the nitride semiconductor device 3 according to the second preferred embodiment is the same as the schematic sectional view of the nitride semiconductor device 3 according to the first preferred embodiment described using FIG. 2.

Referring to FIG. 2, the nitride semiconductor device 3 according to the second preferred embodiment includes a substrate 12, an electron transit layer 13 on the substrate 12, and an electron supply layer 14 on the electron transit layer 13. The electron transit layer 13 and the electron supply layer 14 are formed on the substrate 12, for example, by an epitaxial growth method. Also, a buffer layer, constituted of AlN or AlGaN, etc., may be interposed as necessary between the substrate 12 and the electron transit layer 13.

The nitride semiconductor device 3 further includes a gate layer 15, formed selectively on the electron supply layer 14, and a gate electrode 16, formed on the gate layer 15. The gate electrode 16 faces the electron supply layer 14 via the gate layer 15.

Also, a surface insulating film 17 is formed on the electron supply layer 14 so as to cover the gate electrode 16.

In FIG. 2, contact holes 18a and 19a, selectively exposing portions of the electron supply layer 14, are formed in the surface insulating film 17, and a source electrode 18 and a drain electrode 19 are put in ohmic contact with the electron supply layer 14 via the contact holes 18a and 19a.

The source electrode 18 and the drain electrode 19 are disposed across an interval and the gate electrode 16 is disposed therebetween. Also, the source electrode 18 is formed in a pattern that covers the gate electrode 16 via the surface insulating film 17.

The substrate 12 may, for example, be a conductive silicon substrate. The conductive silicon substrate may have an impurity concentration, for example, of $1 \times 10^{17}$ cm$^{-3}$ to $1 \times 10^{20}$ cm$^{-3}$ (and more specifically, approximately $1 \times 10^{8}$ cm$^{-3}$).

The gate layer 15 may, for example, be an undoped GaN layer or may be a GaN layer containing an acceptor type level. Here, undoped GaN signifies GaN that effectively does not contain an acceptor type impurity. Specifically, it is GaN with which an impurity is not intentionally introduced when forming the gate layer 15 and is more specifically GaN with a concentration of, for example, less than $1 \times 10^{17}$ cm$^{-3}$ and more preferably less than $1 \times 10^{16}$ cm$^{-3}$. This is because if the impurity concentration contained in the gate layer 15 is of approximately such level, the impurity will not function as an acceptor. The impurity concentrations may be determined by performing SIMS (secondary ion mass spectroscope) analysis on the gate layer 15. Also, the GaN layer that includes the acceptor type level may contain, for example, Mg or C as the acceptor or may have a hole defect formed therein.

The electron transit layer 13 is constituted of a GaN layer, and the electron supply layer 14 is constituted of an Al$_x$Ga$_{1-x}$N layer (0<x<1) and may contain In as necessary. The electron transit layer 13 and the electron supply layer 14 are thus constituted of nitride semiconductors that differ mutually in composition and form a heterojunction. Therefore, as shown in FIG. 3, in addition to spontaneous polarizations $P_{sp(GaN)}$ and $P_{sp(AlGaN)}$ occurring in the layers 13 and 14 due to configurations of respective atoms in interiors of crystal structures, a piezo polarization $P_{pz(AlGaN)}$, due to lattice mismatch of the two, occurs in the electron supply layer 14. Due to these polarizations, positive polarization charges 20, shown in FIG. 3, are generated in a portion of the electron supply layer 14 near an interface (GaN/AlGaN heterointerface) with the electron transit layer 13. The magnitude (P) of the polarization charges 20 is expressed by the following formula (2) using the spontaneous polarizations and the piezo polarization and, as shown in FIG. 4, increases substantially linearly in proportion to the Al composition of the electronic supply layer 14 (AlGaN).

$$P = P_{sp(AlGaN)} + P_{pz(AlGaN)} - P_{sp(GaN)} \qquad (2)$$

At a position of the electron transit layer 13 close to the interface with the electron supply layer 14 (for example, a position of a distance of only several Å from the interface) a large internal electric field is generated due to the polarization charges 20 and a two-dimensional electron gas 21 spreads as shown in FIG. 2.

The source electrode 18 and the drain electrode 19 are ohmic electrodes, containing, for example, Ti and Al, and are electrically connected to the two-dimensional electron gas 21.

The bonding wires 9 to 11, shown in FIG. 1, are connected respectively to the drain electrode 19, the source electrode 18, and the gate electrode 16. A rear surface electrode 22 is formed on a rear surface of the substrate 12 and the substrate 12 is connected to the base portion 5 via the rear surface electrode 22. Therefore, with the present preferred embodiment, the substrate 12 is electrically connected to the drain electrode 19 via the bonding wire 9 and thereby set at the drain potential.

FIG. 5 is an energy band diagram of the nitride semiconductor device 3. FIG. 6 is a diagram of the electric field intensity distribution of the nitride semiconductor device 3.

As mentioned above, with the nitride semiconductor device 3, the positive polarization charges 20 (see FIG. 3) are generated in the portion of the electron supply layer 14 near the interface (GaN/AlGaN heterointerface) with the electron transit layer 13. In the entire system of the junction (AlGaN/GaN junction) of the electron supply layer 14 and the electron transit layer 13, positive spatial charges are canceled out by negative spatial charges so that the total of the spatial charges is zero and therefore in correspondence to the positive polarization charges 20 inside the electron supply layer 14, the two-dimensional electron gas 21, constituted of negative spatial charges, is generated in the electron transit layer 13 (GaN) that has a bandgap smaller than the electron supply layer 14 (AlGaN). The two-dimensional electron gas 21 serves as a passage (channel) for electrons between the source and the drain. Thus, when the two-dimensional electron gas 21 is present uniformly without interruption between the source and the drain, a so-called normally-on type arrangement is realized in which a current flows between the source and the drain due to the potential difference between the source and the drain even when a voltage is not applied to the gate electrode 16.

Thus, with the present preferred embodiment, the gate layer 15, constituted of GaN, which has a smaller bandgap than the electron supply layer 14 (AlGaN), and effectively not containing an acceptor type impurity, is interposed between the electron supply layer 14 and the gate electrode 16 to realize a normally-off type device.

The mechanism by which a normally-off arrangement is realized in the present invention is as follows. That is, in principle, the positive polarization charges 20 are canceled out by a spontaneous polarization $P_{sp(GaN-Gate)}$, occurring inside the gate layer 15 and consequently, the two-dimensional electron gas 21 disappears selectively from a gate region Ga in which the gate electrode 16 is disposed. That is, it suffices to provide an arrangement where the spontaneous polarization $(-P_{sp(GaN-Gate)})$ of the gate layer 15 is added to the formula (2) above and the magnitude P of the polarization charges 20 is as indicated by the following formula (3).

$$P = P_{sp(AlGaN)} + P_{pz(AlGaN)} - P_{sp(GaN)} - P_{sp(GaN-Gate)} = 0 \quad (3)$$

On the other hand, the magnitude of the polarization charges 20 is dependent on the Al composition of the electron supply layer 14 (AlGaN) as shown in FIG. 4.

In the present preferred embodiment, it is necessary to set the conditions of the gate layer 15 and the electron transit layer 13 in accordance with the physical properties of the electron supply layer 14 to reliably suppress the polarization charges 20 in the gate region Ga.

Specifically, the conditions are set so that in FIG. 5, (P2)+(P3)−(P1)>0 is satisfied for increments/decrements (P1), (P2), and (P3) of the potential of a conduction band $E_C$ between the gate electrode 16 and a potential well 23, formed at the junction interface (GaN/AlGaN interface) of the electron transit layer 13 and the electron supply layer 14. This is because it will thereby become necessary to apply a positive voltage to the gate electrode 16 to lower the potential of the conduction band E: of the potential well 23 to a position lower than the Fermi level (at the position of 0.0 eV in FIG. 5) and make the drain current flow.

FIG. 5 shows the energy band when a threshold voltage Vth of 1.0 V is applied to the gate electrode 16 and by setting the gate voltage=1.0 V (gate on), the potential of the conduction band $E_C$ of the potential well 23 becomes equivalent to the Fermi level so that electrons fall into the potential well 23 (the two-dimensional electron gas 21 begins to be generated in the gate region Ga) and the drain current begins to flow. That is, in a state where a voltage is not applied to the gate electrode 16 (gate off), the potential of the conduction band $E_C$ of the potential well 23' is at the position higher than the Fermi level as indicated by the alternate long and short dashed line in FIG. 5 and is in a state where the drain current does not flow. In FIG. 5, the ordinate indicates the potential with respect to electrons.

Also, when expressed as an electric field intensity distribution, the conditions of FIG. 5 will be as shown in FIG. 6. The black solid line indicates the electric field intensities at the respective layers when the threshold voltage Vth of 1.0 V is applied to the gate electrode 16. Here, an electric field intensity integration value A (hatched portion in FIG. 6) of the AlGaN electron supply layer 14 and an electric field intensity integration value B (cross-hatched portion in FIG. 6) of the GaN gate layer 14 satisfy B>A to realize a normally-off arrangement. The internal electric field of the electron supply layer 14 is thereby canceled out by the internal electric field of the gate layer 15 and therefore the generation of the two-dimensional electron gas 21 is suppressed.

Referring again to FIG. 5, (P2)+(P3)−(P1)>0 is expressed, using specific values, by the following formula (1):

$$d_g \sqrt{\frac{2E_F q(N_{DA} + N_A - N_{DD} - N_D)}{\varepsilon_0 \varepsilon_C}} + \Phi_B - \frac{d_B P}{\varepsilon_0 \varepsilon_C} > 0 \quad (1)$$

in the formula (1), the first term, the second term, and the third term from the left respectively correspond to the decrement (P2), the decrement (P3), and the increment (P1) of the potential of the conduction band $E_C$. Also, the definitions of the respective symbols in the formula (1) are as follows.

$d_G$: thickness (cm) of the gate layer 15
$d_B$: thickness (cm) of the electron supply layer 14
P: polarization (C/cm$^2$) of the electron supply layer 14
q: elementary charge (C)
$\Phi_B$: work function (eV) of the gate electrode 16-electron affinity (3.6 eV) of GaN
$N_{DA} + N_A - N_{DD} - N_D$: effective acceptor concentration of the electron transit layer 13
$\varepsilon_C$: relative permittivity of the electron transit layer 13
$\varepsilon_B$: relative permittivity of the electron supply layer 14
$\varepsilon_0$: permittivity of vacuum
$E_F$: energy difference (eV) between the Fermi level and a lower end of conduction band ($E_C$) of the electron transit layer 13

$(N_{DA} + N_A - N_{DD} - N_D)$ of $d_G \sqrt{N_{DA} + N_A - N_{DD} - N_D}$, which, in the formula (1), is a portion of the decrement (P2) of the potential of the conduction band $E_C$, may be determined as follows.

First, in regard to the energy band structure of the electron transit layer 13, a shallow donor level $E_D$, a deep donor level $E_{DD}$, a shallow acceptor level $E_A$, and a deep acceptor level $E_{DA}$ are formed.

The shallow donor level $E_D$ is, for example, an energy level at a position separated by not more than 0.025 eV from the lower end (bottom) energy level $E_C$ of the conduction band of the electron transit layer 13 and may be referred to simply as the "donor level $E_D$" as long as distinction can be made with respect to the deep donor level $E_{DG}$. Ordinarily, the donor electrons doped at this position are excited to the conduction band and are free electrons even at room temperature (thermal energy kT=approximately 0.025 eV). As an impurity forming the shallow donor level $E_D$, for example, at least one type selected from the group consisting of Si and O can be cited. These may be incorporated into the film during epitaxial growth of the electron transit layer 13 or may be doped intentionally. For example, oxygen (O) may be incorporated from a raw material gas or a carrier gas.

On the other hand, the deep donor level $E_{DO}$ is, for example, an energy level at a position separated by not less than 0.025 eV from the lower end (bottom) energy level $E_C$ of the conduction band of the electron transit layer 13. That is, the deep donor level $E_{DO}$ is formed by doping of a donor, with which an ionization energy necessary for excitation is greater than the thermal energy at room temperature. Therefore, ordinarily, the donor electrons doped at this position are not excited to the conduction band and are in a state of being captured by the donor at room temperature. The deep donor level $E_{DD}$ may, for example, be that due to a crystal defect occurring spontaneously in GaN during epitaxial growth of the electron transit layer 13.

The shallow acceptor level $E_A$ is, for example, an energy level at a position separated by not more than 0.025 eV from an upper end (top) energy level $E_V$ of valence electrons of the electron transit layer 13 and may be referred to simply as the "acceptor level $E_A$" as long as distinction can be made with respect to the deep acceptor level $E_{DA}$. Ordinarily, the acceptor holes doped at this position are excited to a valence band and are free holes even at room temperature (thermal energy kT=approximately 0.025 eV).

On the other hand, the deep acceptor level $E_{DA}$ is, for example, an energy level at a position separated by not less than 0.025 eV from the upper end (top) energy level $E_V$ of the valence electrons of the electron transit layer 13. That is, the deep acceptor level $E_{DA}$ is formed by doping of an acceptor, with which an ionization energy necessary for excitation is greater than the thermal energy at room temperature. Therefore ordinarily, the acceptor holes doped at this position are not excited to the valence band and are in a state of being captured by the acceptor at room temperature.

As an impurity doped into the electron transit layer 13, constituted of GaN, to form the deep acceptor level $E_{DA}$, for example, at least one type selected from the group consisting of C, Be, Cd, Ca, Cu, Ag, Au, Sr, Ba, Li, Na, K, Sc, Zr, Fe, Co, Ni, Mg, Ar, and He can be cited.

Among these, although C and Mg can be cited mainly, carbon (C) functions as a deep acceptor when incorporated in a nitrogen site inside GaN and functions as a shallow donor when incorporated in a Ga site, and therefore, to increase $(N_{DA}+N_A-N_{DD}-N_D)$ reliably, it is preferable to use Mg. Also, a region of the electron transit layer 13 in which the energy band is curved depends on the type (Fermi level) of impurity and $(N_{DA}+N_A-N_{DD}-N_D)$. Also, the region of the electron transit layer 13 in which Mg is contained depends on the Mg concentration. For example, in FIG. 25 (to be described below), in which the impurity is Mg and $(N_{DA}+N_A-N_{DD}-N_D)$ is $1\times10^{17}$ cm$^{-3}$, the region of the GaN electron transit layer 13 in which the energy band is curved is approximately 150 nm from the AlGaN electron supply layer 14/GaN electron transit layer 13 interface. On the other hand, in FIG. 23 (to be described below), in which the impurity is Mg and $(N_{DA}+N_A-N_{DD}-N_D)$ is $4\times10^{16}$ cm$^{-3}$, the region in which the energy band is curved is approximately 250 nm from the AlGaN electron supply layer 14/GaN electron transit layer 13 interface. That is, this is because the region within the abovementioned upper limit from the AlGaN electron supply layer 14/GaN electron transit layer 13 interface contributes to the threshold voltage and the concentrations and types of impurities in this region are important.

However, C may also be used as the deep acceptor. When C is used for the deep acceptor level, it is known to form, for example, a level of 0.9 eV from the upper end (top) energy level $E_V$ of the valence band of the electron transit layer 13. On the other hand, when Mg is used, it is known to form a level of 0.1 to 0.2 eV from $E_V$. Although this is a position separated by not less than 0.025 eV from the upper end (top) energy level $E_V$ of the valence band of the electron transit layer 13 as mentioned above and Mg can thus be said to be a deep acceptor, when the Fermi level is fixed at this level of Mg, a probability of presence of a hole at $E_V$ at room temperature will be 0.003 to 0.02. In other words, this means that at room temperature, a hole is generated at $E_V$ at a proportion of one in 100 to 1000. If a hole that can move freely is thereby made present inside the electron transit layer 13, a problem occurs in that a p-n junction is formed and thus a parasitic capacitance is formed in the electron transit layer 13. Further, the leak current is increased by the formed hole acting as a carrier. By the above, an impurity, with which the deep acceptor level will be at a position separated from $E_V$ by more than 0.2 eV and, for example, not less than 0.3 eV, is preferable, and C satisfies this condition.

When C is used as the deep acceptor, E: in (1) above is such that $E_F$=2.5 eV because the bandgap of GaN is 3.6 eV, and when Mg is used, $E_F$=3.2 eV.

Concentrations of the impurities (dopants) forming the shallow donor level $E_D$, the deep donor level $E_{DD}$, the shallow acceptor level $E_A$, and the deep acceptor level $E_{DA}$ described above shall be referred to respectively as a shallow donor concentration $N_D$, a deep donor concentration $N_{DD}$, a shallow acceptor concentration $N_A$, and a deep acceptor concentration $N_{DA}$. For example, if as the impurity forming the deep acceptor level $E_{DA}$, only C (carbon) is doped in the electron transit layer 13 at a concentration of $0.5\times10^{16}$ cm$^{-3}$, this carbon concentration is defined as the deep acceptor concentration $N_{DA}$. The concentrations $N_D$, $N_{DD}$, $N_A$, and $N_{DA}$ may be measured, for example, by SIMS (Secondary Ion Mass Spectrometry).

Amore specific measurement method can be described with reference to FIG. 10A to FIG. 10C. First, as shown in FIG. 10A, when a voltage is not applied across both electrodes (unbiased state), the acceptors and the deep acceptors capture electrons emitted by the donors and the deep donors. In this state, positive charges, due to the donors and the deep donors that emitted the electrons, and negative charges, due to the acceptors and the deep acceptors that captured the electrons, are equal in number and therefore the GaN layer is electrically neutral as a whole.

Next, as a voltage is applied as shown in FIG. 10B, the positively biased side becomes negatively charged due to the deep acceptors capturing electrons from the valence band ($E_V$). An electric flux generated by the voltage application is canceled out by the negatively charged region and therefore electron implantation into the conduction band $E_C$ of the electron transit layer does not occur and the current that flows is extremely minute.

Then, when a voltage Vth of not less than a certain level is applied as shown in FIG. 10C, electron capture by the deep acceptors occurs in all regions. Electron capture does not occur even when a higher voltage is applied and because the electric flux cannot be canceled out completely, electrons become implanted into the conduction band $E_C$ from the source electrode and a current begins to flow. The formula that includes the voltage Vth in this state is derived from the Poisson formula as $N_{DA}+N_A-N_{DD}-N_D)=2$ $Vth\varepsilon_0\varepsilon_C/qW^2$ (where W is the thickness of the GaN electron transit layer) and consequently, $Vth=q(N_{DA}+N_A-N_{DD}-N_D)\cdot W^2/2\varepsilon_0\varepsilon_C$; is obtained. That is, $(N_{DA}+N_A-N_{DD}-N_D)$ can be determined based on this formula.

Preferable ranges of $d_G$ and $(N_{DA}+N_A-N_{DD}-N_D)$ that constitute $d_G\sqrt{N_{DA}+N_A-N_{DD}-N_D}$ are, for example, as indicated below. The preferable ranges indicated below differ according to the respective thicknesses $d_B$ and Al compositions of the electron supply layer 14 and may therefore be set as suited in accordance with the respective thicknesses da and Al compositions of the electron supply layer 14.

First, the thickness $d_G$ of the gate layer 15 is preferably, for example, 50 nm to 200 nm. On the other hand, $(N_{DA}+$ $N_A-N_{DD}-N_D$) of the electron transit layer 13 is, for example, $1\times10^{19}$ cm$^{-3}$ to $5\times10^{17}$ cm$^{-3}$ and preferably, the Mg concentration is not less than $1\times10^{16}$ cm$^{-3}$ and more preferably, the Mg concentration is not more than $1\times10^{16}$ cm$^{-3}$.

Also, a preferable range of $\Phi_B$ (work function (eV) of the gate electrode 16-electron affinity (3.6 eV) of GaN) in the formula (1) above is 0.7 eV to 1.4 eV, This range may be realized using, for example, Ni ($\Phi_M$=4.8 eV), Pt ($\Phi_M$=5.0 eV), Mo ($\Phi_M$=4.3 eV), W ($\Phi_M$=4.6 eV), or TiN ($\Phi_M$=4.6 eV) as the gate electrode 16. On the other hand, although Al (0=4.0 eV) may also be used as the gate electrode 16, Al is low in work function compared to Mo, etc., mentioned above and reacts readily with a semiconductor or an insulating film and it is therefore preferable to use Mo or TiN which are rather high in work function.

Also, to satisfy the formula (1) above, it is preferable for $d_B P/\varepsilon_0\varepsilon_B$, corresponding to the increment (P1) of the potential of the conduction band $E_C$, to be made as small as possible. Making $d_B$ and P, which are variables of $d_B P/\varepsilon_0\varepsilon_B$, small is thus considered.

First, in regard to the thickness $d_B$ of the electron supply layer 14, reference to FIG. 7 shows that regardless of the Al composition (x=0.1 to 0.9) of AlGaN, the sheet carrier density of the two-dimensional electron gas 21 converges to a maximum value at approximately $d_B$=10 nm even when the thickness $d_B$ is increased. Therefore, as far as the sheet carrier density is concerned, it suffices for the thickness $d_B$ to be 10 nm at the most. Oppositely, as shown in FIG. 8, $d_B P/\varepsilon_0\varepsilon_B$, which is the increment (P1) of the potential of the conduction band $E_C$, increases proportionally with an increase in the thickness $d_B$ of the electron supply layer 14 and therefore if making $d_B P/\varepsilon_0\varepsilon_B$ small is considered with priority, it is preferable for the thickness $d_B$ to be as small as possible. It is thus preferable for the thickness $d_B$ of the electron supply layer 14 to be as small as possible within a range of not more than 10 nm.

On the other hand, as shown in FIG. 7, if the thickness $d_B$ of the electron supply layer 14 is made small, the sheet carrier density decreases. The decrease is especially significant in a region of $d_B$<5 nm. The sheet carrier density is preferably, for example, not less than $6.0\times10^{12}$ cm$^{-2}$ because if it is too low, channel mobility decreases. The Al composition of the electron supply layer 14 should thus be set in a range of not more than 10 nm along the abscissa and not less than $6.0\times10^{12}$ cm$^{-2}$ along the ordinate in FIG. 7.

However, as shown in FIG. 4, the Al composition is in a proportional relationship with the variable P in $d_B P/\varepsilon_0\varepsilon_B$, which corresponds to the increment (P1) of the potential of the conduction band $E_C$ and, depending on the case, influences the gate threshold voltage. Relationships of the Al composition of the electron supply layer 14 and the gate threshold voltage were thus examined.

Figure 18:
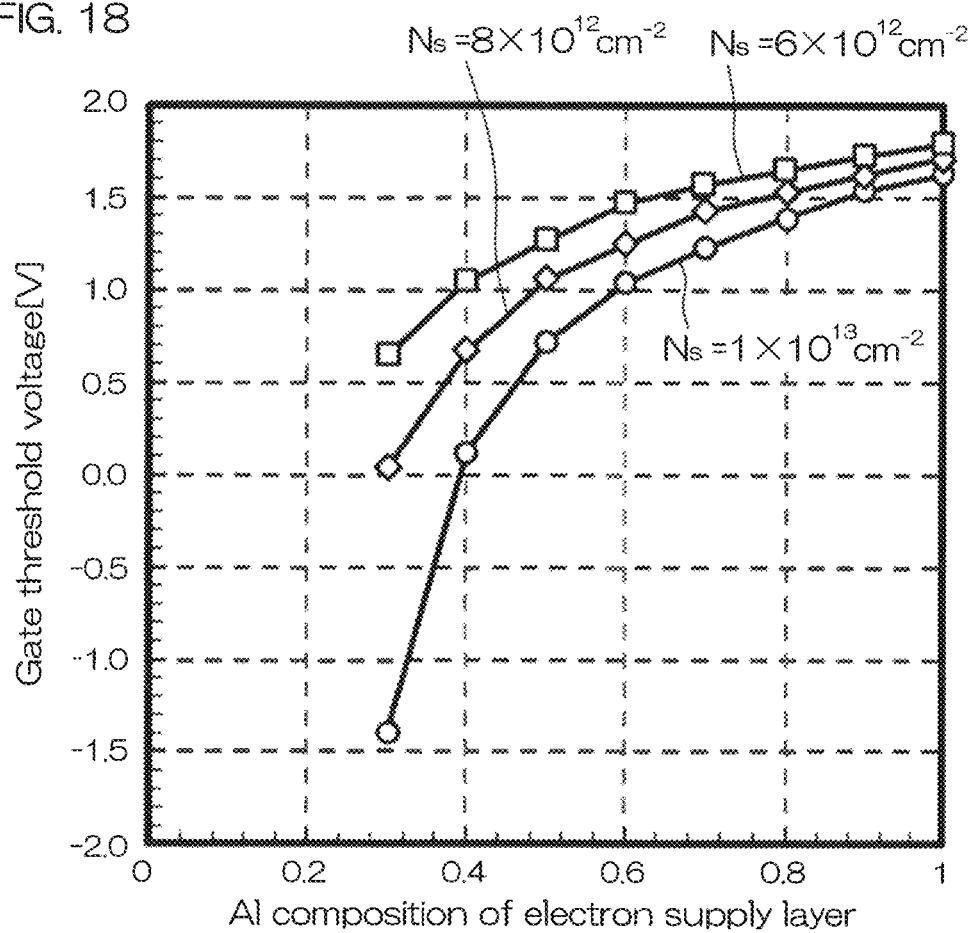
FIG. 18 is a diagram showing relationships of the Al composition of the electron supply layer and gate threshold voltage according to sheet carrier density.
Figure 19:
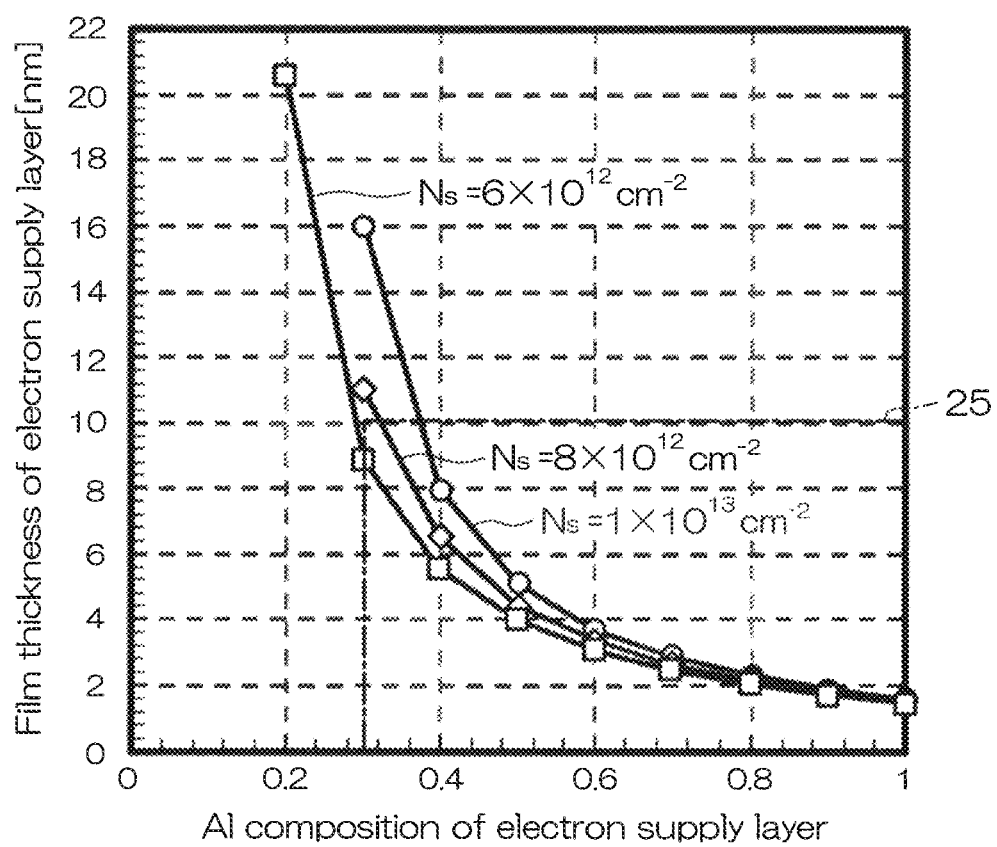
FIG. 19 is a diagram showing relationships of the Al composition of the electron supply layer and film thickness of the electron supply layer according to sheet carrier density.

FIG. 18 is a diagram showing relationships of the Al composition of the electron supply layer 14 and the gate threshold voltage according to sheet carrier density. FIG. 19 is a diagram showing relationships of the Al composition of the electron supply layer 14 and the film thickness of the electron supply layer 14 according to sheet carrier density. In FIG. 18 and FIG. 19, calculations were made with the deep acceptor concentration of the gate layer 15 being set to $2\times10^{17}$ cm$^{-3}$ and the deep acceptor concentration of the electron transit layer 13 being set to $4\times10^{16}$ cm$^{-3}$.

FIG. 18 shows that, although depending on the sheet carrier density $N_S$, it is preferable for the Al composition of the electron supply layer 14 to be not less than 0.3 to realize a normally-off type arrangement. That is, in the electron supply layer 14, constituted of $Al_xGa_{1-x}N$ (x≤1), the Al composition is preferably such that x≥0.3 and more preferably such that x=1. It can also be understood from FIG. 18 that for the same sheet carrier density, the higher the Al composition of the electron supply layer 14, the higher the gate threshold voltage.

To set a preferable combination of the Al composition and the thickness $d_B$ for the electron supply layer 14, for example, the Al composition and the sheet carrier density $N_S$ of the electron supply layer 14 at which the gate threshold voltage exceeds 0 V are determined from the graphs of FIG. 18 and the readings are applied to the graphs of the FIG. 19 to read the thickness $d_B$ (film thickness). For example, with any combination within a region 25 surrounded by alternate long and short dashed lines in FIG. 19, both a high sheet carrier density ($N_S$≥$6.0\times10^{12}$ cm$^{-2}$) and a high threshold voltage (Vth>0; x≥0.3 for the electron supply layer 14) can be realized at the same time.

On the other hand, with an AlGaN electron supply layer 14 with a high Al composition, the channel mobility may decrease due to alloy scattering. Therefore, to suppress alloy scattering and make the gate threshold voltage high, it is preferable to use an AlN electron supply layer 14. However, if the electron supply layer 14 is an AlN layer, a problem occurs in that the AlN layer itself becomes oxidized entirely when the gate layer 15 is formed, for example, by etching with $Cl_2/O_2$, (see FIG. 21C described below).

Figure 20:
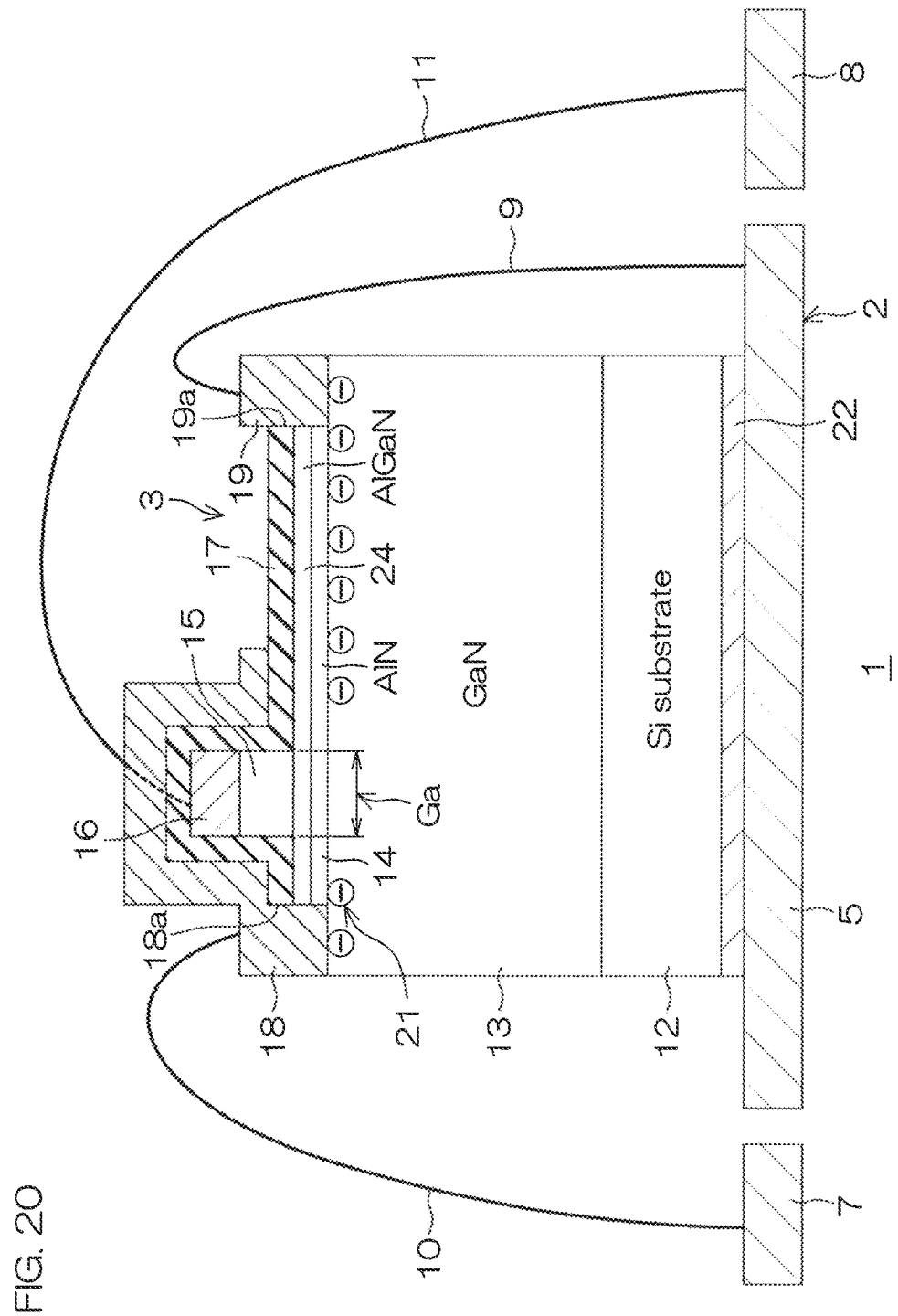
FIG. 20 is a schematic sectional view of the nitride semiconductor device.

Thus, if the electron supply layer 14 is to be made an AlN layer, it is preferable to dispose an etching stop layer 24, constituted of $Al_{x'}Ga_{1-x'}N$ (x'≤1), on the electron supply layer 14 as shown in FIG. 20. The AlN electron supply layer 14 is thereby covered by etching stop layer 24 in the process of etching the gate layer 15 and the oxidation of the AlN electron supply layer 14 can thus be suppressed.

Also, if the etching stop layer 24 is to be formed, it is preferable for the thickness of the electron supply layer 14 to be not more than 2 nm. Also, the thickness of the etching stop layer 24 is preferably not more than 10 nm. Further, the Al composition of the etching stop layer 24 is preferably such that 0.1≤x'≤0.2 and more preferably such that x'=0.1. The Al composition of the etching stop layer 24 is made not less than 0.1 to sufficiently maintain the etching stop function and meanwhile made not more than 0.2 to keep the influence on the gate threshold voltage Vth small.

The effect of suppressing the oxidation of the electron supply layer 14 such as described above is not restricted to an AlN layer and can be achieved when the etching stop layer 24, constituted of $Al_{x'}Ga_{1-x'}N$ (x'≤1), is formed on an electron supply layer 14 constituted of $Al_xGa_{1-x}N$ (x≤1) and a relationship, x<x', is further established in regard to the Al composition.

Also, with the arrangement of FIG. 20, the etching stop layer 24 and the electron supply layer 14 are further removed selectively so as to be continuous with the contact holes 18a and 19a, and the source electrode 18 and the drain electrode 19 are put in ohmic contact with the electron transit layer 13 via the contact holes 18a and 19a.

FIG. 21A to FIG. 21F are diagrams showing, in order of process, portions of a manufacturing process of the nitride semiconductor device 3 (third preferred embodiment) of FIG. 20.

Figure 21A:
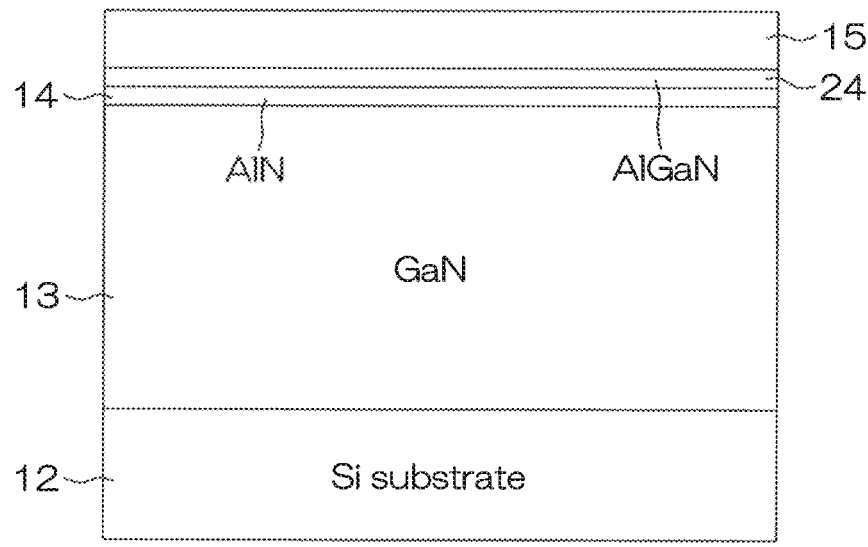
FIG. 21A is a diagram of a portion of a manufacturing process of the nitride semiconductor device of FIG. 20.

To manufacture the nitride semiconductor device 3 of FIG. 20, for example, as shown in FIG. 21A, the electron transit layer 13, the electron supply layer 14, the etching stop layer 24, and the gate layer 15 are formed on the substrate 12, for example, by an epitaxial growth method.

Figure 21B:
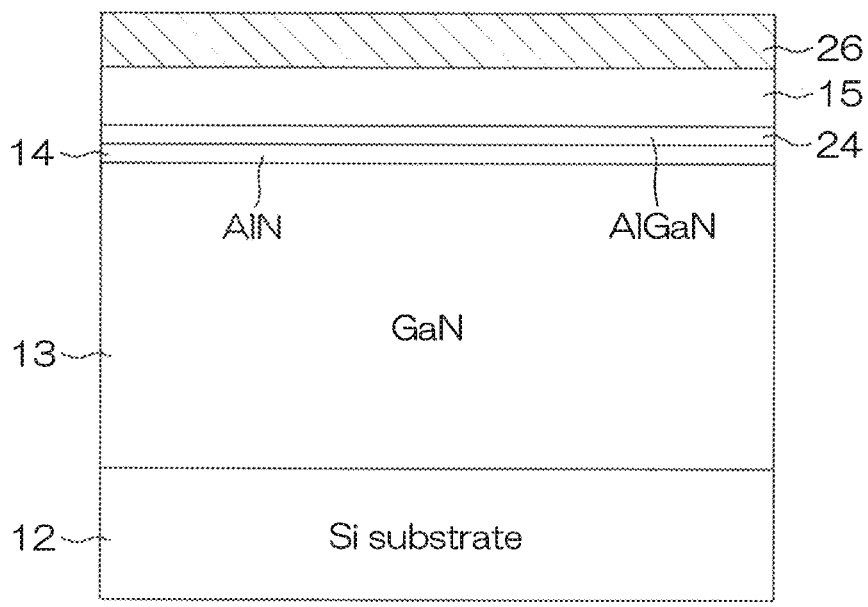
FIG. 21B is a diagram of a process subsequent that of FIG. 21A.

Next, as shown in FIG. 21B, an electrode material 26 of the gate electrode 16 is formed on the gate layer 15.

Figure 21C:
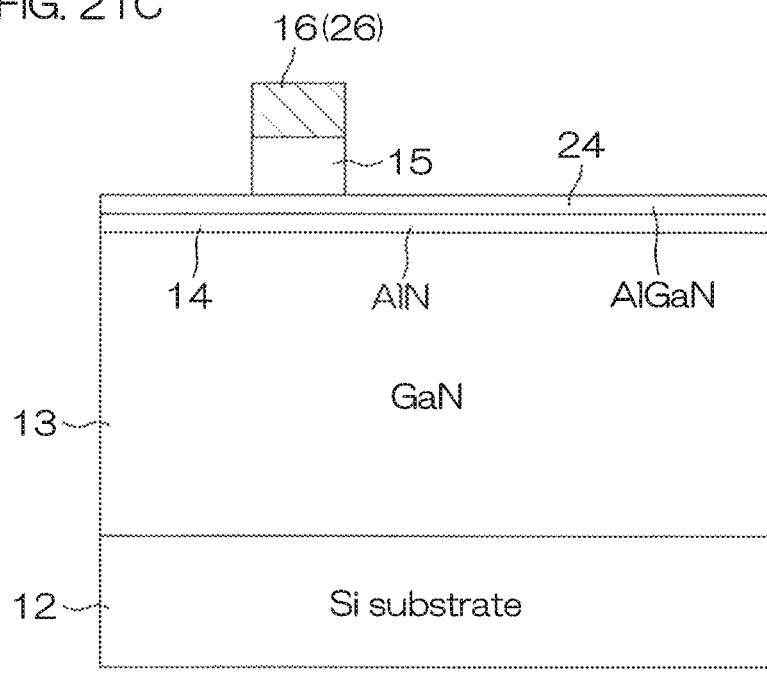
FIG. 21C is a diagram of a process subsequent that of FIG. 21B.

Next, as shown in FIG. 21C, the electrode material 26 is etched selectively to form the gate electrode 16. Subsequently, the gate layer 15 is etched selectively using, for example, a $Cl_2/O_2$ plasma. The etching stops at the AlGaN etching stop layer 24.

Figure 21D:
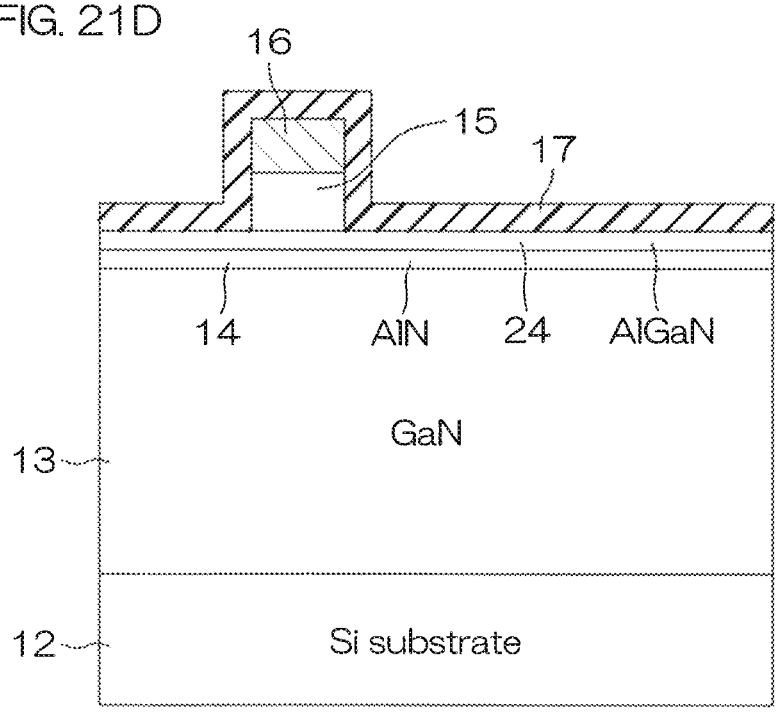
FIG. 21D is a diagram of a process subsequent that of FIG. 21C.

Next, as shown in FIG. 21D, the surface insulating film 17, constituted, for example, of SiN, is formed so as to cover the etching stop layer 24, the gate layer 15, and the gate electrode 16.

Next, as shown in FIG. 21E, the surface insulating film 17, the etching stop layer 24, and the electron supply layer 14 are continuously etched selectively to form the contact holes 18a and 19a. In this process, contact resistances of the source electrode 18 and the drain electrode 19 can be reduced by etching the electron supply layer 14 as well to expose the electron transit layer 13.

Next, as shown in FIG. 21F, the source electrode 18 and the drain electrode 19 are formed. By thereafter forming the rear surface electrode 22, etc., the nitride semiconductor device 3 is obtained.

FIG. 22 to FIG. 26 are diagrams of GaN Fermi level dependence of the gate threshold voltage.

Figure 22:
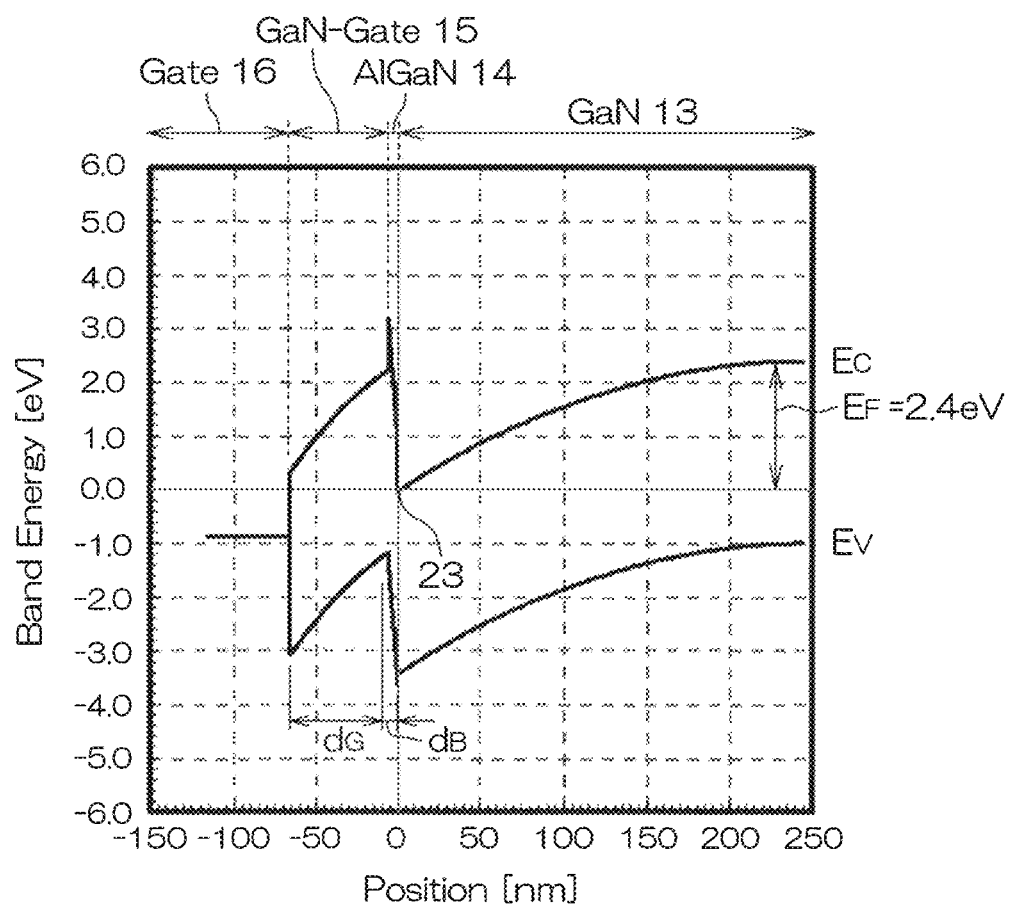
FIG. 22 is a diagram of GaN Fermi level dependence of the gate threshold voltage.

More specifically, FIG. 22 is an energy band diagram of a turn-on state when the electron supply layer 14 has an Al composition of 40% and a thickness $d_B$ of 6 nm, the thickness $d_G$ of the gate layer 15 is 60 nm, $\Phi_B$=1.2 eV (material of the gate electrode 16: TiN), and $N_{DA}+N_A-N_{DD}-N_D$ of the electron transit layer 13 (with the deep acceptor being C) is $4\times10^{16}$ cm$^{-3}$.

Figure 23:
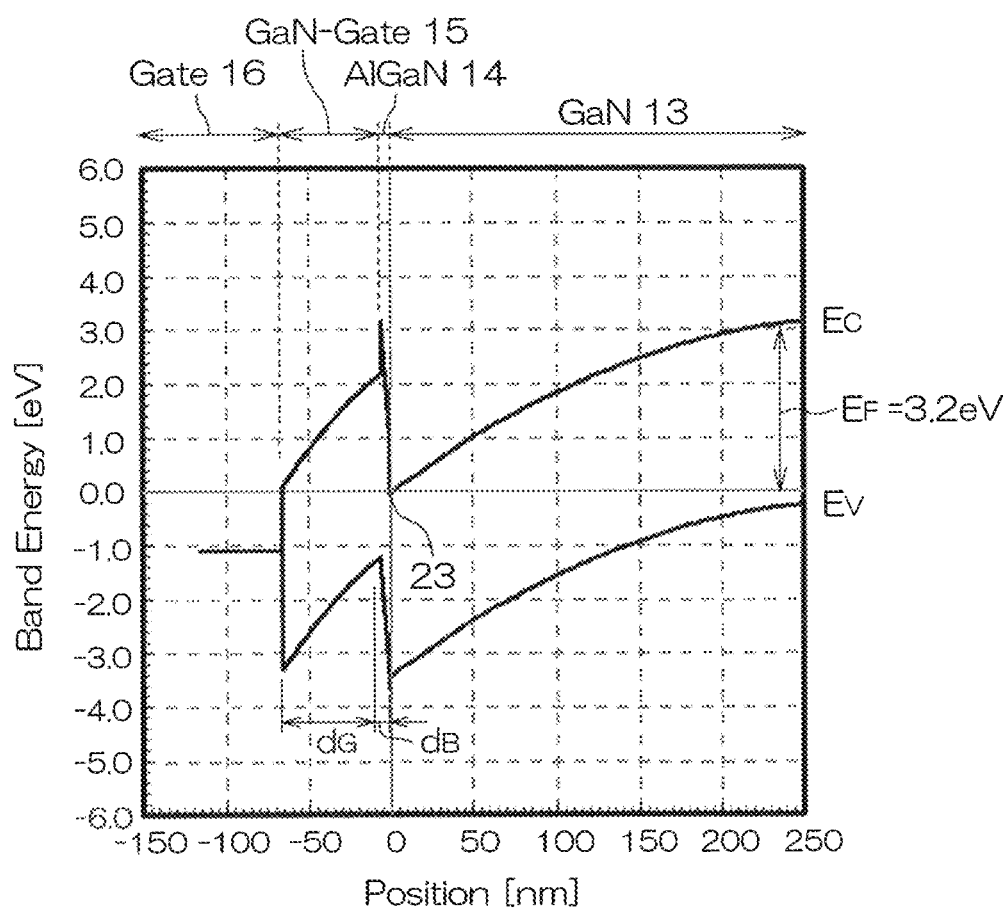
FIG. 23 is a diagram of the GaN Fermi level dependence of the gate threshold voltage.

FIG. 23 is an energy band diagram of a turn-on state when the electron supply layer 14 has an Al composition of 40% and a thickness $d_B$ of 6 nm, the thickness $d_G$ of the gate layer 15 is 60 nm, $\Phi_B$=1.2 eV (material of the gate electrode 16: TiN), and $N_{DA}+N_A-N_{DD}-N_D$ of the electron transit layer 13 (with the deep acceptor being Mg) is $4\times10^{16}$ cm$^{-3}$.

Figure 24:
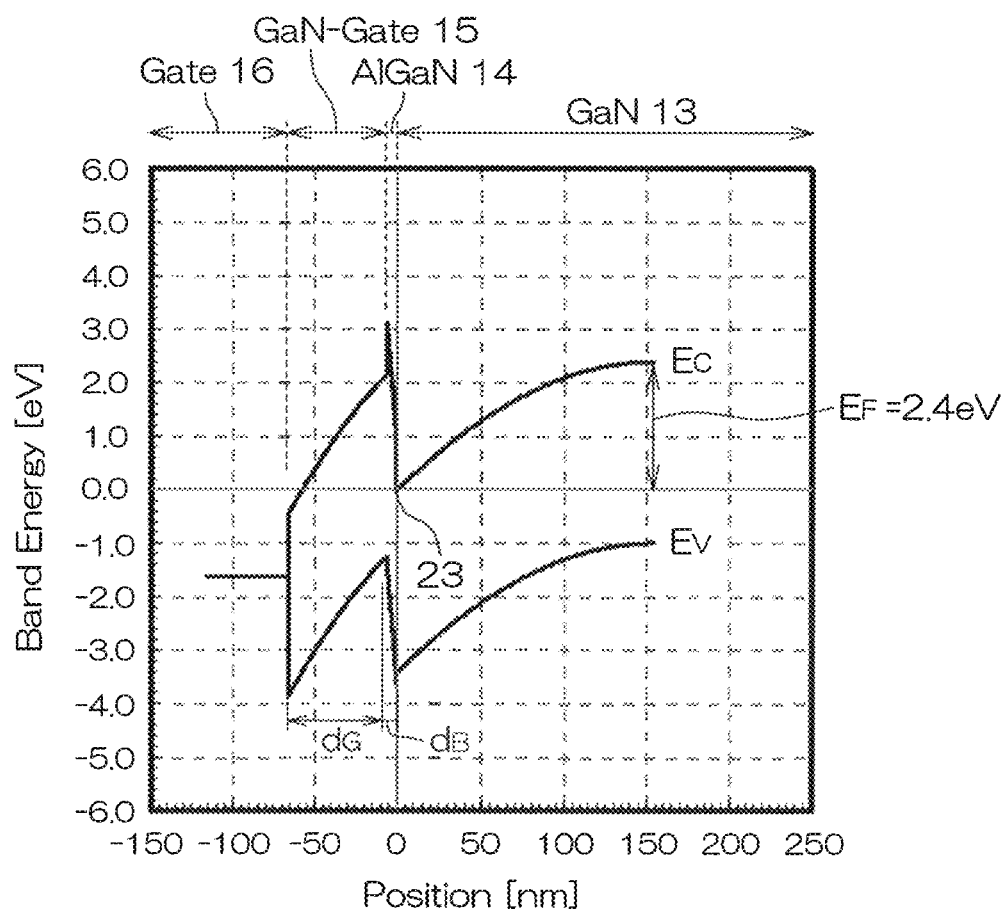
FIG. 24 is a diagram of the GaN Fermi level dependence of the gate threshold voltage.

FIG. 24 is an energy band diagram of a turn-on state under conditions that are the same as those of FIG. 22 with the exception that $N_{DA}+N_A-N_{DD}-N_D$ of the electron transit layer 13 is $1\times10^{17}$ cm$^{-3}$.

Figure 25:
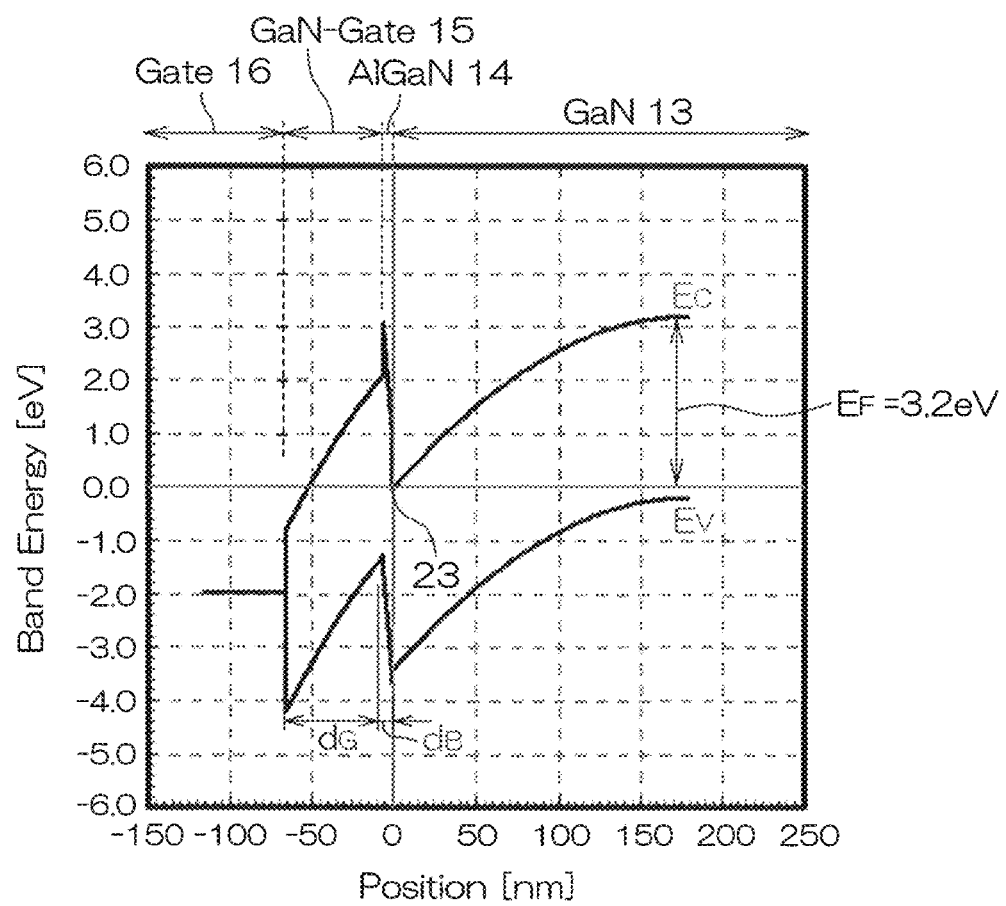
FIG. 25 is a diagram of the GaN Fermi level dependence of the gate threshold voltage.

FIG. 25 is an energy band diagram of a turn-on state under conditions that are the same as those of FIG. 23 with the exception that $N_{DA}+N_A-N_{DD}-N_D$; of the electron transit layer 13 is $1\times10^{17}$ cm$^{-3}$.

From a comparison of FIG. 22 and FIG. 23 and a comparison of FIG. 24 and FIG. 25, it can be understood that the higher the energy difference $E_F$ between the Fermi level and the lower end of the conduction band ($E_C$) of the electron transit layer 13, the higher the gate threshold voltage.

Also, from a comparison of FIG. 22 and FIG. 24 and a comparison of FIG. 23 and FIG. 25, it can be understood that when using the same deep acceptor, the higher the $N_{DA}+N_A-N_{DD}-N_D$ of the electron transit layer 13, the higher the gate threshold voltage.

Figure 26:
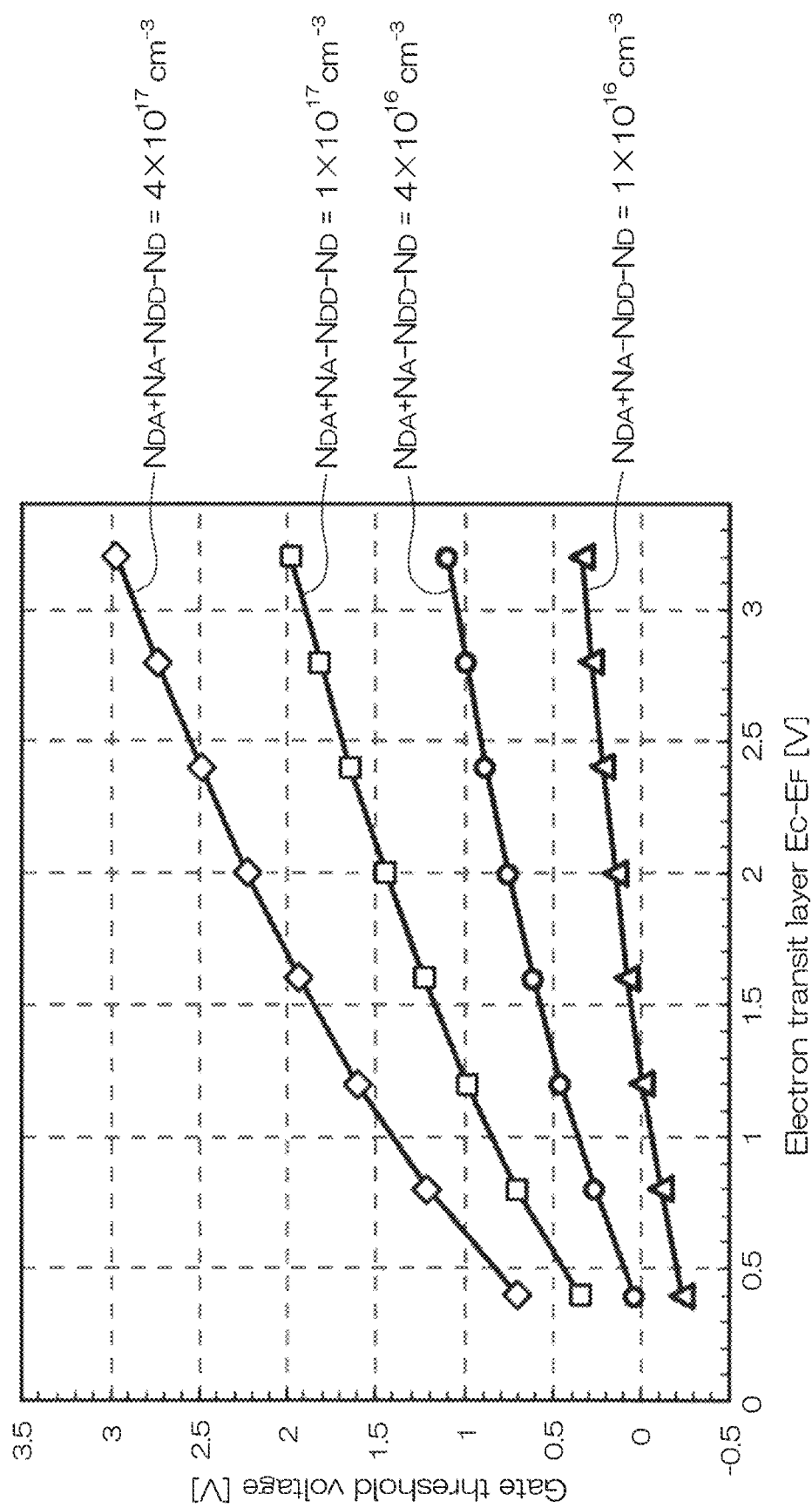
FIG. 26 is a diagram showing the GaN Fermi level dependence of the gate threshold voltage according to acceptor concentration of an electron transit layer.

And, judging comprehensively from FIG. 26, it can be understood that it is preferable for the deep acceptor contained in the electron transit layer 13 to be Mg ($E_F$=3.2 eV) because the gate threshold voltage can then be made comparatively high, and that $N_{DA}+N_A-N_{DD}-N_D$ in this case is preferably not less than $1\times10^{16}$ cm$^{-3}$ and not more than $1\times10^{18}$ cm$^{-3}$.

Although the second and third preferred embodiments of the first invention have been described above, the first invention may be implemented in other modes.

For example, although with each of the second and third preferred embodiments described above, an example where the electron transit layer 13 is constituted of GaN and the electron supply layer 14 is constituted of AlGaN or AlN was described, it suffices that the electron transit layer 13 and the electron supply layer 14 differ in Al composition and other combinations are also possible. The electron supply layer/electron transit layer combination may be any of AlGaN layer/GaN layer, AlGaN layer/AlGaN layer (with the layers differing in Al composition), AlInN layer/AlGaN layer, AlInN layer/GaN layer, AlN layer/GaN layer, and AlN layer/AlGaN layer. To generalize further, the electron supply layer contains Al and N in its composition. The electron transit layer contains Ga and N in its composition and differs in Al composition from the electron supply layer. By the electron supply layer and the electron transit layer differing in Al composition, a lattice mismatch arises between the two and carriers due to polarization are thereby made to contribute to the forming of a two-dimensional electron gas.

Also, although with each of the second and third preferred embodiments described above, the case where the electron supply layer 14 is $Al_xGa_{1-x}N$ (x≤1) was mainly described, in a case where the electron supply layer 14 contains In, that is, with $Al_xIn_yGa_{1-x-y}N$, x and y may be such that x≥0.3, 0.02≥y≥0, and 1≥x+y.

Also, although with each of the second and third preferred embodiments described above, silicon was taken up as an example of the material of the substrate 12, besides this, any substrate material, such as a sapphire substrate, a GaN substrate, etc., may be applied.

[2] The Second Invention

The second invention relates to a nitride semiconductor device constituted of a group III nitride semiconductor (may hereinafter be referred to simply as "nitride semiconductor" in some cases).

A group III nitride semiconductor is a semiconductor with which nitrogen is used as a group V element in a group III-V semiconductor. Representative examples are aluminum nitride (AlN), gallium nitride (GaN), and indium nitride (InN). The semiconductor can be expressed generally as $Al_xIn_yGa_{1-x-y}N$ (0≤x≤1, 0≤y≤1, 0≤x+y≤1).

An HEMT (High Electron Mobility Transistor) using such a nitride semiconductor has been proposed. Such an HEMT includes, for example, an electron transit layer, constituted of GaN, and an electron supply layer, constituted of AlGaN that is grown epitaxially on the electron transit layer. A pair of source electrode and drain electrode are formed to be in contact with the electron supply layer and a gate electrode is disposed therebetween. Due to polarization caused by lattice mismatch of GaN and AlGaN, a two-dimensional electron gas is formed inside the electron transit layer at a position located only a few Å inward from an interface of the electron transit layer and the electron supply layer. The source and the drain are connected to each other with the two-dimensional electron gas as a channel. When the two-dimensional electron gas is cut off by application of a control voltage to the gate electrode, the source and the drain are cut off from each other. The source and the drain are continuous to each other in a state where the control voltage is not applied to the gate electrode and therefore the device is of the normally-on type.

Devices using a nitride semiconductor have features of high withstand voltage, high temperature operation, high current density, high speed switching, and low on resistance and are thus being examined for application to power devices.

However, for use as a power device, a device must be of the normally-off type, in which current is cut off in a zero bias state, and therefore an HEMT such as described above cannot be applied to a power device.

A structure for realizing a nitride semiconductor HEMT of the normally-off type has been proposed, for example, in Japanese Patent Application Publication No. 2006-339561. Japanese Patent Application Publication No. 2006-339561 discloses an arrangement where a p type GaN gate layer (nitride semiconductor gate layer) is laminated on an AlGaN electron supply layer, a gate electrode is disposed thereon, and the channel is eliminated by a depletion layer spreading from the p type GaN gate layer to realize a normally-off arrangement. In Japanese Patent Application Publication No. 2006-339561, a gate electrode, constituted of Pd (palladium) in ohmic junction with the p type GaN gate layer, is used as the gate electrode.

Use of a gate electrode, constituted of TiN (titanium nitride) or other metal in Schottky junction with the p type GaN gate layer, as the gate electrode may be considered. A nitride semiconductor device of such an arrangement may be referred to in some cases as a compared device. With the compared device, there is a problem in that due to the nitride semiconductor gate layer and the gate electrode being in Schottky junction, a gate leak current becomes large and the nitride semiconductor gate layer degrades readily.

An object of the second invention is to provide a nitride semiconductor device with which the gate leak current can be reduced in comparison to the compared device.

The second invention has the following features.

A1. A nitride semiconductor device including a first nitride semiconductor layer, constituting an electron transit layer, a second nitride semiconductor layer, formed on the first nitride semiconductor layer, being larger in bandgap than the first nitride semiconductor layer, and constituting an electron supply layer, and a gate portion, disposed on the second nitride semiconductor layer, and where the gate portion includes a nitride semiconductor gate layer, disposed on the second nitride semiconductor layer and containing an acceptor type impurity, a gate insulating film, formed on the nitride semiconductor gate layer, and a gate electrode, formed on the gate insulating film.

With the present arrangement, the gate insulating film is interposed between the nitride semiconductor gate layer and the gate electrode, and the gate leak current can thus be reduced in comparison to the compared device.

A2. The nitride semiconductor device according to "A1.," where the gate insulating film is constituted of one material selected from SiN, $SiO_2$, SiON, $Al_2O_3$, AlN, AlON, HfO, HfN, HfON, HfSiON, and AlON.

A3. The nitride semiconductor device according to "A1.," where the gate insulating film is constituted of in-situ SIN, formed as a film in-situ with the nitride semiconductor gate layer.

A4. The nitride semiconductor device according to any one of "A1." to "A3.," where the gate leak current is not more than 1 nA/mm.

A5. The nitride semiconductor device according to any one of "A1." to "A3.," where the nitride semiconductor gate layer has a film thickness of not more than 100 nm and the gate insulating film has a film thickness of not less than 3 nm.

A6. The nitride semiconductor device according to any one of "A1." to "A5.," further including a third nitride semiconductor layer, disposed at a side of the first nitride semiconductor layer opposite the second nitride semiconductor layer side and constituting a buffer layer.

A7. The nitride semiconductor device according to "A1.," where a carbon concentration of an interface of the nitride semiconductor gate layer and the gate insulating film is not more than $1 \times 10^{13}$ $cm^{-2}$.

A8. The nitride semiconductor device according to any one of "A1." to "A7.," where the first nitride semiconductor layer is constituted of a GaN layer, the second nitride semiconductor layer is constituted of an AlGaN layer, and the nitride semiconductor gate layer is constituted of a p type GaN layer.

A9. The nitride semiconductor device according to "A6.," where the first nitride semiconductor layer is constituted of a GaN layer, the second nitride semiconductor layer is constituted of an AlGaN layer, the nitride semiconductor gate layer is constituted of a p type GaN layer, and the third nitride semiconductor layer is constituted of an AlGaN layer.

A10. The nitride semiconductor device according to "A8." or "A9.," where the acceptor type impurity is magnesium or iron.

A preferred embodiment of the second invention shall be described in detail with reference to FIG. 27 to FIG. 35. The symbols used in FIG. 27 to FIG. 35 are in no relationship with the symbols of FIG. 1 to FIG. 26 used above in the description of the first invention.

Figure 27:
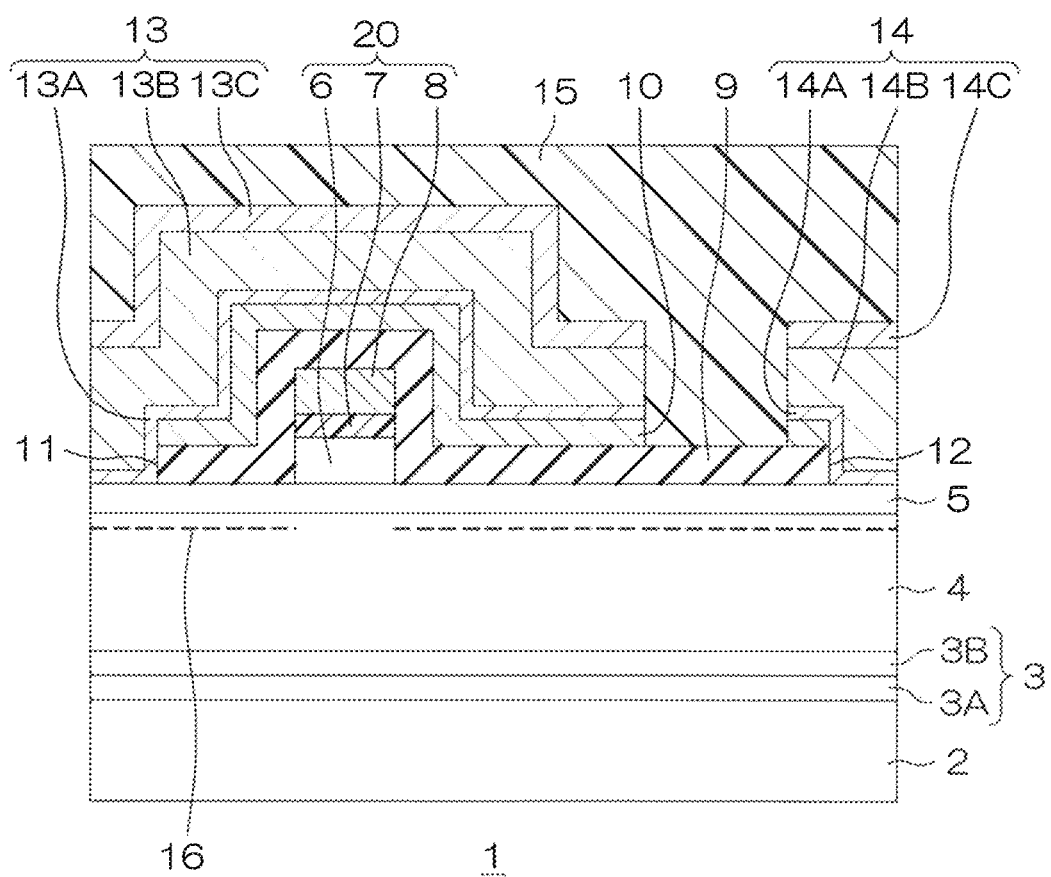
FIG. 27 is a sectional view for describing the arrangement of a nitride semiconductor device according to a preferred embodiment of a second invention.

FIG. 27 is a sectional view for describing the arrangement of a nitride semiconductor device according to the preferred embodiment of the second invention.

The nitride semiconductor device 1 includes a substrate 2, a buffer layer 3, formed on a front surface of the substrate 2, a first nitride semiconductor layer 4, grown epitaxially on the buffer layer 3, and a second nitride semiconductor layer 5, grown epitaxially on the first nitride semiconductor layer 4. Further, the nitride semiconductor device 1 includes a gate portion 20 formed on the second nitride semiconductor layer 5.

Further, the nitride semiconductor device 1 includes a passivation film 9, covering the second nitride semiconductor layer 5 and the gate portion 20, and a barrier metal film 10, laminated on the passivation film 9. Further, the nitride semiconductor device 1 includes a source electrode 13 and a drain electrode 14, which penetrate through a source electrode contact hole 11 and a drain electrode contact hole 12, formed in the laminated film of the passivation film 9 and the barrier metal film 10, and are in ohmic contact with the second nitride semiconductor layer 5. The source electrode 13 and drain electrode 14 are disposed across an interval. The source electrode 13 is formed so as to cover the gate portion 20. Further, the nitride semiconductor device 1 includes an interlayer insulating film 15, covering the source electrode 13 and the drain electrode 14.

The substrate 2 may, for example, be a low-resistance silicon substrate. The low-resistance silicon substrate may have an impurity concentration, for example, of $1 \times 10^{17}$ $cm^{-3}$ to $1 \times 10^{20}$ $cm^{-3}$ (more specifically, approximately $1 \times 10^{18}$ $cm^{-3}$). Also, besides a low-resistance silicon substrate, the substrate 2 may be a low-resistance GaN substrate or a low-resistance SiC substrate, etc. The substrate 2 has a thickness of approximately 650 μm.

In the present preferred embodiment, the buffer layer 3 is constituted from a multilayer buffer layer in which a plurality of nitride semiconductor films are laminated. In the present preferred embodiment, the buffer layer 3 is constituted from a first buffer layer 3A, constituted of an AlN film in contact with the front surface of the substrate 2, and a second buffer layer 3B, constituted of an AlGaN film laminated on a front surface of the first buffer layer 3A (the front surface at the side opposite the substrate 2 side). The first buffer layer 3A has a film thickness of approximately 100 nm to 300 nm. The second buffer layer 3B has a film thickness of approximately 100 nm to 5 µm.

The first nitride semiconductor layer 4 constitutes an electron transit layer. In the present preferred embodiment, the first nitride semiconductor layer 4 is constituted of a GaN layer doped with an acceptor type impurity and has a thickness of approximately 100 nm to 5 µm. The concentration of the acceptor type impurity is preferably not less than $4 \times 10^{16}$ cm$^{-3}$. In the present preferred embodiment, the acceptor type impurity is C (carbon).

The second nitride semiconductor layer 5 constitutes an electron supply layer. The second nitride semiconductor layer 5 is constituted of a nitride semiconductor with a larger bandgap than the first nitride semiconductor layer 4. Specifically, the second nitride semiconductor layer 5 is constituted of a nitride semiconductor with a higher Al composition than the first nitride semiconductor layer 4. In a nitride semiconductor, the higher the Al composition, the larger the bandgap. In the present preferred embodiment, the second nitride semiconductor layer 5 is constituted of an $Al_{x1}Ga_{1-x1}N$ layer (0<x1<1) and has a thickness of approximately 10 nm to 30 nm.

The first nitride semiconductor layer 4 (electron transit layer) and the second nitride semiconductor layer 5 (electron supply layer) are thus constituted of nitride semiconductors that differ in bandgap (Al composition) and a lattice mismatch occurs therebetween. Due to spontaneous polarizations of the first nitride semiconductor layer 4 and the second nitride semiconductor layer 5 and a piezo polarization due to the lattice mismatch between the two, an energy level of a conduction band of the first nitride semiconductor layer 4 at an interface of the first nitride semiconductor layer 4 and the second nitride semiconductor layer 5 is made lower than a Fermi level. A two-dimensional electron gas (2DEG) 16 is thereby made to spread at a position close to the interface of the first nitride semiconductor layer 4 and the second nitride semiconductor layer 5 (for example, at a distance of only several Å from the interface).

The gate portion 20 includes a nitride semiconductor gate layer 6, grown epitaxially on the second nitride semiconductor layer 5, a gate insulating film 7, formed on the nitride semiconductor gate layer 6, and a gate electrode 8, formed on the gate insulating film 7. The nitride semiconductor gate layer 6 is constituted of a nitride semiconductor doped with an acceptor type impurity. In the present preferred embodiment, the nitride semiconductor gate layer 6 is constituted of a GaN layer (p type GaN layer) doped with the acceptor type impurity and has a thickness of approximately 10 nm to 100 nm. The film thickness of the nitride semiconductor gate layer 6 is preferably not more than 100 nm. The reason for this shall be described later. In the present preferred embodiment, the film thickness of the nitride semiconductor gate layer 6 is 60 nm.

The concentration of the acceptor type impurity implanted in the nitride semiconductor gate layer 6 is preferably not less than $3 \times 10^{17}$ cm$^{-3}$. In the present preferred embodiment, the acceptor type impurity is Mg (magnesium). The acceptor type impurity may be Fe or other acceptor type impurity besides Mg. The nitride semiconductor gate layer 6 is disposed directly below the gate portion 20 to cancel out the two-dimensional electron gas 16 generated in the interface of the first nitride semiconductor layer 4 (electron transit layer) and the second nitride semiconductor layer 5 (electron supply layer). A front surface (upper surface) of the nitride semiconductor gate layer 6 is a c plane of a GaN crystal and a side surface of the nitride semiconductor gate layer 6 is an m plane of the GaN crystal.

The gate insulating film 7 is formed to be in contact with the front surface (c plane) of the nitride semiconductor gate layer 6. In the present preferred embodiment, the gate insulating film 7 is constituted of in-situ SiN, formed as a film in-situ with the nitride semiconductor gate layer 6. The gate insulating film 7 has a thickness of approximately 3 nm to 30 nm. The film thickness of the gate insulating film 7 is preferably not less than 3 nm. In the present preferred embodiment, the film thickness of the gate insulating film 7 is 30 nm. Besides in-situ SiN, the gate insulating film 7 may be constituted from SiN (other than in-situ SiN), SiO$_2$, SiON, Al$_2$O$_3$, AlN, AlON, HfO, HfN, HfON, HfSiON, AMON, etc.

In the present preferred embodiment, a carbon concentration of the interface of the nitride semiconductor gate layer 6 and the gate insulating film 7 is not more than $1 \times 10^{13}$ cm$^{-2}$.

The gate electrode 8 is formed to be in contact with a front surface of the gate insulating film 7. In the present preferred embodiment, the gate electrode 8 is constituted from a TiN layer and has a thickness of approximately 50 nm to 200 nm. The gate electrode 8 is disposed biasedly toward the source electrode contact hole 11.

The passivation film 9 covers a front surface of the second nitride semiconductor layer 5 (with the exception of regions facing the contact holes 11 and 12) and a side surface and a front surface of the gate portion 20. In the present preferred embodiment, the passivation film 9 is constituted of an SiN film and has a thickness of approximately 50 nm to 200 nm. In the present preferred embodiment, the thickness of the passivation film 9 is 50 nm.

The barrier metal film 10 is laminated on the passivation film 9. In the present preferred embodiment, the barrier metal film 10 is constituted of a TiN film and has a thickness of approximately 10 nm to 50 nm. In the present preferred embodiment, the thickness of the barrier metal film 10 is 25 nm.

In the present preferred embodiment, the source electrode 13 and the drain electrode 14 are constituted of lower layers (ohmic metal layers) 13A and 14A, in contact with the second nitride semiconductor layer 5, intermediate layers (main electrode metal layers) 13B and 14B, laminated on the lower layers 13A and 14A, and upper layers (barrier metal layers) 13C and 14C, laminated on the intermediate layers 13B and 14B. The lower layers 13A and 14A are, for example, Ti layers with thicknesses of approximately 10 nm to 20 nm. The intermediate layers 13B and 14B are Al layers with thicknesses of approximately 100 nm to 300 nm. The upper layers 13C and 14C are, for example, TiN with thicknesses of approximately 10 nm to 50 nm.

The interlayer insulating film 15 is constituted, for example, of SiO$_2$. The interlayer insulating film 15 has a thickness of approximately 1 µm.

With the nitride semiconductor device 1, a heterojunction is formed by the second nitride semiconductor layer 5 (electron supply layer), differing in bandgap (Al composition; from the first nitride semiconductor layer 4 (electron transit layer), being formed on the first nitride semiconductor layer 4. The two-dimensional electron gas 16 is thereby formed inside the first nitride semiconductor layer 4 near the interface of the first nitride semiconductor layer 4 and the second nitride semiconductor layer 5, and an HEMT making use of the two-dimensional electron gas 16 as a channel is formed. The gate electrode 8 faces the second nitride semiconductor layer 5 across the gate insulating film 7 and the nitride semiconductor gate layer 6, constituted of the p type GaN layer.

Below the gate electrode 8, energy levels of the first nitride semiconductor layer 4 and the second nitride semiconductor layer 5 are pulled up by the ionized acceptors contained in the nitride semiconductor gate layer 6, constituted of the p type GaN layer, and therefore the energy level of the conduction band at the heterojunction interface is made higher than the Fermi level. Therefore, the two-dimensional electron gas 16, due to the spontaneous polarizations of the first nitride semiconductor layer 4 and the second nitride semiconductor layer 5 and the piezo polarization due to the lattice mismatch of the two layers, is not formed directly below the gate electrode 8 (gate portion 20). Therefore, when a bias is not applied to the gate electrode 8 (zero bias state), the channel due to the two-dimensional electron gas 16 is cut off directly below the gate electrode 8. A normally-off type HEMT is thus realized. When an appropriate on voltage (for example, of 3 V) is applied to the gate electrode 8, a channel is induced inside the first nitride semiconductor layer 4 directly below the gate electrode 8 and the two-dimensional electron gas 16 at both sides of the gate electrode 8 becomes connected. The source and the drain are thereby made continuous to each other.

For use, for example, a predetermined voltage (for example, of 200 V to 300 V), with which the drain electrode 14 side becomes positive, is applied across the source electrode 13 and the drain electrode 14. In this state, an off voltage (0 V) or an on voltage (3 V) is applied to the gate electrode 8 with the source electrode 13 being at a reference potential (0 V).

FIG. 28A to FIG. 28G are sectional views for describing an example of a manufacturing process of the nitride semiconductor device 1 described above and show a cross-sectional structure at a plurality of stages in the manufacturing process.

Figure 28A:
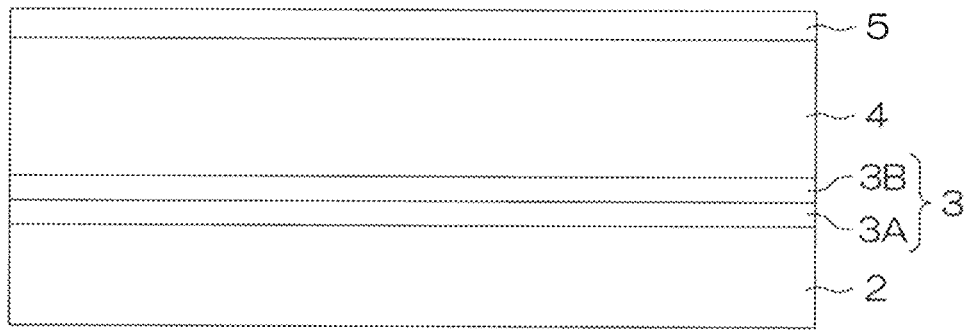
FIG. 28A is a diagram of a portion of a manufacturing process of the nitride semiconductor device of FIG. 27.

First, as shown in FIG. 28A, the buffer layer 3 and the first nitride semiconductor layer (electron transit layer) 4 are successively grown epitaxially on the substrate 2 by an MOCVD (Metal Organic Chemical Vapor Deposition) method. Further, the second nitride semiconductor layer (electron supply layer) 5 is grown epitaxially on the first nitride semiconductor layer 4 by the MOCVD method.

Figure 28B:
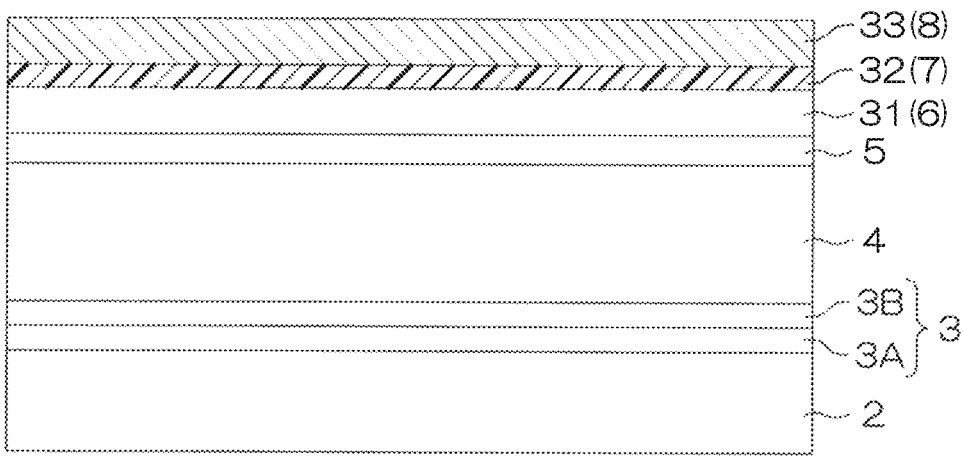
FIG. 28B is a diagram of a process subsequent that of FIG. 28A.

Next, as shown in FIG. 28B, a gate layer material film 31, which is a material film of the nitride semiconductor gate layer 6, is formed on the second nitride semiconductor layer 5 by the MOCVD method. Next, an insulating material film 32, which is a material film of the gate insulating film 7, is formed on the gate layer material film 31. If, as in the preferred embodiment described above, the gate insulating film 7 is constituted of SiN, film formation of the gate insulating film 32 may be performed in succession to and using the same MOCVD device used in film formation of the gate layer material film 31. In this case, the insulating material film 32 becomes in-situ SiN, which is formed as a film in-situ with the gate layer material film 31.

If the gate insulating film 7 is SiN, the insulating material film 32 may also be formed as a film on the gate layer material film 31 by a plasma CVD method. Also, if the gate insulating film 7 is constituted of $SiO_2$ or other material besides SiN, the insulating material film 32 may be formed as a film on the gate layer material film 31 by the plasma CVD method, an LPCVD (Low Pressure CVD) method, an ALD (Atomic Layer Deposition) method, etc.

Thereafter, a gate electrode film 33, which is a material film of the gate electrode 8, is formed on the insulating material film 32 by a sputtering method or a vapor deposition method. The gate electrode film 33 is constituted, for example, of a metal film of TiN.

Figure 28C:
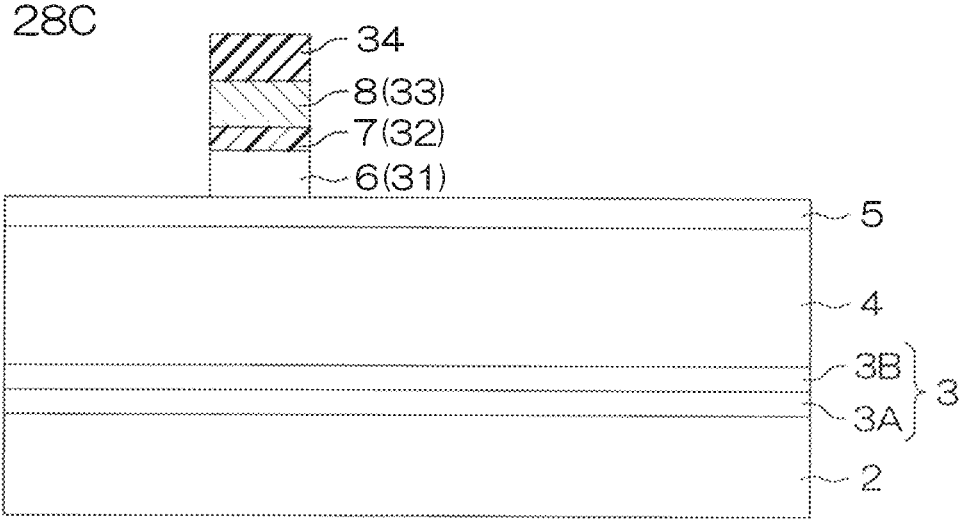
FIG. 28C is a diagram of a process subsequent that of FIG. 28B.

Next, as shown in FIG. 28C, a resist film 34, covering a region of a front surface of the gate electrode film 33 at which the preparation of the gate electrode is planned, is formed. The gate electrode film 33, the insulating material film 32, and the gate layer material film 31 are then etched selectively using the resist film 34 as a mask.

The gate electrode film 33 is thereby patterned and the gate electrode 8 is obtained. Also, the insulating material film 32 and the gate layer material film 31 are patterned in the same pattern as the gate electrode 3. The gate portion 20, constituted of the nitride semiconductor gate layer 6, the gate insulating film 7, and the gate electrode 8, is thereby formed on the second nitride semiconductor layer 5.

Figure 28D:
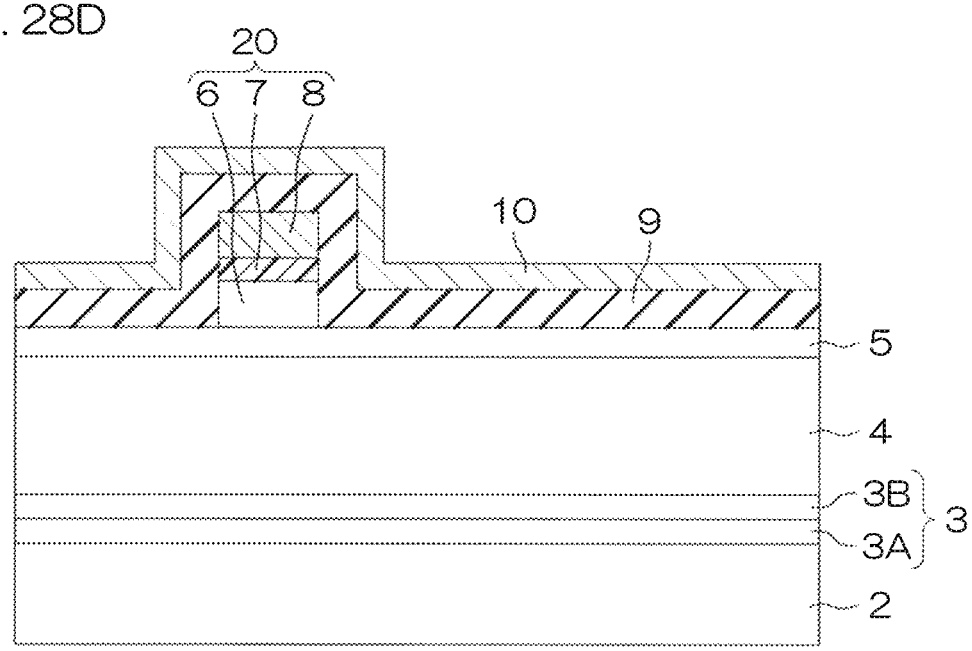
FIG. 28D is a diagram of a process subsequent that of FIG. 28C.

Next, the resist film 34 is removed. Thereafter, as shown in FIG. 28D, the passivation film 9 is formed by the plasma CVD method or the LPCVD method so as to cover entireties of exposed front surfaces. The barrier metal film 10 is then formed on the front surface of the passivation film 9 by the sputtering method. The passivation film 9 is constituted, for example, of an SiN layer. The barrier metal film 10 is constituted, for example, of a TiN layer.

Figure 28E:
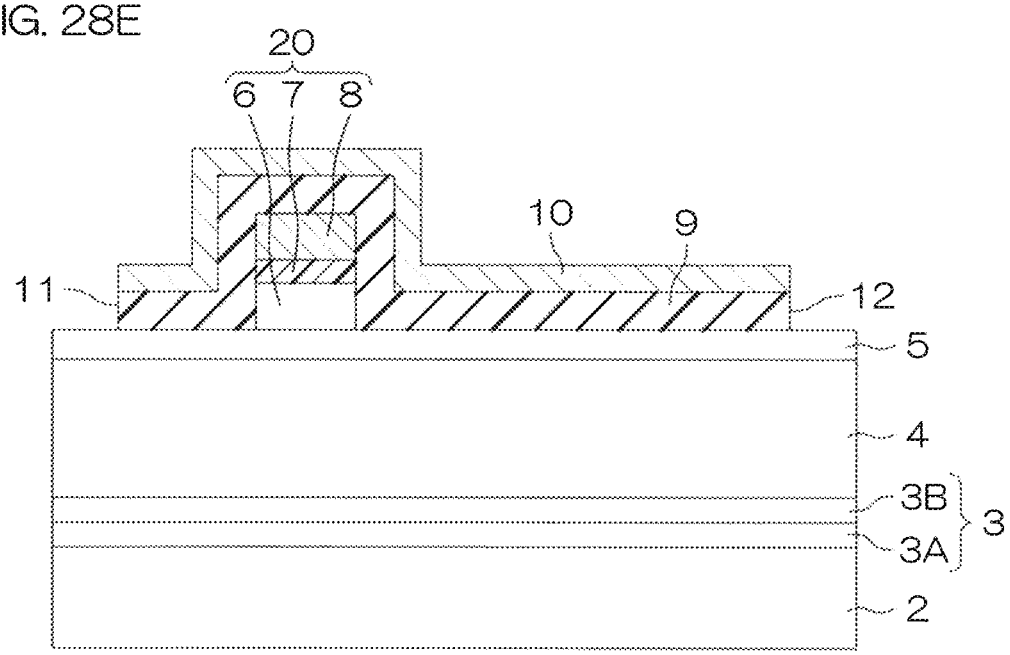
FIG. 28E is a diagram of a process subsequent that of FIG. 28D.

Next, as shown in FIG. 28E, the source electrode contact hole 11 and the drain electrode contact hole 12 are formed in the laminated film of the passivation film 9 and the barrier metal film 10.

Figure 28F:
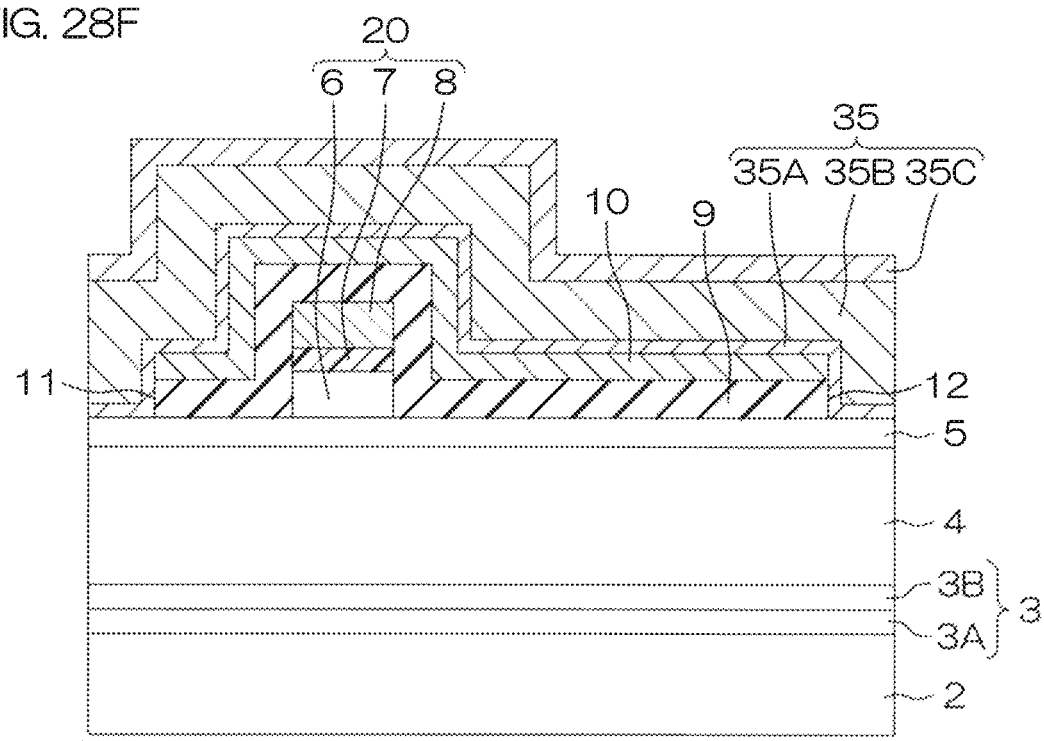
FIG. 28F is a diagram of a process subsequent that of FIG. 28E.

Next, as shown in FIG. 28F, a source/drain electrode film 35 is formed so as to cover entireties of exposed front surfaces. The source/drain electrode film 35 is constituted of a laminated metal film, in which are laminated a Ti layer 35A as a lower layer, an Al layer 35B as an intermediate layer, and a TiN layer 35C as an upper layer, and is formed by vapor depositing the respective layers successively.

Figure 28G:
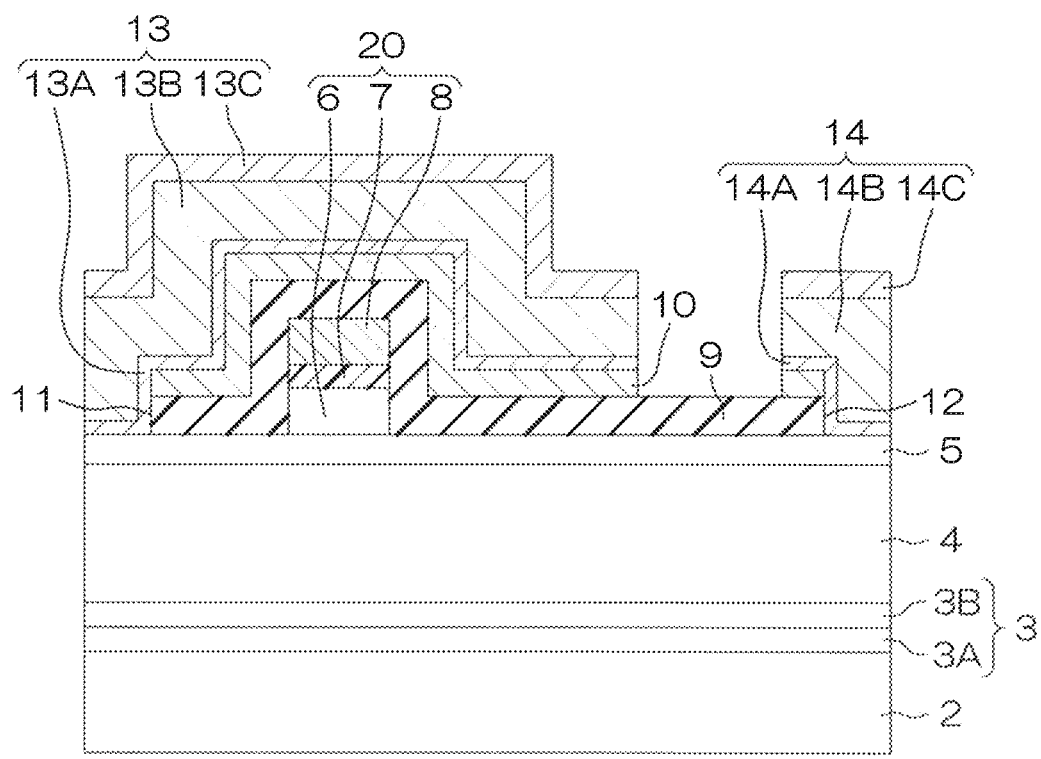
FIG. 28G is a diagram of a process subsequent that of FIG. 28F.

Next, as shown in FIG. 28G, the source/drain electrode film 35 and the barrier metal film 10 are patterned by etching and further subject to an annealing processing to form the source electrode 13 and the drain electrode 14 in ohmic contact with the second nitride semiconductor layer 5. In this process, the source electrode 13 is constituted from a lower layer 13A, constituted of the TiN layer 35A, an intermediate layer 13B, constituted of the Al layer 35B, and an upper layer 13C, constituted of the TiN layer 35u. Also, the drain electrode 14 is constituted from a lower layer 14A, constituted of the TiN layer 35A, an intermediate layer 14B, constituted of the Al layer 35B, and an upper layer 14C, constituted of the TiN layer 35C.

Thereafter, the interlayer insulating film 15 is formed so as to cover the source electrode 13, the drain electrode 14, and the barrier metal film 10, and the nitride semiconductor device 1 with the structure such as shown in FIG. 27 is thereby obtained.

Figure 29:
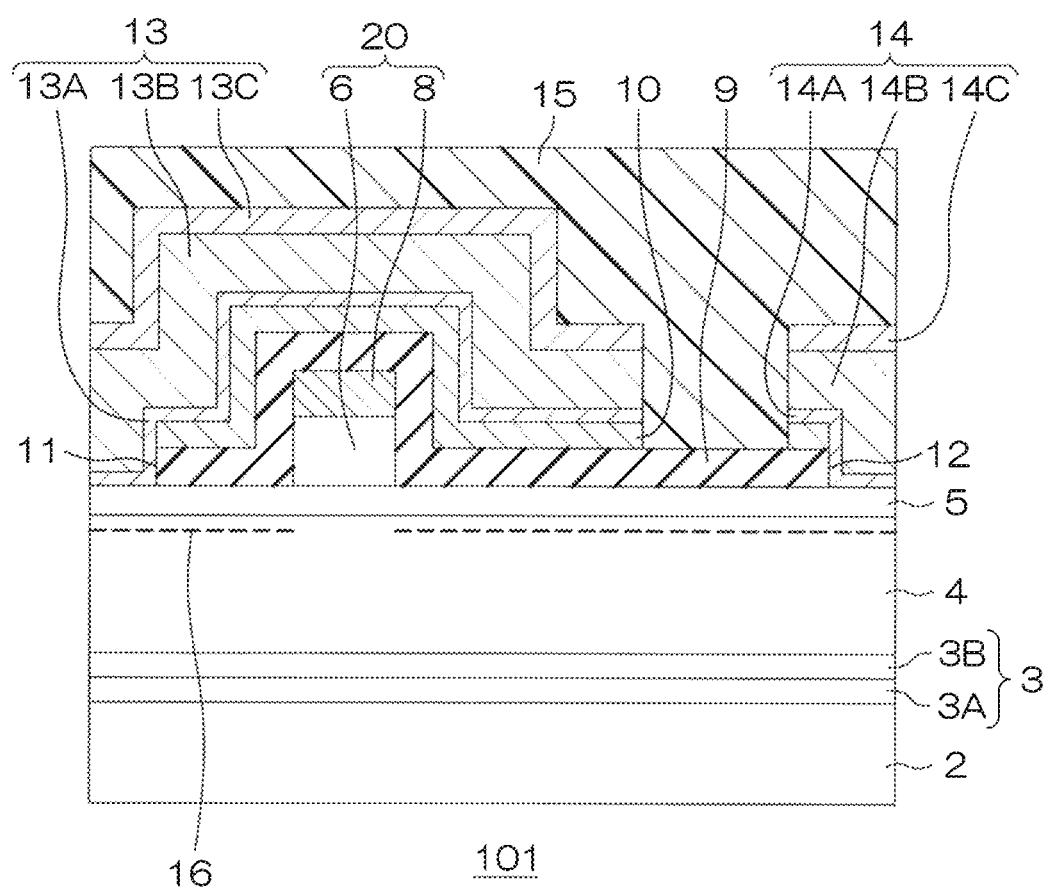
FIG. 29 is a sectional view of the arrangement of a nitride semiconductor device according to a comparative example.

In the following description, a nitride semiconductor device with an arrangement not provided with the gate insulating film 7 shall be referred to as a comparative example with respect to the nitride semiconductor device 1 of FIG. 27. FIG. 29 is a sectional view of the arrangement of the nitride semiconductor device 101 according to the comparative example. With the nitride semiconductor device 101 according to the comparative example, a gate portion 20 is constituted of a nitride semiconductor gate layer 6, formed on a second nitride semiconductor layer 5, and a gate electrode 8, formed on the nitride semiconductor gate layer 6. In the comparative example, the gate electrode

8, constituted of TiN, is in Schottky junction with the nitride semiconductor gate layer 6, constituted of p type GaN. The nitride semiconductor gate layer 6 of the comparative example has a film thickness of 80 nm. The nitride semiconductor gate layer 6 of the nitride semiconductor device 1 described above has a film thickness of 60 nm and the gate insulating film 7 has a film thickness of 30 nm.

With the nitride semiconductor device 101 according to the comparative example, the gate electrode 8 is in Schottky junction with the nitride semiconductor gate layer 6 and therefore the gate leak current is large. The nitride semiconductor gate layer 6 thus degrades readily.

With the nitride semiconductor device 1 (hereinafter referred to as the "present preferred embodiment") according to the preferred embodiment described above, the gate insulating film 7 is formed on the nitride semiconductor gate layer 6 and the gate electrode 8 is formed on the gate insulating film 7. That is, with the present preferred embodiment, the gate insulating film 7 is interposed between the nitride semiconductor gate layer 6 and the gate electrode 8, and therefore the gate leak current can be made small in comparison to the comparative example. The nitride semiconductor gate layer 6 is thereby made unlikely to degrade. With the present preferred embodiment, the gate leak current is not more than 1 nA/mm.

Also, as shall be described later, with the present preferred embodiment, a threshold voltage Vth can be made high in comparison to the comparative example. Also, with the present preferred embodiment, it is possible to make the nitride semiconductor gate layer 6 thin in comparison to the comparative example, and it is therefore possible to reduce the electric field intensity of the nitride semiconductor gate layer 6 and the nitride semiconductor gate layer 6 is made unlikely to undergo time dependent dielectric breakdown (TDDB). Further, with the present preferred embodiment, the threshold voltage Vth can be stabilized in comparison to the comparative example.

The reason why, with the present preferred embodiment, the threshold voltage Vth can be made high in comparison to the comparative example and the reason why the nitride semiconductor gate layer 6 can be made thin in comparison to the comparative example shall now be described.

Figure 30:
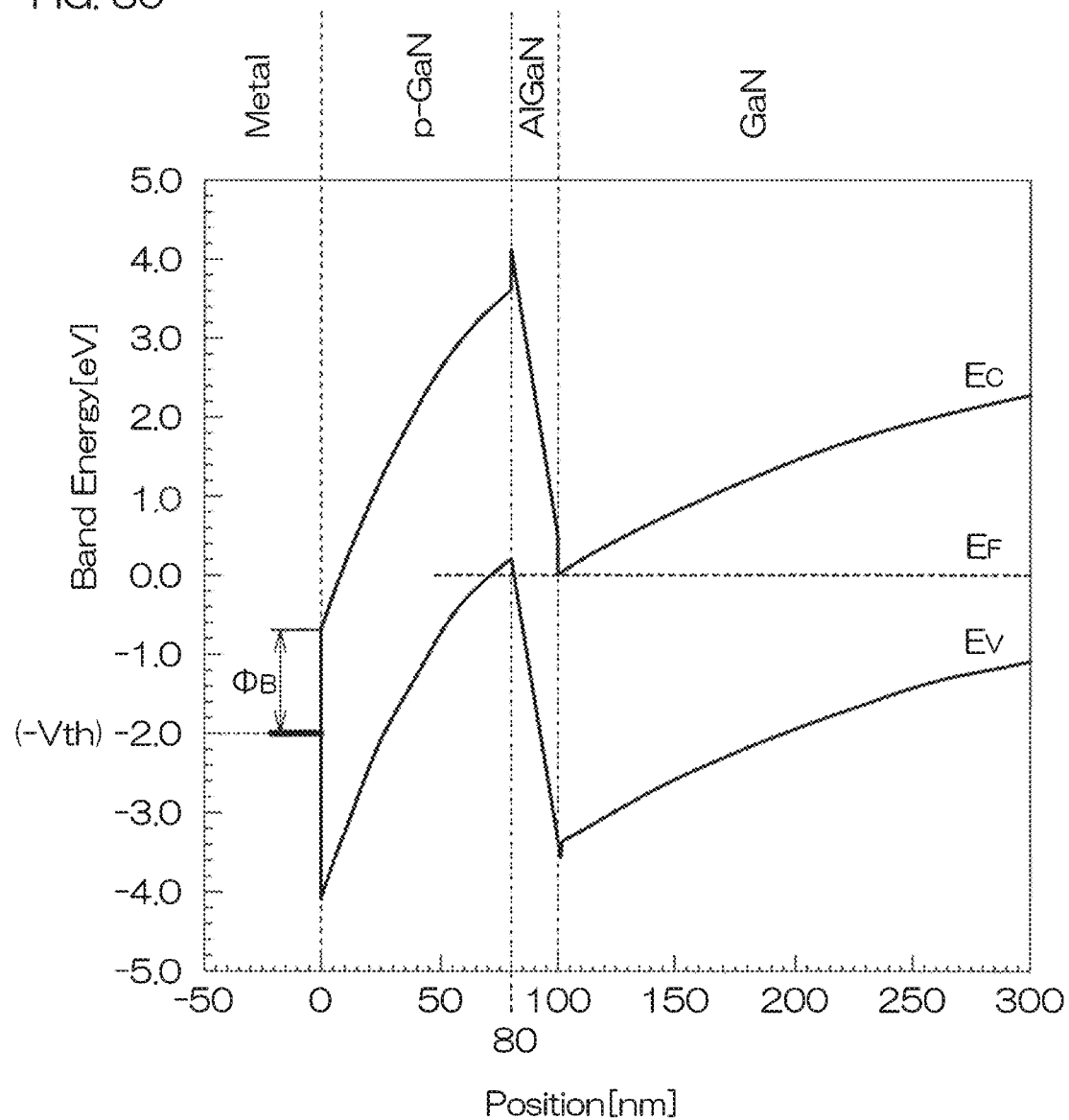
FIG. 30 is an energy band diagram showing an energy distribution of the comparative example.
Figure 31:
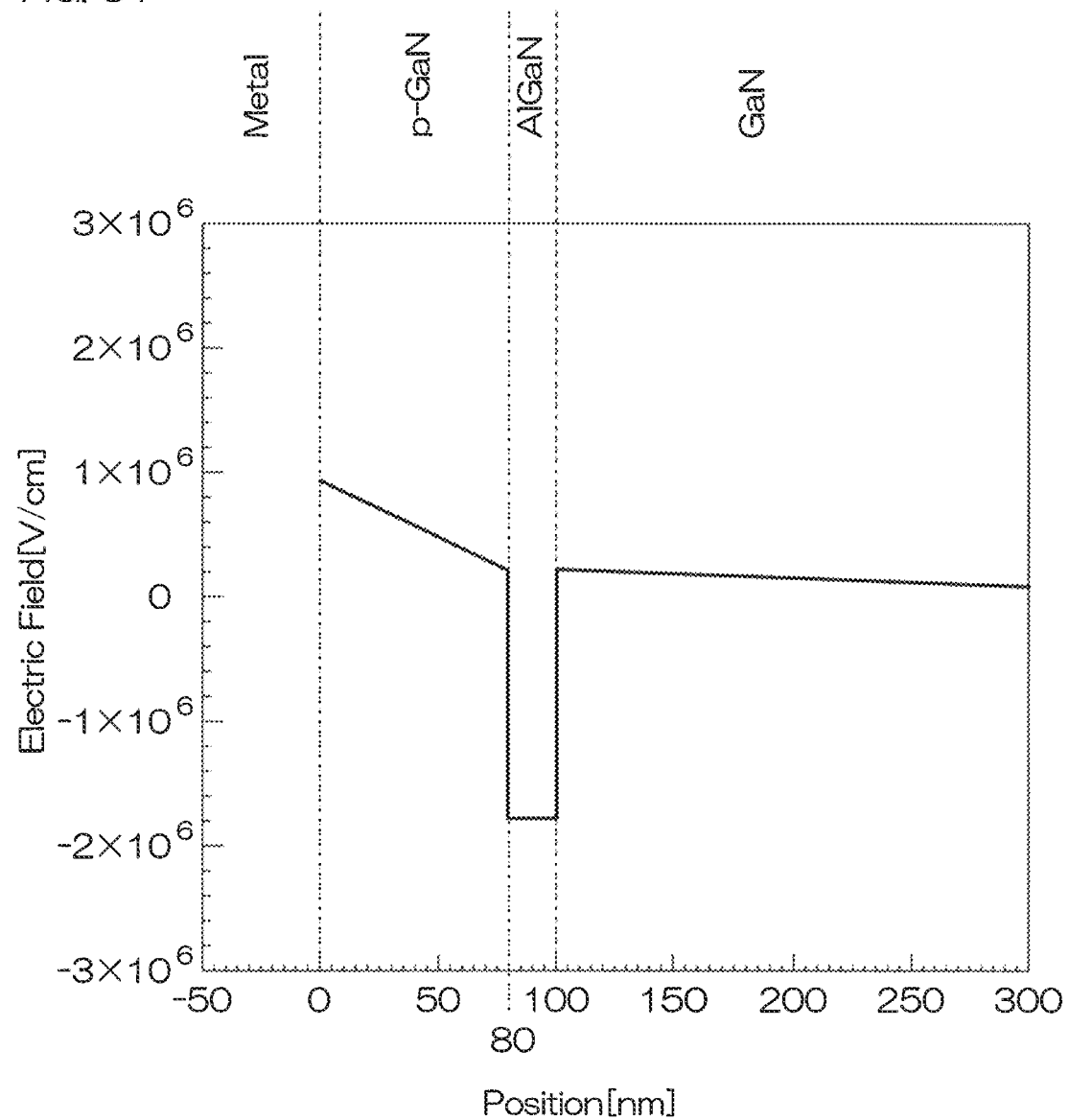
FIG. 31 is an electric field intensity distribution diagram showing an electric field intensity distribution of the comparative example.

FIG. 30 is an energy band diagram showing an energy distribution of the comparative example. FIG. 31 is an electric field intensity distribution diagram showing an electric field intensity distribution of the comparative example. In FIG. 30 and FIG. 31, GaN indicates the first nitride semiconductor layer 4, AlGaN indicates the second nitride semiconductor layer 5, P—GaN indicates the nitride semiconductor gate layer 6, and Metal indicates the gate electrode 8. In FIG. 30, $E_C$ is the energy level of the conduction band, $E_V$ is the energy level of the valence band, and $E_F$ is the Fermi level.

In the comparative example, the gate electrode 8 is put in Schottky junction with the nitride semiconductor gate layer 6. A potential barrier (Schottky barrier) φn at the interface of the gate electrode 8 and the nitride semiconductor gate layer 6 influences the threshold voltage Vth.

With the example of FIG. 30, the threshold voltage Vth is 2[V]. The threshold voltage Vth of a nitride semiconductor device is small in comparison to the threshold voltage Vth of an Si semiconductor device and therefore it is important to make the threshold voltage Vth large. To increase the threshold voltage Vth in the comparative example, the film thickness of the nitride semiconductor gate layer 6 must be increased. Mg and Fe, which are acceptors in p-GaN, have a memory effect, and therefore as can be understood from FIG. 31, when the film thickness of the nitride semiconductor gate layer 6 is made large, the electric field intensity in the interior of the nitride semiconductor gate layer 6 increases as a portion at the boundary with the gate electrode 8 is approached. Also, a nitride semiconductor is low in the tolerable electric field intensity in comparison to an insulating film. The film thickness of the nitride semiconductor gate layer 6 thus cannot be increased and it is thus difficult to increase the threshold voltage Vth. The film thickness of the nitride semiconductor gate layer 6 is ordinarily set to not more than 100 nm.

Figure 32:
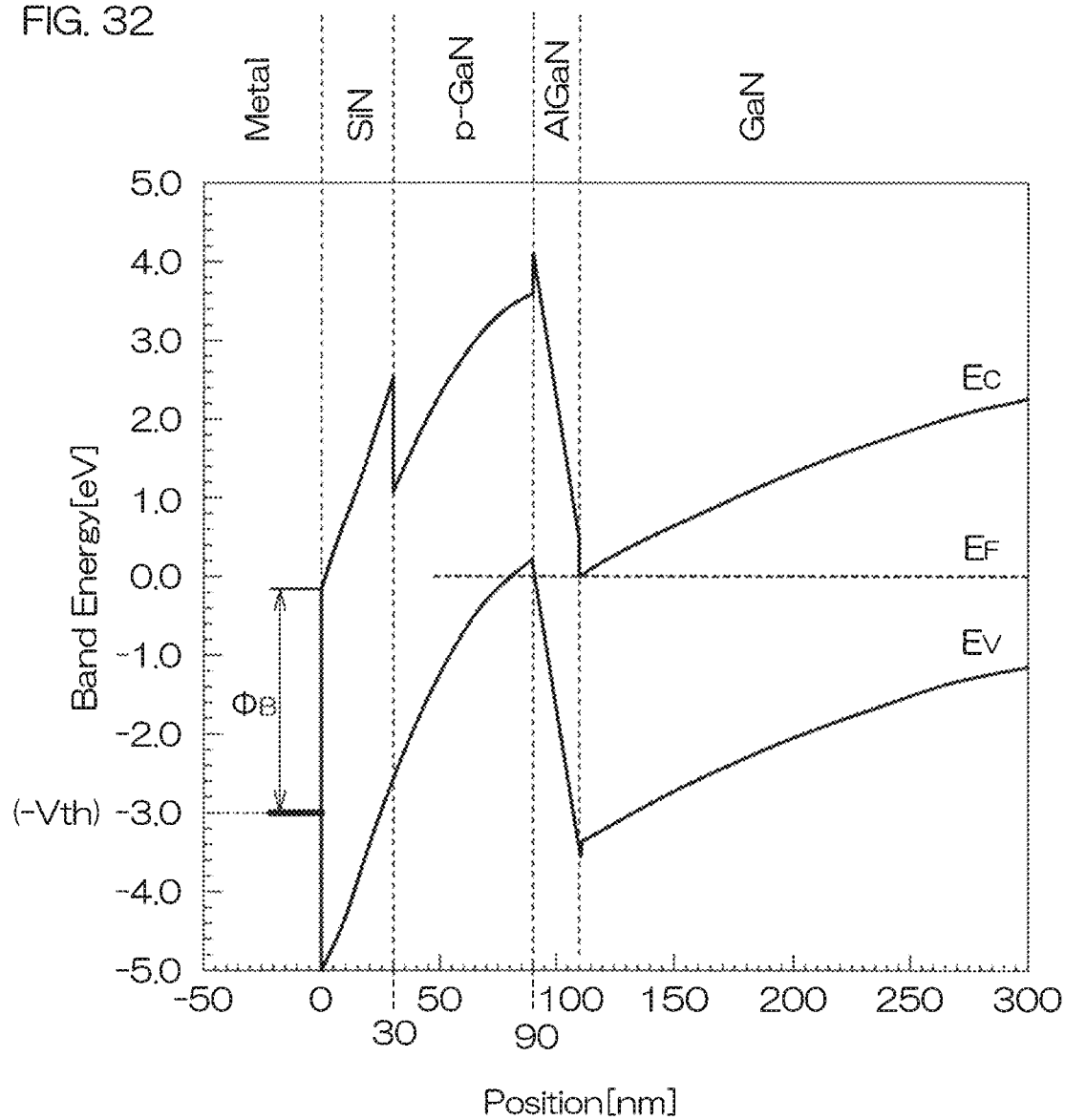
FIG. 32 is an energy band diagram showing an energy distribution of the preferred embodiment.
Figure 33:
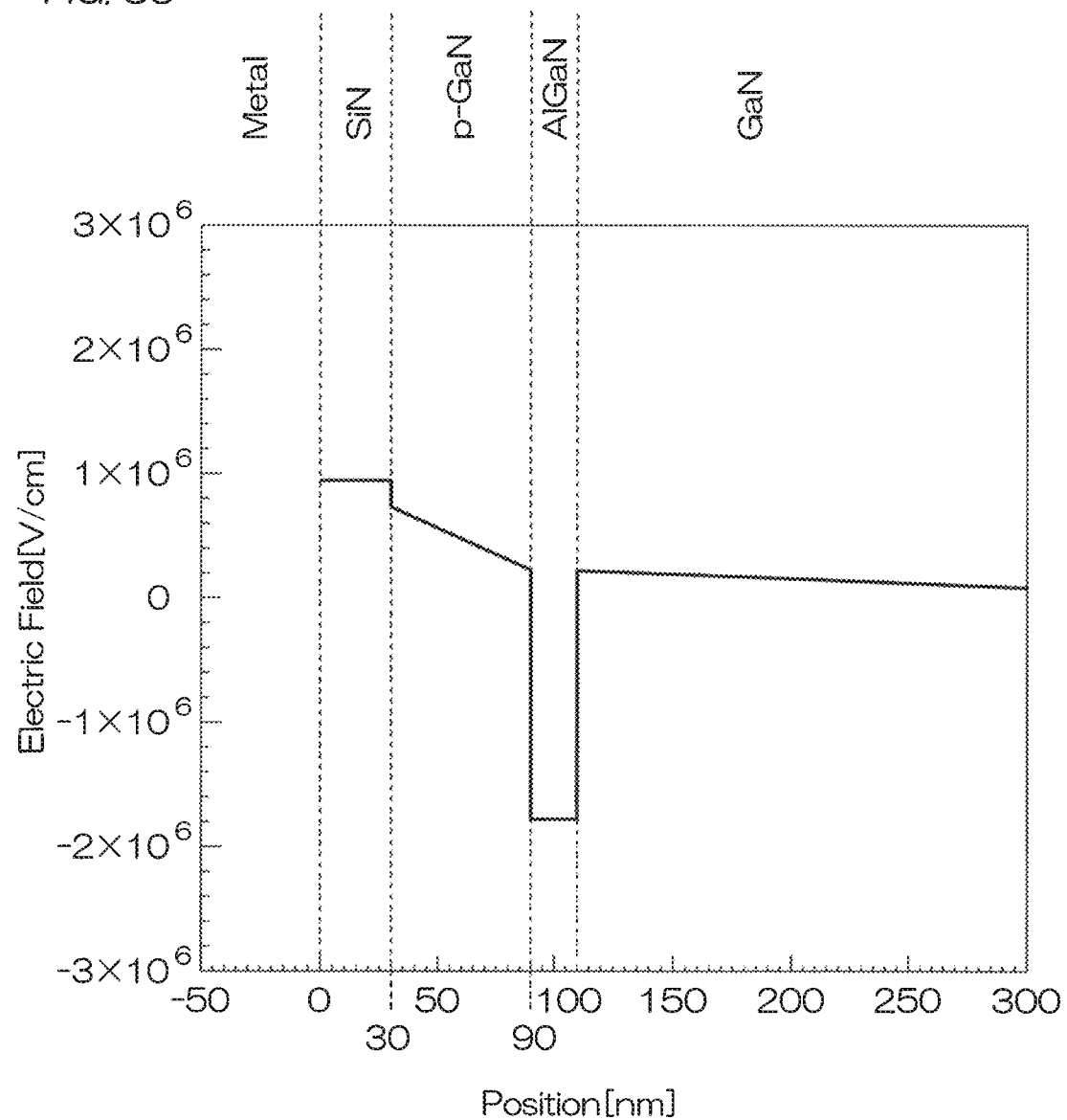
FIG. 33 is an electric field intensity distribution diagram showing an electric field intensity distribution of the preferred embodiment.

FIG. 32 is an energy band diagram showing an energy distribution of the present preferred embodiment. FIG. 33 is an electric field intensity distribution diagram showing an electric field intensity distribution of the present preferred embodiment. In FIG. 32 and FIG. 33, GaN indicates the first nitride semiconductor layer 4, AlGaN indicates the second nitride semiconductor layer 5, P—GaN indicates the nitride semiconductor gate layer 6, SiN indicates the gate insulating film 7, and Metal indicates the gate electrode 8. In FIG. 32, $E_C$ is the energy level of the conduction band, $E_V$ is the energy level of the valence band, and $E_F$ is the Fermi level.

In the present preferred embodiment, the gate insulating film 7 is formed on the nitride semiconductor gate layer 6. The electric field intensity distribution in the interior of the gate insulating film 7 is uniform and the electric field intensity does not increase even if the gate insulating film 7 is made thick. Therefore, with the present preferred embodiment, the threshold voltage Vth can be made high (3[V] in FIG. 32) while making the film thickness of the nitride semiconductor gate layer 6 thin in comparison to the film thickness of the nitride semiconductor gate layer 6 of the comparative example (and therefore keeping small the electric field intensity at the boundary of the gate insulating film 7 with the gate electrode 8).

With the present preferred embodiment, the threshold voltage Vth can be made high by forming the gate insulating film 7 on the nitride semiconductor gate layer 6 and therefore there is no need to make the film thickness of the nitride semiconductor gate layer 6 thick to make the threshold voltage Vth high. Thus, in the present preferred embodiment, the film thickness of the nitride semiconductor gate layer 6 is made thin in comparison to the comparative example. As shown in FIG. 33, the electric field intensity at the portion of the nitride semiconductor gate layer 6 at the boundary with the gate insulating film 7 of the present preferred embodiment is thereby made smaller than the electric field intensity at the portion of the nitride semiconductor gate layer 6 at the boundary with the gate electrode 8 of the comparative example, and therefore, with the present preferred embodiment, time dependent dielectric breakdown (TDDB) of the nitride semiconductor gate layer. 6 is unlikely to occur in comparison to the comparative example.

Although, in the present preferred embodiment, the electric field intensity at the portion of the gate insulating film 7 at the boundary with the gate electrode 8 becomes higher than the electric field intensity at the portion of the nitride semiconductor gate layer 6 at the boundary with the gate insulating film 7, there is no problem because the dielectric breakdown voltage of the gate insulating film 7 is higher than the dielectric breakdown voltage of the nitride semiconductor gate layer 6.

The reason why, with the present preferred embodiment, the threshold voltage Vth can be stabilized in comparison to the comparative example shall now be described.

The nitride semiconductor gate layer 6 constituted of p type GaN is a polarizable material and therefore polarization charges appear at the front surface (c plane) thereof. If, in a process of manufacturing the nitride semiconductor device, the front surface of the nitride semiconductor gate layer 6 is exposed to atmosphere, polar organic molecules (carboxylic acids, siloxanes, etc.) become attached to the front surface so as to cancel out the polarization charges on the front surface.

With the comparative example, after the material film (gate layer material film) of the nitride semiconductor gate layer 6 is formed by a CVD device, the material film (gate electrode film) of the gate electrode is formed on the gate layer material film by a sputtering device. The front surface of the nitride semiconductor gate layer 6 is thus exposed to the atmosphere and organic molecules in the atmosphere become attached to the front surface. The magnitude of the Schottky barrier $\Phi_B$ thereby varies and the threshold voltage Vth becomes unstable.

On the other hand, with the present preferred embodiment, after the material film (gate layer material film 31) of the nitride semiconductor gate layer 6 is formed by the MOCVD device, the material film (insulating material film 32) of the gate insulating film 7, constituted of in-situ SiN, is formed in succession on the gate layer material film 31 by the same MOCVD device. Therefore, in the process of manufacturing the nitride semiconductor device 1, the front surface (c plane) of the nitride semiconductor gate layer 6 is not exposed to the atmosphere. Therefore, with the present preferred embodiment, organic molecules are unlikely to become attached to the front surface (c plane) of the nitride semiconductor gate layer 6 in comparison to the comparative example. Thereby, with the present preferred embodiment, the potential barrier $\Phi_B$ at the interface of the gate electrode 8 and the gate insulating film 7 is made stable and the threshold voltage Vth is made stable in comparison to the comparative example.

If the insulating material film 32 is constituted of a material besides in-situ SiN, that is, for example, $SiO_2$, the front surface of the material film (gate layer material film 31) of the nitride semiconductor gate layer 6 will be exposed to the atmosphere after it is formed by the MOCVD method. In this case, it suffices to form the insulating material film 32 after removing the organic molecules attached to the front surface of the gate layer material film 31 by heating the gate layer material film 31 to not less than 400° C. inside an insulating film forming device, such as a plasma CVD device, an LPCVD device, an ALD device, etc.

Figure 34:
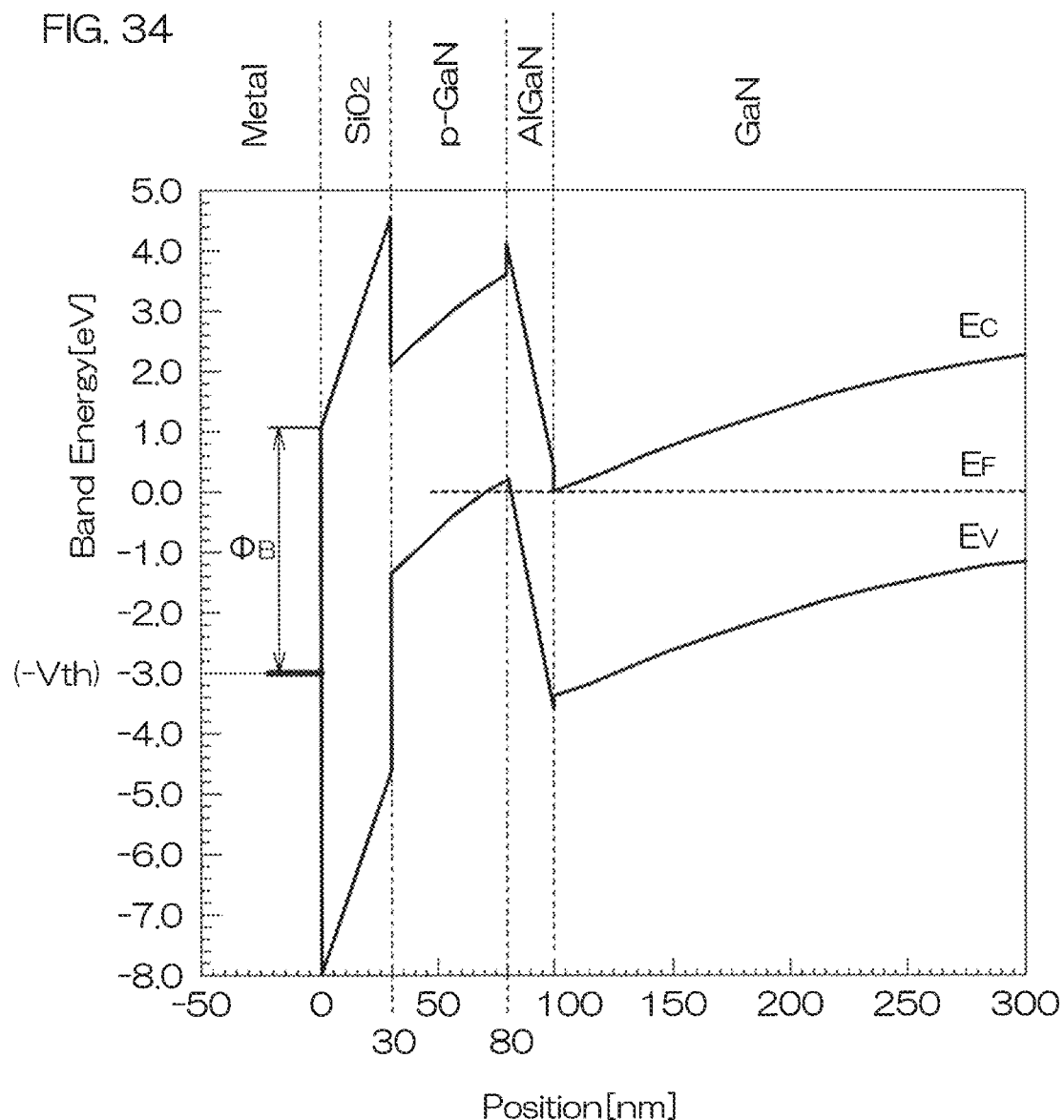
FIG. 34 is an energy band diagram showing an energy distribution in a case where a gate insulating film is constituted of $SiO_2$.

An energy distribution and an electric field intensity distribution in a case where the gate insulating film 7 is constituted of $SiO_2$ are shown in FIG. 34 and FIG. 35. In the example of FIG. 34 and FIG. 35, the gate insulating film ($SiO_2$) 7 has a film thickness of 30 nm and the nitride semiconductor gate layer (p-GaN) 6 has a film thickness of 50 nm.

Although the preferred embodiment of the second invention has been described above, the second invention may be implemented in yet other modes. For example, although with the preferred embodiment described above, an example where the first nitride semiconductor layer (electron transit layer) 4 is constituted of a GaN layer and the second nitride semiconductor layer (electron supply layer) 5 is constituted of an AlGaN layer was described, it suffices that the first nitride semiconductor layer 4 and the second nitride semiconductor layer 5 differ in bandgap (for example, in Al composition), and other combinations are also possible. As examples of the first nitride semiconductor layer 4/second nitride semiconductor layer 5 combination, GaN/AlN, AlGaN/AlN, etc., can be cited.

Also, although with the preferred embodiment described above, silicon was taken up as an example of the material of the substrate 2, besides this, any substrate material, such as a sapphire substrate, a GaN substrate, etc., may be applied.

Also, with the preferred embodiment described above, an example where if the gate electrode 8 is put in junction with the nitride semiconductor gate layer 6, the gate electrode 8 is constituted from a material such that the two will be in a Schottky junction was described. However, the second invention may also be applied to a case where if the gate electrode 8 is put in junction with the nitride semiconductor gate layer 6, the gate electrode 7 is constituted from a material such that the two will be in a ohmic junction.

The present application corresponds to Japanese Patent Application No. 2016-163743, filed on Aug. 24, 2016 in the Japan Patent Office, Japanese Patent Application No. 2017-006779, filed on Jan. 18, 2017 in the Japan Patent Office, Japanese Patent Application No. 2017-057830, filed on Mar. 23, 2017 in the Japan Patent Office, and Japanese Patent Application No. 2017-132170, filed on Jul. 5, 2017 in the Japan Patent Office, and the entire disclosures of these applications are incorporated herein by reference.

While preferred embodiments of the present invention have been described above, it is to be understood that variations and modifications will be apparent to those skilled in the art without departing the scope and sprit of the present invention. The scope of the present invention, therefore, is to be determined solely by the following claims.

What is claimed is:

1. A nitride semiconductor device comprising:
a first nitride semiconductor layer, constituting the electron traveling layer;
a second nitride semiconductor layer, formed on the first nitride semiconductor layer and constituting the electron supply layer;
a gate portion, disposed on the second nitride semiconductor layer;
a passivation film, formed to cover the gate portion;
a barrier metal film, formed to cover the passivation film; and
a source electrode and a drain electrode, connected to the second nitride semiconductor layer and disposed on the barrier metal film,
wherein a connection portion of the source electrode to the second nitride semiconductor layer and a connection portion of the drain electrode to the second nitride semiconductor layer are disposed to sandwich the gate portion in a plan view,
wherein the source electrode and the drain electrode are composed of a lower layer in contact with the second nitride semiconductor layer, an intermediate layer laminated on the lower layer, and an upper layer laminated on the intermediate layer,
wherein the lower layer has a thickness of 10 nm to 20 nm,
wherein the intermediate layer has a thickness of 100 nm to 300 nm, and
wherein the upper layer has a thickness of 10 nm to 50 nm.

2. The nitride semiconductor device according to claim 1, further comprising an interlayer insulating film, disposed to cover the source electrode and the drain electrode and in contact with the passivation film between the source electrode and the drain electrode.

3. The nitride semiconductor device according to claim 1,
wherein the lower layer is a Ti layer,
wherein the intermediate layer is an Al layer, and
wherein the upper layer is a TiN layer.

4. The nitride semiconductor device according to claim 1, wherein the source electrode has an end portion facing the drain electrode beyond the gate portion, and the end portion has a side surface being flush with a side surface of the barrier metal film.

5. The nitride semiconductor device according to claim 1, wherein the first nitride semiconductor layer is constituted of a GaN layer, and
wherein the second nitride semiconductor layer is constituted of an AlGaN layer.

6. The nitride semiconductor device according to claim 1, wherein the barrier metal layer is constituted of a TiN film.

7. The nitride semiconductor device according to claim 6, wherein a film thickness of the barrier metal layer is 50 nm to 200 nm.

8. The nitride semiconductor device according to claim 1, further comprising a substrate; and
a buffer layer formed on the substrate,
wherein the first nitride semiconductor layer is formed on the buffer layer.

9. The nitride semiconductor device according to claim 1, wherein the substrate is a silicon substrate,
wherein the buffer layer is composed of a first buffer layer made of an AlN film in contact with a surface of the substrate and a second buffer layer made of an AlGaN film laminated on a surface of the first buffer layer.

10. The nitride semiconductor device according to claim 9, wherein a film thickness of the first buffer layer is 100 nm to 300 nm, and
wherein a film thickness of the second buffer layer is 100 nm to 5 μm.

11. A nitride semiconductor device comprising:
a first nitride semiconductor layer, constituting the electron traveling layer;
a second nitride semiconductor layer, formed on the first nitride semiconductor layer and constituting the electron supply layer;
a gate portion, disposed on the second nitride semiconductor layer;
a passivation film, formed to cover the gate portion;
a barrier metal film, formed to cover the passivation film; and
a source electrode and a drain electrode, connected to the second nitride semiconductor layer and disposed on the barrier metal film,
wherein a connection portion of the source electrode to the second nitride semiconductor layer and a connection portion of the drain electrode to the second nitride semiconductor layer are disposed to sandwich the gate portion in a plan view,
wherein the gate portion includes:
a nitride semiconductor gate layer formed on the second nitride semiconductor layer;
a gate insulating film formed on the nitride semiconductor gate layer; and
a gate electrode formed on the gate insulating film.

12. The nitride semiconductor device according to claim 11, wherein the nitride semiconductor gate layer is formed only below the gate electrode.

13. The nitride semiconductor device according to claim 11, wherein the nitride semiconductor gate layer is constituted of a GaN layer doped with acceptor type impurities.

14. The nitride semiconductor device according to claim 13, wherein the acceptor type impurity is magnesium (M) or iron (Fe).

15. The nitride semiconductor device according to claim 14, wherein a concentration of the acceptor type impurity is not less than $3\times10^{17}$ cm$^{-3}$.

16. The nitride semiconductor device according to claim 11, wherein the gate insulating film is constituted of in-situ SiN, formed as a film in-situ with the nitride semiconductor gate layer.

17. The nitride semiconductor device according to claim 16, wherein the gate insulating film has a film thickness of 3 nm to 30 nm.

18. The nitride semiconductor device according to claim 11, wherein the gate electrode is constituted of a TiN layer.

19. The nitride semiconductor device according to claim 18, wherein the gate electrode has a film thickness of 50 nm to 200 nm.

* * * * *